(12) United States Patent
Machida et al.

(10) Patent No.: US 11,069,727 B2
(45) Date of Patent: Jul. 20, 2021

(54) IMAGING ELEMENT HAVING TRANSFER GATE STRUCTURE COMPRISING A TRENCH

(71) Applicant: SONY CORPORATION, Tokyo (JP)

(72) Inventors: Takashi Machida, Tokyo (JP); Ryoto Yoshita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/482,397

(22) PCT Filed: Feb. 19, 2018

(86) PCT No.: PCT/JP2018/005652
§ 371 (c)(1),
(2) Date: Jul. 31, 2019

(87) PCT Pub. No.: WO2018/159345
PCT Pub. Date: Sep. 7, 2018

(65) Prior Publication Data
US 2020/0035724 A1    Jan. 30, 2020

(30) Foreign Application Priority Data
Mar. 3, 2017    (JP) .............................. JP2017-040136

(51) Int. Cl.
*H01L 27/146*    (2006.01)
*H04N 5/3745*    (2011.01)
*H04N 9/04*    (2006.01)

(52) U.S. Cl.
CPC .. *H01L 27/14605* (2013.01); *H01L 27/14609* (2013.01); *H01L 27/14614* (2013.01);
(Continued)

(58) Field of Classification Search
CPC .................................................. H01L 27/14605
(Continued)

(56) References Cited

U.S. PATENT DOCUMENTS

2014/0131779 A1    5/2014    Takeda
2015/0069471 A1    3/2015    Kawamura
(Continued)

FOREIGN PATENT DOCUMENTS

CN    103811507 A    5/2014
CN    104425535 A    3/2015
(Continued)

OTHER PUBLICATIONS

International Search Report and Written Opinion of PCT Application No. PCT/JP2018/005652, dated May 1, 2018, 14 pages of ISRWO.

*Primary Examiner* — Ajay Arora
(74) *Attorney, Agent, or Firm* — Chip Law Group

(57) ABSTRACT

The imaging element includes, within a pixel, a semiconductor substrate, a photoelectric conversion unit formed in the semiconductor substrate, a first charge storage unit that stores a charge generated by the photoelectric conversion unit, and a first transfer gate unit formed on an opposite surface of the semiconductor substrate on an opposite side of a light incident surface and used for transfer of a charge from the photoelectric conversion unit to the first charge storage unit. The first transfer gate unit includes a first electrode embedded in a first trench formed in the semiconductor substrate from the opposite surface of the semiconductor substrate. The photoelectric conversion unit includes the first electrode, and a second electrode surrounding at least a portion of a periphery of the first electrode.

19 Claims, 40 Drawing Sheets

(52) U.S. Cl.
CPC .. *H01L 27/14623* (2013.01); *H01L 27/14645* (2013.01); *H04N 5/37452* (2013.01); *H04N 9/045* (2013.01); *H01L 27/1464* (2013.01); *H01L 27/14621* (2013.01); *H01L 27/14627* (2013.01)

(58) Field of Classification Search
USPC ........................................................ 257/233
See application file for complete search history.

(56) References Cited

U.S. PATENT DOCUMENTS

| | | |
|---|---|---|
| 2015/0085170 A1 | 3/2015 | Takeda |
| 2015/0129943 A1 | 5/2015 | Kato et al. |
| 2015/0357363 A1* | 12/2015 | Kawamura ....... H01L 27/14818 257/229 |
| 2016/0080676 A1 | 3/2016 | Takeda |
| 2016/0118422 A1 | 4/2016 | Takeda |
| 2016/0126266 A1 | 5/2016 | Kato et al. |
| 2017/0118431 A1 | 4/2017 | Takeda |
| 2017/0200754 A1 | 7/2017 | Kawamura |
| 2017/0250210 A1 | 8/2017 | Kato et al. |

FOREIGN PATENT DOCUMENTS

| | | |
|---|---|---|
| CN | 104469200 A | 3/2015 |
| CN | 104637963 A | 5/2015 |
| JP | 2011-166234 A | 8/2011 |
| JP | 2014-096490 A | 5/2014 |
| JP | 2015-053411 A | 3/2015 |
| JP | 2015-065271 A | 4/2015 |
| JP | 2015-095468 A | 5/2015 |

\* cited by examiner

IMAGING ELEMENT HAVING TRANSFER GATE STRUCTURE COMPRISING A TRENCH

CROSS REFERENCE TO RELATED APPLICATIONS

This application is a U.S. National Phase of International Patent Application No. PCT/JP2018/005652 filed on Feb. 19, 2018, which claims priority benefit of Japanese Patent Application No. JP 2017-040136 filed in the Japan Patent Office on Mar. 3, 2017. Each of the above-referenced applications is hereby incorporated herein by reference in its entirety.

TECHNICAL FIELD

The present technology relates to an imaging element, and more particularly to an imaging element configured to reduce parasitic light sensitivity (PLS).

BACKGROUND ART

In a CMOS image sensor having a global shutter function, charges generated in a photoelectric conversion unit during an exposure period are simultaneously transferred to and held by all the pixels in the charge storage unit provided in individual pixels. Subsequently, the charges held in the charge storage unit are sequentially read out.

Here, while charges are held in the charge storage unit, noise other than the charge transferred from the photoelectric conversion unit is generated by parasitic light incident on the charge storage unit. Therefore, in a CMOS image sensor having a global shutter function, it is important to reduce PLS being the sensitivity to the parasitic light.

Conventionally, in order to reduce PLS, measures have been taken to achieve a layout of the wiring layer so as to shield the upper layer of the charge storage unit or to provide a dedicated light shielding metal directly above the charge storage unit. However, although this measure can be easily applied to a front-illuminated CMOS image sensor in which light is incident from the wiring layer side, application is difficult to a back-illuminated CMOS image sensor in which the wiring layer is provided on the opposite side of the light incident surface.

Against this problem, there is a proposed configuration of the conventional back-illuminated CMOS image sensor that includes a charge storage unit in the vicinity of a front surface of a semiconductor substrate on an opposite side of the incident surface, in which a light shielding film provided on the incident surface and a light shielding film within a trench engraved from the incident surface surround the charge storage unit and thereby suppress incidence of parasitic light to the charge storage unit (refer to Patent Document 1, for example).

CITATION LIST

Patent Document

Patent Document 1: Japanese Patent Application Laid-Open No. 2014-96490

SUMMARY OF THE INVENTION

Problems to be Solved by the Invention

Here, a saturation charge amount of the charge storage unit, PLS, and light sensitivity are in a trade-off relationship.

For example, when the area of the charge storage unit is increased in order to increase the saturation charge amount of the charge storage unit, there would be a need to increase the area of the light shielding film as well. However, increasing the area of the light shielding film would narrow an opening of the photoelectric conversion unit, leading to reduction in light sensitivity. On the other hand, reducing the area of the light shielding film to increase the light sensitivity would deteriorate PLS.

In view of this, the present technology is intended to reduce PLS while suppressing degradation of sensitivity.

Solutions to Problems

An imaging element according to a first aspect of the present technology includes, within a pixel: a semiconductor substrate; a photoelectric conversion unit formed in the semiconductor substrate; a first charge storage unit that stores a charge generated by the photoelectric conversion unit; and a first transfer gate unit formed on an opposite surface of the semiconductor substrate on an opposite side of a light incident surface and used for transfer of a charge from the photoelectric conversion unit to the first charge storage unit, in which the first transfer gate unit includes a first electrode embedded in a first trench formed in the semiconductor substrate from the opposite surface of the semiconductor substrate, and the photoelectric conversion unit includes the first electrode and a second electrode surrounding at least a portion of a periphery of the first electrode.

It is allowable to further provide a light shielding film that covers a bottom surface of the second electrode facing the incident surface of the semiconductor substrate, provided on the incident surface of the semiconductor substrate.

The light shielding film can cover at least a portion of a side surface of the second electrode.

It is allowable to have a predetermined distance or more between the opposite surface of the semiconductor substrate and an opposite surface of the photoelectric conversion unit on an opposite side of the light incident surface.

The bottom surface of the second electrode can be disposed at a position closer to the opposite surface of the semiconductor substrate than the opposite surface of the photoelectric conversion unit.

The first transfer gate unit can further include a third electrode embedded in a second trench formed in the semiconductor substrate from the opposite surface of the semiconductor substrate, and connected to the photoelectric conversion unit.

The first electrode and the second electrode can be disposed between the opposite surface of the semiconductor substrate and the opposite surface of the photoelectric conversion unit.

The first transfer gate unit can include a plurality of the first electrodes embedded in a plurality of the first trenches formed in the semiconductor substrate from the opposite surface of the semiconductor substrate, and the photoelectric conversion unit can include the plurality of first electrodes and a plurality of the second electrodes surrounding the periphery of each of the first electrodes.

A second charge storage unit and a second transfer gate unit formed on the opposite surface of the semiconductor substrate and used for transfer of a charge from the first charge storage unit to the second charge storage unit can be provided within a pixel, the second transfer gate unit can include a fourth electrode embedded in a third trench formed in the semiconductor substrate from the opposite surface of the semiconductor substrate, and the photoelectric conversion unit can include the fourth electrode and a fifth electrode surrounding at least a portion of a periphery of the fourth electrode.

A light shielding film to cover a bottom surface of the second electrode facing the incident surface of the semiconductor substrate and cover a bottom surface of the fifth electrode facing the incident surface of the semiconductor substrate can be further provided on the incident surface of the semiconductor substrate.

The light shielding film can cover at least a portion of a side surface of the second electrode and at least a portion of a side surface of the fifth electrode.

An imaging element according to a second aspect of the present technology includes: a semiconductor substrate; a first photoelectric conversion unit formed in the semiconductor substrate in a first pixel that detects light of a first color; a first charge storage unit that stores a charge generated by the first photoelectric conversion unit, a first transfer gate unit formed on an opposite surface of the semiconductor substrate on an opposite side of the light incident surface and used for transfer of the charge from the first photoelectric conversion unit to the first charge storage unit; a second photoelectric conversion unit formed in the semiconductor substrate within a second pixel that detects light of a second color different from the first color; a second charge storage unit that stores a charge generated by the second photoelectric conversion unit; and a second transfer gate unit formed on the opposite surface of the semiconductor substrate and used for transfer of the charge from the second photoelectric conversion unit to the second charge storage unit, in which the first charge storage unit and the second charge storage unit are arranged in the first pixel, between the opposite surface of the semiconductor substrate and an opposite surface of the first photoelectric conversion unit on an opposite side of the light incident surface.

A wavelength of the first color can be set shorter than a wavelength of the second color, and the first photoelectric conversion unit can be set thinner than the second photoelectric conversion unit.

It is possible to further provide, within a third pixel that detects blue light: a third photoelectric conversion unit formed in the semiconductor substrate; a third charge storage unit that stores a charge generated by the third photoelectric conversion unit; and a third transfer gate unit formed on the opposite surface of the semiconductor substrate and used for transfer of the charge from the third photoelectric conversion unit to the third charge storage unit, in which it is possible to configure such that the first color is green, the second color is red, the first charge storage unit and the second charge storage unit are arranged in the first pixel adjacent to the second pixel in a predetermined direction, between the opposite surface of the semiconductor substrate and the opposite surface of the first photoelectric conversion unit, and the first charge storage unit and the third charge storage unit are arranged in the first pixel adjacent to the third pixel in a predetermined direction, between the opposite surface of the semiconductor substrate and the opposite surface of the first photoelectric conversion unit.

The first to third pixels can be arranged in a Bayer array.

The first color can be blue and the second color can be red or green.

It is possible to provide, within the first pixel, a fourth charge storage unit disposed between the opposite surface of the semiconductor substrate and the opposite surface of the first photoelectric conversion unit.

A signal based on a difference between a charge of the first charge storage unit and a charge of the fourth charge storage unit can be set as a signal of the first pixel, and a signal based on a difference between a charge of the second charge storage unit and a charge of the fourth charge storage unit can be set as a signal of the second pixel.

An imaging element according to a third aspect of the present technology includes, within a pixel: a semiconductor substrate; a photoelectric conversion unit formed in the semiconductor substrate; a charge storage unit disposed between an opposite surface of the semiconductor substrate on the opposite side of the light incident surface and the opposite surface of the photoelectric conversion unit on the opposite side of the light incident surface, and configured to store a charge generated in the photoelectric conversion unit; and a transfer gate unit formed on the opposite surface of the semiconductor substrate and used for transfer of the charge from the photoelectric conversion unit to the charge storage unit, in which a signal based on a difference between a charge read out from the charge storage unit after a predetermined first period has elapsed from a point of transfer of the charge stored in the photoelectric conversion unit to the charge storage unit and a charge read out from the charge storage unit after a predetermined second period has elapsed from a point of resetting the charge storage unit, is set as a signal of the pixel.

The length of the first period can be equal to the length of the second period.

In the first aspect of the present technology, the charge generated by the photoelectric conversion unit is transferred to and stored in the first charge storage unit using the first transfer gate unit.

According to the second aspect of the present technology, the charge generated by the first photoelectric conversion unit is transferred to and stored in the first charge storage unit using the first transfer gate unit, and the charge generated by the second photoelectric conversion unit is transferred to and stored in the second charge storage unit using the second transfer gate unit.

In the third aspect of the present technology, a signal based on a difference between a charge read out from the charge storage unit after a predetermined first period has elapsed from a point of transfer of the charge stored in the photoelectric conversion unit to the charge storage unit and the charge read out from the charge storage unit after a predetermined second period has elapsed from a point of resetting the charge storage unit, is set as a signal of the pixel.

Effects of the Invention

According to the first aspect to the third aspect of the present technology, it is possible to reduce PLS while suppressing degradation in sensitivity.

Note that effects described herein are non-restricting. The effects may be any of effects described in the present disclosure.

MODE FOR CARRYING OUT THE INVENTION

Figure 1:
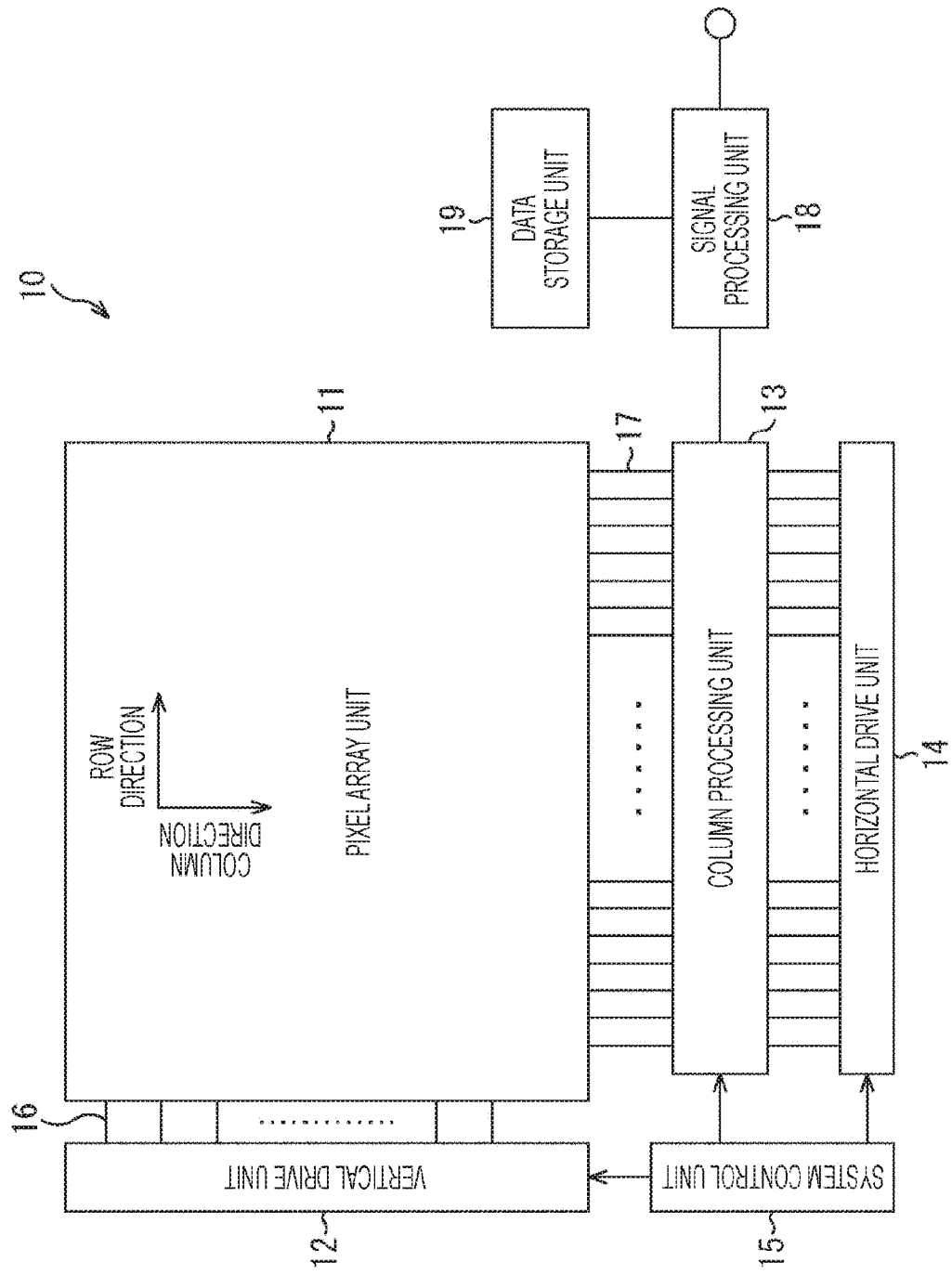
FIG. 1 is a system configuration diagram illustrating an outline of a configuration of a CMOS image sensor according to a first embodiment of the present technology.

Hereinafter, embodiments of the present invention (hereinafter, embodiment(s)) will be described in detail with reference to the drawings. Note that description will be presented in the following order.

1. First embodiment (example of charge storage unit configured by trench capacitor)
2. Modification of first embodiment
3. Second embodiment (example of providing two charge storage units)
4. Modification of second embodiment
5. Third embodiment (example of stacking photoelectric conversion unit and charge storage unit in some pixels)
6. Modification of third embodiment
7. Fourth embodiment (example of stacking photoelectric conversion unit and charge storage unit in all pixels)
8. Other modifications
9. Application example of imaging element 1. First Embodiment First, a first embodiment of the present technology will be described with reference to FIGS. 1 to 7.

[Basic System Configuration]

FIG. 1 is a system configuration diagram illustrating an outline of a configuration of an imaging element to which the present technology is applied, for example, a CMOS image sensor which is a type of an X-Y address system imaging element. Here, a CMOS image sensor is an image sensor created by application of or partial use of a CMOS process.

A CMOS image sensor 10 according to the present application example includes: a pixel array unit 11 formed on a semiconductor substrate (chip) (not illustrated); and a peripheral circuit unit integrated on a semiconductor substrate same as or different from the substrate that includes the pixel array unit 11. The peripheral circuit unit includes, for example, a vertical drive unit 12, a column processing unit 13, a horizontal drive unit 14, and a system control unit 15.

The CMOS image sensor 10 further includes a signal processing unit 18 and a data storage unit 19. The signal processing unit 18 and the data storage unit 19 may be mounted on the same substrate as the CMOS image sensor 10, or may be disposed on a different substrate from the CMOS image sensor 10. Furthermore, processing of each of the signal processing unit 18 and the data storage unit 19 may be performed by an external signal processing unit provided on a substrate different from the CMOS image sensor 10, for example, by a digital signal processor (DSP) circuit or by software.

The pixel array unit 11 has a configuration in which unit pixels (hereinafter, may be simply referred to as pixels) including a photoelectric conversion unit that generates and stores electric charges according to the received light amount are two-dimensionally arranged in a row direction and a column direction, that is, in a matrix. Here, the row direction refers to a pixel arrangement direction of pixel rows (that is, a horizontal direction), while the column direction refers to a pixel arrangement direction of pixel columns (that is, a vertical direction). Specific circuit configurations of the unit pixels and the details of the pixel structure will be described later.

With respect to the matrix of pixel arrangements in the pixel array unit 11, pixel drive lines 16 are wired in the row direction for each of pixel rows, while vertical signal lines 17 are wired in the column direction for each of pixel columns. The pixel drive line 16 transmits a drive signal for performing driving at the time of signal readout from the pixel. Although FIG. 1 illustrates a case where the pixel drive line 16 has a single wire, the number of wires is not limited to one. One end of the pixel drive line 16 is connected to an output end corresponding to each of rows of the vertical drive unit 12.

The vertical drive unit 12 includes a shift register, an address decoder, or the like, and drives each of the pixels of the pixel array unit 11 simultaneously for all the pixels, or in units of rows, etc. That is, the vertical drive unit 12, together with the system control unit 15 that controls the vertical drive unit 12, has a configuration as a drive unit that controls operation of each of the pixels of the pixel array unit 11. Although illustration of a specific configuration is omitted, the vertical drive unit 12 has a configuration including two scanning systems, namely, a readout scanning system and a sweep scanning system, in typical cases.

The readout scanning system sequentially selects and scans the unit pixel of the pixel array unit 11 in units of rows in order to read out signals from the unit pixels. The signal read out from the unit pixel is an analog signal. The sweep scanning system applies sweep scanning ahead of the readout scanning by the time corresponding to the exposure period onto the readout rows on which the readout scanning is performed by the readout scanning system.

Sweep scanning by the sweep scanning system is performed to sweep out unnecessary charges from the photoelectric conversion unit of the unit pixel in the readout rows, whereby the photoelectric conversion unit is reset. Moreover, sweeping out (resetting) unnecessary charges by this sweep scanning system leads to so-called electronic shutter operation. Here, the electronic shutter operation refers to operation of discarding a charge of the photoelectric conversion unit and starting a new exposure (start storage of a charge).

The signal read out by the readout operation by the readout scanning system corresponds to the amount of light received after the readout operation or the electronic shutter operation just before the readout operation. Moreover, the period from the readout timing by the immediately preceding readout operation or the sweep timing by the electronic shutter operation to the readout timing by the present readout operation is an exposure period of the charge in the unit pixel.

The signal output from each of unit pixels of the pixel row selectively scanned by the vertical drive unit 12 is input to the column processing unit 13 through each of the vertical signal lines 17 for each of pixel columns. For each of pixel columns of the pixel array unit 11, the column processing unit 13 performs predetermined signal processing on a signal output from each of unit pixels of the selected row through the vertical signal line 17, and together with this, temporarily holds pixel signals after the signal processing.

Specifically, the column processing unit 13 performs signal processing at least including noise removal processing such as correlated double sampling (CDS) processing or double data sampling (DDS) processing. For example, the CDS processing is effective for removing pixel-specific fixed pattern noise such as reset noise and threshold variation of the amplification transistor in the pixel. In addition to the noise removal processing, the column processing unit 13 may include an analog-to-digital (AD) conversion function, and an analog pixel signal can be converted into a digital signal and output, for example.

The horizontal drive unit 14 includes a shift register, an address decoder, or the like, and sequentially selects unit circuits corresponding to the pixel columns of the column processing unit 13. Along with the selective scanning by the horizontal drive unit 14, the column processing unit 13 sequentially outputs pixel signals subjected to signal processing for each of unit circuits.

The system control unit 15 includes a timing generator that generates various timing signals and the like, and controls driving of the vertical drive unit 12, the column processing unit 13, and the horizontal drive unit 14, or the like on the basis of various timing generated by the timing generator.

The signal processing unit 18 includes at least an arithmetic processing function and performs various signal processing such as arithmetic processing on the pixel signal output from the column processing unit 13. The data storage unit 19 temporarily stores data necessary for signal processing in the signal processing unit 18.

[Other System Configuration]

The CMOS image sensor 10 to which the present technology is applied is not limited to the system configuration described above. The following system configurations can be implemented as another system configuration as described below.

Figure 2:
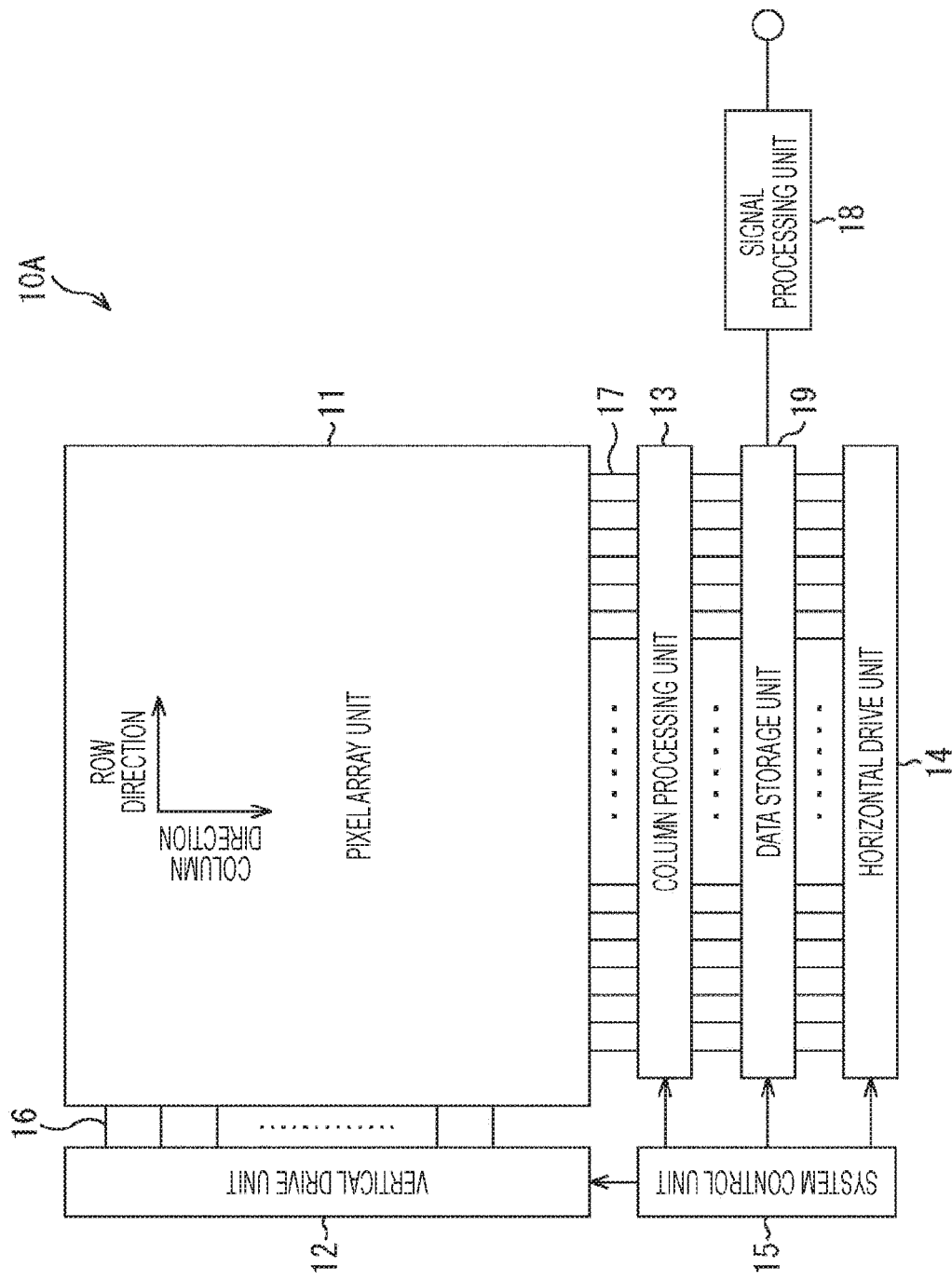
FIG. 2 is a system configuration diagram (part 1) illustrating another system configuration of the CMOS image sensor according to the first embodiment of the present technology.

For example, as illustrated in FIG. 2, it is possible to provide a CMOS image sensor 10A having a system configuration in which the data storage unit 19 is arranged downstream of the column processing unit 13 and pixel signals output from the column processing unit 13 are supplied to the signal processing unit 18 via the data storage unit 19.

Figure 3:
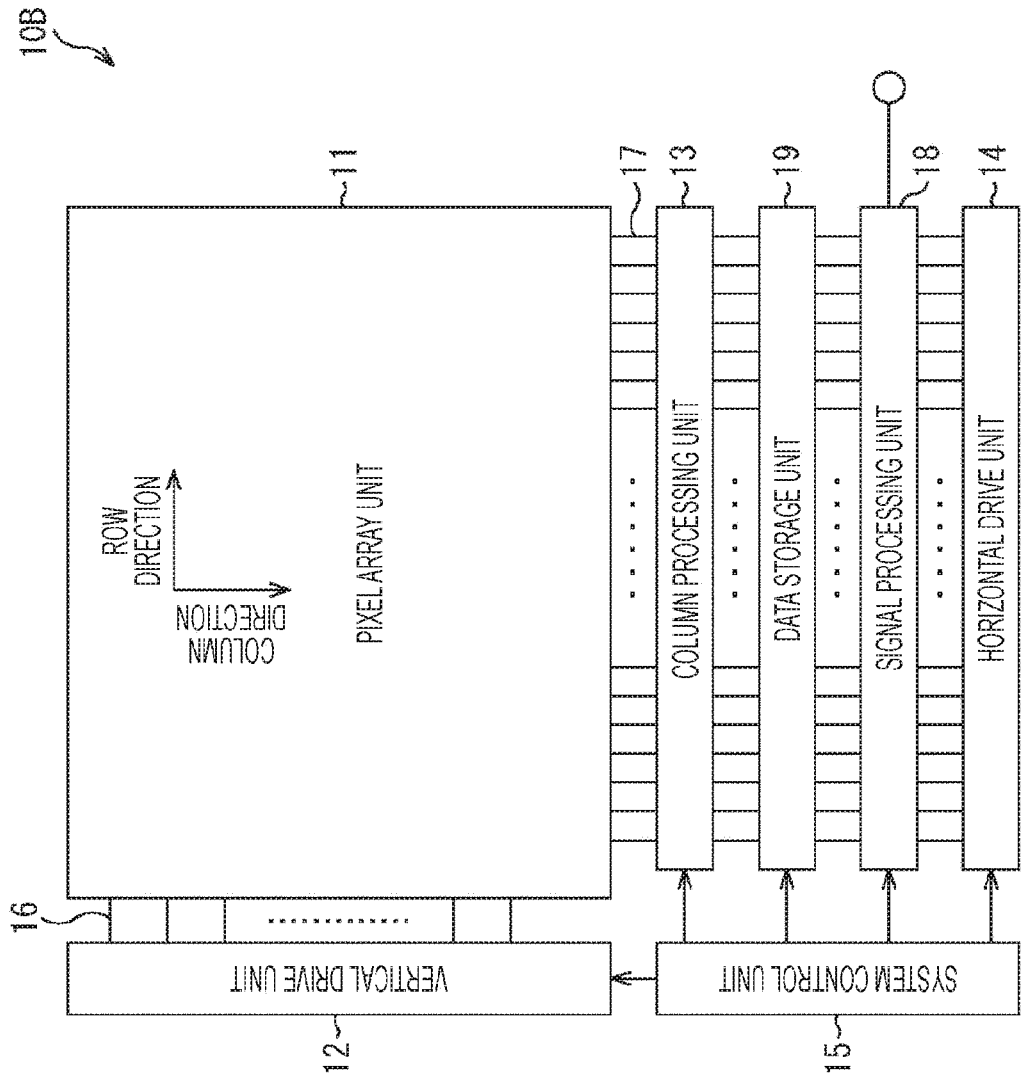
FIG. 3 is a system configuration diagram (part 2) illustrating another system configuration of the CMOS image sensor according to the first embodiment of the present technology.

Furthermore, as illustrated in FIG. 3, it is possible to provide a CMOS image sensor 10B having a system configuration in which the column processing unit 13 includes an AD conversion function of performing AD conversion for each of columns or a plurality of columns of the pixel array unit 11, and in which the data storage unit 19 and the signal processing unit 18 are installed in parallel with respect to the column processing unit 13.

[Circuit Configuration of Pixel 100]

Figure 4:
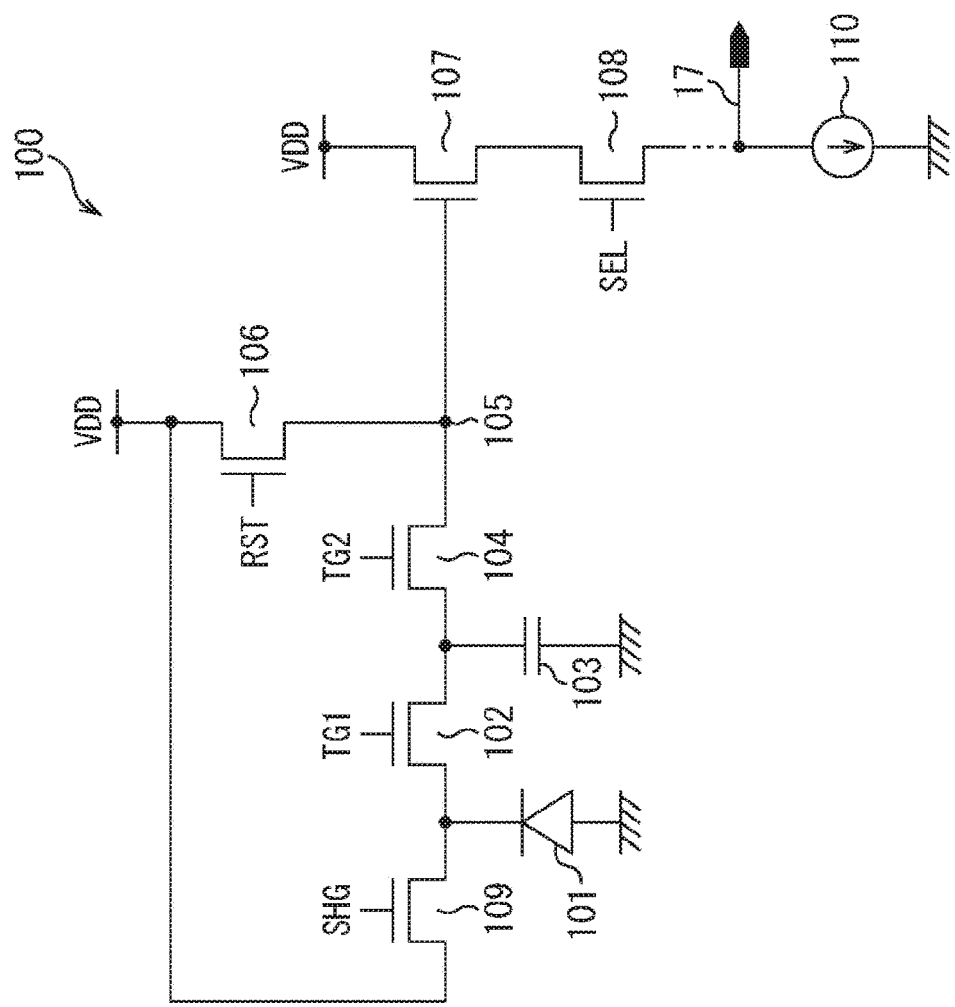
FIG. 4 is a circuit diagram illustrating a configuration example of a unit pixel according to the first embodiment of the present technology.

FIG. 4 is a circuit diagram illustrating a configuration example of a pixel 100 arranged in the pixel array unit 11 of FIGS. 1 to 3.

The pixel 100 includes a photoelectric conversion unit 101, a memory transfer gate unit 102, a charge storage unit 103, an FD transfer gate unit 104, a floating diffusion (FD) unit 105, a reset gate unit 106, an amplification transistor 107, a selection transistor 108, and a charge discharging gate unit 109.

Furthermore, with respect to the pixel 100, a plurality of signal lines is wired, for example, for each of pixel rows, as the pixel drive line 16 in FIG. 1. Additionally, drive signals TG1, TG2, RST, SEL, and SHG are supplied from the vertical drive unit 12 of FIG. 1 via the plurality of signal lines. These drive signals are signals in which the high level (for example, a power supply voltage VDD) state is active while the low level (for example, a power supply voltage VSS) state is inactive, since each of transistor of the pixel 100 is an NMOS transistor.

Note that hereinafter, the transition of the drive signal to the active state will also be referred to as turning on the drive signal and transition of the drive signal to the inactive state is also referred to as turning off the drive signal.

The photoelectric conversion unit 101 includes a photodiode of a PN junction, for example. The photoelectric conversion unit 101 generates and stores a charge corresponding to the amount of light received.

The memory transfer gate unit 102 is connected between the photoelectric conversion unit 101 and the charge storage unit 103. The drive signal TG1 is applied to the gate electrode of the memory transfer gate unit 102. When the drive signal TG1 is turned on, the memory transfer gate unit 102 becomes conductive, and the charge stored in the photoelectric conversion unit 101 is transferred to the charge storage unit 103 via the memory transfer gate unit 102.

The charge storage unit 103 includes a capacitor, for example, and temporarily stores the charge transferred from the photoelectric conversion unit 101.

The FD transfer gate unit 104 is connected between the charge storage unit 103 and the FD unit 105. The drive signal TG2 is applied to the gate electrode of the FD transfer gate unit 104. When the drive signal TG2 is turned on, the FD transfer gate unit 104 becomes conductive and then, the charge stored in the charge storage unit 103 is transferred to the FD unit 105 via the FD transfer gate unit 104.

The FD unit 105 converts the charge into a voltage signal and outputs the signal.

The reset gate unit 106 is connected between the power supply VDD, which is the positive power supply of the pixel 100, and the FD unit 105. The drive signal RST is applied to the gate electrode of the reset gate unit 106. When the drive signal RST is turned on, the reset gate unit 106 becomes conductive, and then, the potential of the FD unit 105 is reset to the level of the power supply voltage VDD.

The amplification transistor 107 has its gate electrode connected to the FD unit 105 and has its drain electrode connected to the power supply VDD, and serves as an input unit of a readout circuit used for readout of the charge held in the FD portion 105, namely, a source follower circuit. That is, the amplification transistor 107 has its source electrode connected to the vertical signal line 17 via the selection transistor 108, thereby constituting a source follower circuit together with a constant current source 110 connected to one end of the vertical signal line 17.

The selection transistor 108 is connected between the source electrode of the amplification transistor 107 and the vertical signal line 17. The drive signal SEL is applied to the gate electrode of the selection transistor 108. When the drive signal SEL is turned on, the selection transistor 108 becomes conductive, and then, the pixel 100 is selected. With this operation, the pixel signal output from the amplification transistor 107 is output to the vertical signal line 17 via the selection transistor 108.

The charge discharging gate unit 109 is connected between the power supply VDD and the photoelectric conversion unit 101. The drive signal SHG is applied to the gate electrode of the charge discharging gate unit 109. When the drive signal SHG is turned on, the charge discharging gate unit 109 becomes conductive. Subsequently, the charge of the photoelectric conversion unit 101 is discharged, and the photoelectric conversion unit 101 is reset.

Note that hereinafter, the transition of each of gate units or each of transistors to the conductive state will also be referred to as turning on each of gate units or each of transistors, and the transition of each of gate units or each of transistors to the non-conductive state will also be referred to as turning off each of gate units or each of transistors.

Figure 5:
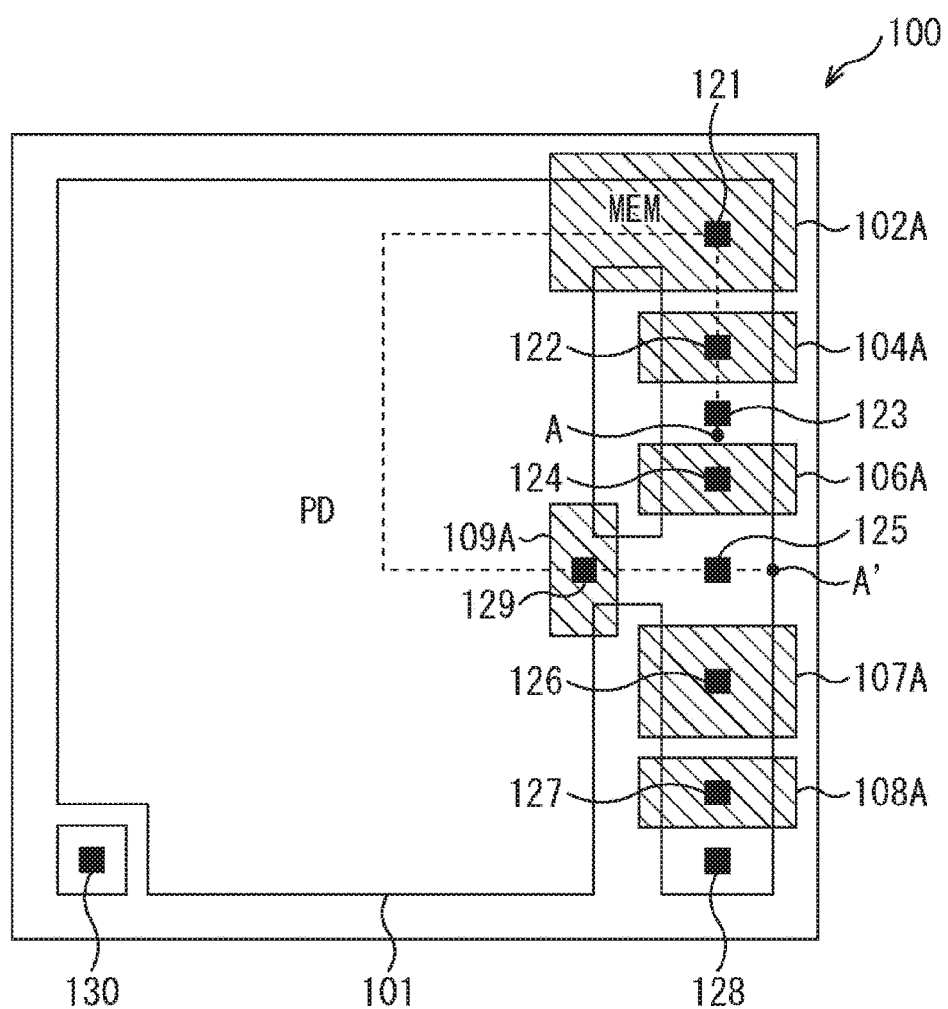
FIG. 5 is a plan view schematically illustrating a configuration example of the unit pixel of FIG. 4.
Figure 6:
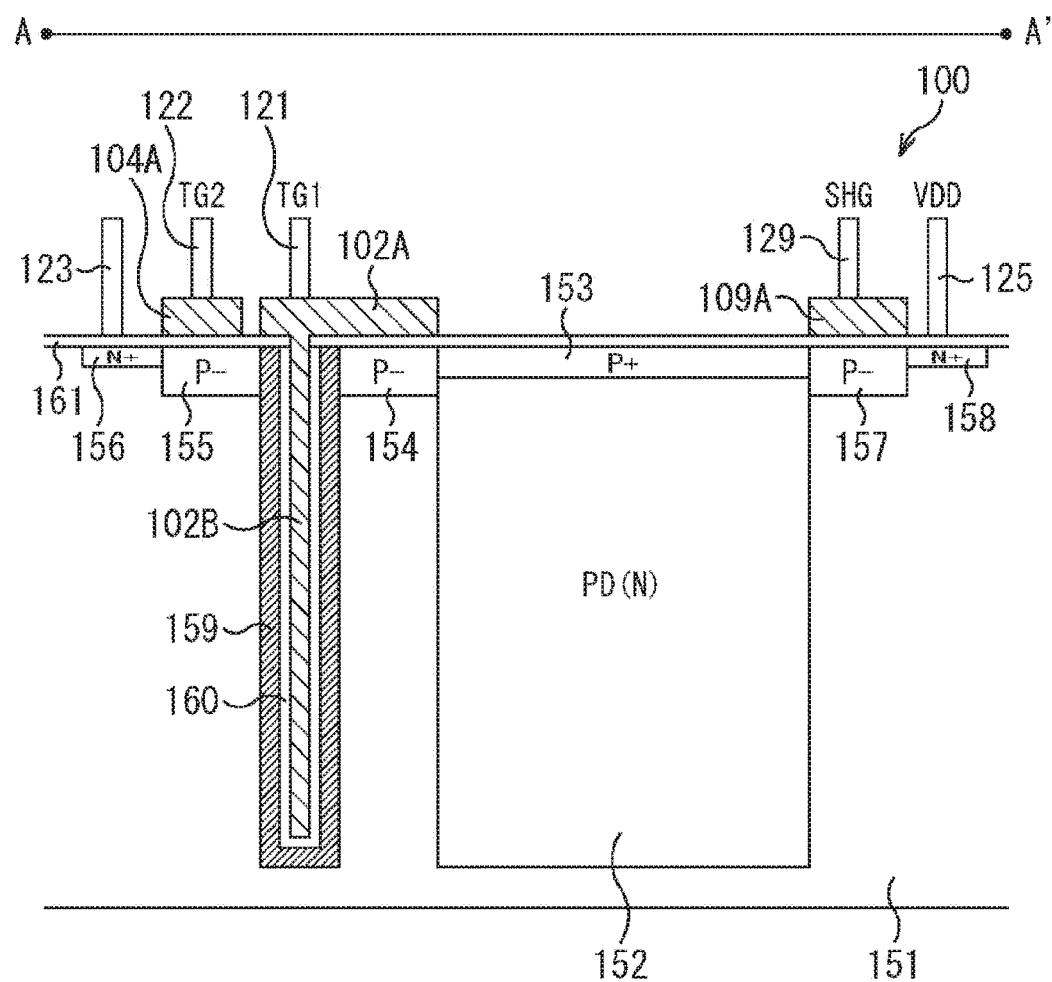
FIG. 6 is a cross-sectional view schematically illustrating a configuration example of the unit pixel of FIG. 4.

Next, a configuration example of the pixel 100 will be described with reference to FIGS. 5 and 6. FIG. 5 is a plan view schematically illustrating a configuration example of the pixel 100. Note that FIG. 5 omits illustration of wiring layers. FIG. 6 schematically illustrates a cross section of the pixel 100 in A-A' direction of FIG. 5.

Note that hereinafter, the vertical direction in FIG. 6 is defined as the vertical direction of the pixel 100, the upper side in FIG. 6 is defined as the upper side of the pixel 100, and the lower side as the lower side of the pixel 100. Furthermore, hereinafter, in the horizontal direction (planar direction) of the pixel 100, the vertical direction in FIG. 5 is defined as the vertical direction of the pixel 100, and the horizontal direction is defined as the horizontal direction of the pixel 100.

First, the arrangement of the pixels 100 in the horizontal direction will be mainly described with reference to FIG. 5.

A large part of the pixels 100 is occupied by the photoelectric conversion unit 101.

On the right side of the photoelectric conversion unit 101, a gate electrode 102A of the memory transfer gate unit 102, a gate electrode 104A of the FD transfer gate unit 104, a contact 123, a gate electrode 106A of the reset gate unit 106, a contact 125, and a gate electrode 107A of the amplification transistor 107, a gate electrode 108A of the selection transistor 108, and a contact 128 are arranged in a line in the vertical direction. The gate electrode 102A partially overlaps with the photoelectric conversion unit 101. Furthermore, a gate electrode 109A of the charge discharging gate unit 109 is disposed on the left side of the column of the gate electrode 102A to the contact 128 and between the gate electrode 106A and the gate electrode 107A. The gate electrode 109A partially overlaps with the photoelectric conversion unit 101.

Contacts 121, 122, 124, 126, 127, and 129 are connected to the upper surfaces of the gate electrodes 102A, 104A, 106A, 107A, 108A, and 109A, respectively. The contact 123 is connected to the FD unit 105 (not illustrated). The contact 125 is connected to the power supply VDD (not illustrated). The contact 128 is connected to the source electrode of the selection transistor 108.

A contact 130 is disposed at a lower left corner of the photoelectric conversion unit 101 in the drawing. The contact 130 is connected to the power supply VSS (not illustrated) being a negative power supply of the pixel 100.

Next, arrangement of the pixels 100 in the vertical direction in the direction of A-A' in FIG. 5 will be mainly described with reference to FIG. 6.

Note that symbols "P" and "N" in the figure indicate a P type semiconductor region and an N type semiconductor region, respectively. Furthermore, "+" or "−" at the end of the symbols "P+", "P−", "N+", and "N−" represent the impurity concentration of the P type semiconductor region and the N type semiconductor region. Moreover, the larger the number of "+", the higher the impurity concentration, and the larger the number of "−", the lower the impurity concentration. The same applies to the subsequent drawings.

Furthermore, in FIG. 6, the left side in the figure is defined as the left side of the pixel 100, and the right side as the right side of the pixel 100. However, since FIG. 6 is taken along the A-A' direction of FIG. 5, it is not limited to the left side or the right side in practice. The same applies to the subsequent cross-sectional views.

In the pixel 100, light is incident from the back surface (incident surface) side of the semiconductor substrate (P type well layer) 151, and a wiring layer is stacked on the front surface (opposite surface) on an opposite side of the incident surface of the semiconductor substrate 151. Therefore, the CMOS image sensor 10 including the pixel 100 is a back-illuminated sensor.

On the front surface of the semiconductor substrate 151, the gate electrode 102A, the gate electrode 104A, and the gate electrode 109A are disposed via an insulating film 161. As the insulating film 161, a high dielectric constant insulating film such as High-k or an oxide film is used, for example. As described above, the contact 121 is connected to the upper surface of the gate electrode 102A, the contact 122 is connected to the upper surface of the gate electrode 104A, and the contact 129 is connected to the upper surface of the gate electrode 109A.

In the vicinity of the front surface of the semiconductor substrate 151, a P+ type semiconductor region 153, a P− type semiconductor region 154, a P− type semiconductor region 155, an N+ type semiconductor region 156, a P− type semiconductor region 157, and an N+ type semiconductor region 158 are formed.

Specifically, the P+ type semiconductor region 153 is disposed between the right end of the gate electrode 102A and the left end of the gate electrode 109A. An N type semiconductor region 152 is embedded under the P+ type semiconductor region 153. The N type semiconductor region 152 and the P+ type semiconductor region 153 constitute the photoelectric conversion unit 101 including an embedded photodiode.

The P− type semiconductor region 154 is disposed on the left side of the P+ type semiconductor region 153. The P− type semiconductor region 154 substantially occupies a lower right half of the gate electrode 102A. Furthermore, a gate electrode 102B is formed to extend vertically downward in the semiconductor substrate 151 from the lower surface of the gate electrode 102A. The periphery of the gate electrode 102B is covered with an N type semiconductor region 159 which is to be a counter electrode via an insulating film 160. As the insulating film 160, a high dielectric constant insulating film such as High-k is used, for example.

Note that examples of High-k materials applicable to the insulating film 160 and the insulating film 161 include, silicon nitride (SiN), hafnium oxide (HfO2), aluminum oxide (Al2O3), zirconium oxide (ZrO2), tantalum oxide Ta2O5), titanium oxide (TiO2), lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3) gadolinium oxide (Gd2O3), terbium oxide (Tb2O3), dysprosium oxide (Dy2O3), holmium oxide (Ho2O3), thulium oxide (Tm2O3), ytterbium oxide (Yb2O3), lutetium oxide (Lu2O3), yttrium oxide (Y2O3), and the like.

The gate electrode 102B, the N type semiconductor region 159, and the insulating film 160 constitute the charge storage unit 103 being a trench capacitor. By forming the charge storage unit 103 into a trench capacitor, it is possible to reduce the area of the charge storage unit 103 (area of the bottom surface of the N type semiconductor region 159) viewed from the incident surface side of the pixel 100. This result in reduction of parasitic light incident on the charge storage unit 103, leading to reduction of PLS. Furthermore, it is possible to increase the area (area of the bottom surface of the N type semiconductor region 152) of the photoelectric conversion unit 101 viewed from the incident surface side of the pixel 100, making it possible to suppress degradation of sensitivity due to the presence of the charge storage unit 103.

The P− type semiconductor region 155 is disposed between the left end of the gate electrode 102A and the left end of the gate electrode 104A.

The N+ type semiconductor region 156 is disposed on the left side of the P− type semiconductor region 155. The N+ type semiconductor region 156 constitutes the FD unit 105.

The P− type semiconductor region 157 is disposed at the right side of the P+ type semiconductor region 153 and under the gate electrode 109A.

The N+ type semiconductor region 158 is disposed on the right side of the P− type semiconductor region 157. The N+ type semiconductor region 158 is connected to the power supply VDD via the contact 125.

[Operation of Pixel 100]

Figure 7:
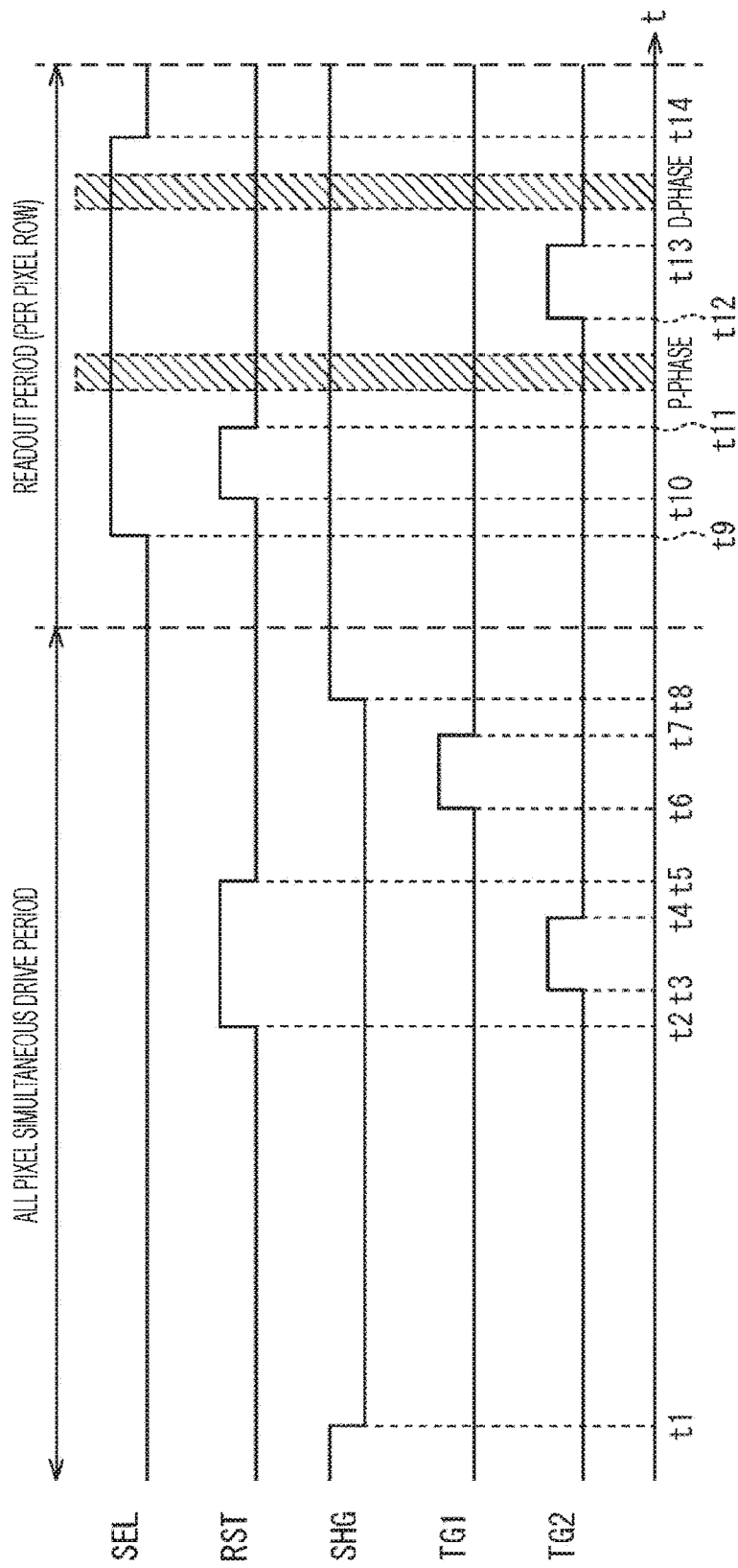
FIG. 7 is a timing chart illustrating operation of the unit pixel of FIG. 4.

Next, operation of the pixel 100 will be described with reference to the timing chart of FIG. 7. Note that FIG. 7 illustrates a timing chart of the drive signals SEL, RST, SHG, TG1, and TG2.

Note that processing in the exposure period from time t1 to time t8 is simultaneously executed for all pixels. The processing in the readout period from time t9 to time t14 is performed, for example, in a predetermined scanning order for each of pixel rows of the pixel array unit 11 or for each of a plurality of pixel rows.

At time t1, the drive signal SHG is turned off, and accordingly, the charge discharging gate unit 109 is turned off. This operation starts charge storage to the photoelectric conversion unit 101 and starts the exposure period.

At time t2, the drive signal RST is turned on, and accordingly, the reset gate unit 106 is turned on. With this operation, the potential of the FD unit 105 is reset to the level of the power supply voltage VDD.

At time t3, the drive signal TG2 is turned on, and accordingly, the FD transfer gate unit 104 is turned on. With this operation, the charge stored in the charge storage unit 103 is discharged to the power supply VDD via the FD transfer gate unit 104, the FD unit 105, and the reset gate unit 106, and then, the charge storage unit 103 is reset.

At time t4, the drive signal TG2 is turned off, and accordingly, the FD transfer gate unit 104 is turned off.

At time t5, the drive signal RST is turned off, and accordingly, the reset gate unit 106 is turned off.

At time t6, the drive signal TG1 is turned on, and accordingly, the memory transfer gate unit 102 is turned on. With this operation, the exposure period is finished simultaneously for all pixels, and the charges stored in the photoelectric conversion unit 101 during the exposure period are transferred to the charge storage unit 103 via the memory transfer gate unit 102 and stored.

At time t7, the drive signal TG1 is turned off, and accordingly, the memory transfer gate unit 102 is turned off. This operation completes the transfer of the charge from the photoelectric conversion unit 101 to the charge storage unit 103.

At time t8, the drive signal SHG is turned on, and accordingly, the charge discharging gate unit 109 is turned on. With this operation, the charge remaining in the photoelectric conversion unit 101 is discharged to the power supply VDD via the charge discharging gate unit 109, and the photoelectric conversion unit 101 is reset. Furthermore, the charges generated in the photoelectric conversion unit 101 are discharged to the power supply VDD via the charge discharging gate unit 109 during the readout period, making it possible to prevent inflow of charges to the charge storage unit 103.

At time t9, the drive signal SEL is turned on, and accordingly, the selection transistor 108 is turned on. This operation turns the pixel 100 to the selected state.

At time t10, the drive signal RST is turned on, and accordingly, the reset gate unit 106 is turned on. With this operation, the potential of the FD unit 105 is reset to the level of the power supply voltage VDD.

At time t11, the drive signal RST is turned off, and accordingly, the reset gate unit 106 is turned off.

Subsequently, between time t11 and time t12, a signal based on the potential of the FD unit 105 is read out via the amplification transistor 107, the selection transistor 108, and the vertical signal line 17. The signal read out at this time is a P-phase signal based on the potential in the state where the FD unit 105 is reset.

At time t12, the drive signal TG2 is turned on, and accordingly, the FD transfer gate unit 104 is turned on. With this operation, the charge stored in the charge storage unit 103 is transferred to the FD unit 105 via the FD transfer gate unit 104.

At time t13, the drive signal TG2 is turned off, and accordingly, the FD transfer gate unit 104 is turned off. This operation stops transfer of the charge from the charge storage unit 103 to the FD unit 105.

Subsequently, between time t13 and time t14, a signal based on the potential of the FD unit 105 is read out via the amplification transistor 107, the selection transistor 108, and the vertical signal line 17. The signal read out at this time is a D-phase signal based on the charge generated by the photoelectric conversion unit 101 during the exposure period.

Subsequently, for example, the column processing unit 13 performs DDS processing for calculating a difference between the D-phase signal and the P-phase signal of each of the pixels 100, so as to remove fixed pattern noise unique to each of the pixels 100.

At time t14, the drive signal SEL is turned off, and accordingly, the selection transistor 108 is turned off. This operation finishes the readout period of the pixel 100.

[Method for Manufacturing Charge Storage Unit 103]

Next, a method for manufacturing the charge storage unit 103 will be described.

First, a first manufacturing method will be described.

First, an N type semiconductor region is formed by ion implantation at a position where the N type semiconductor region 159 is to be formed.

Next, a trench for forming the gate electrode 102B is formed in the N type semiconductor region.

Next, ion implantation is performed to implant P type impurities into the side wall of the trench for pinning.

Next, after the insulating film 160 is formed on the side wall of the trench, the gate electrode 102B is embedded in the trench.

Next, a second manufacturing method will be described.

First, a trench is formed at a position where the gate electrode 102B is to be formed.

Next, an N type semiconductor region 159 is formed around the trench by ion implantation. Furthermore, ion implantation is performed to implant P type impurities into the side wall of the trench for pinning.

Next, after the insulating film 160 is formed on the side wall of the trench, the gate electrode 102B is embedded in the trench.

Next, a third manufacturing method will be described.

First, a trench is formed at a position where the N type semiconductor region 159 is to be formed.

Next, an N type semiconductor region 159 is formed on the side walls and the bottom surface of the trench by the solid-phase diffusion process. Furthermore, for pinning, a P type semiconductor region (not illustrated) is formed on the front surface of the N type semiconductor region 159 by the solid-phase diffusion process.

Next, after the insulating film 160 is formed on the side wall of the trench, the gate electrode 102B is embedded in the trench.

As described above, the pixel 100 forms the charge storage unit 103 using a trench capacitor, thereby reducing PLS and suppressing degradation of sensitivity.

2. Modification of First Embodiment

Next, modifications of the pixel 100 according to the first embodiment of the present technology will be described with reference to FIGS. 8 to 20.

First Modification

Figure 8:
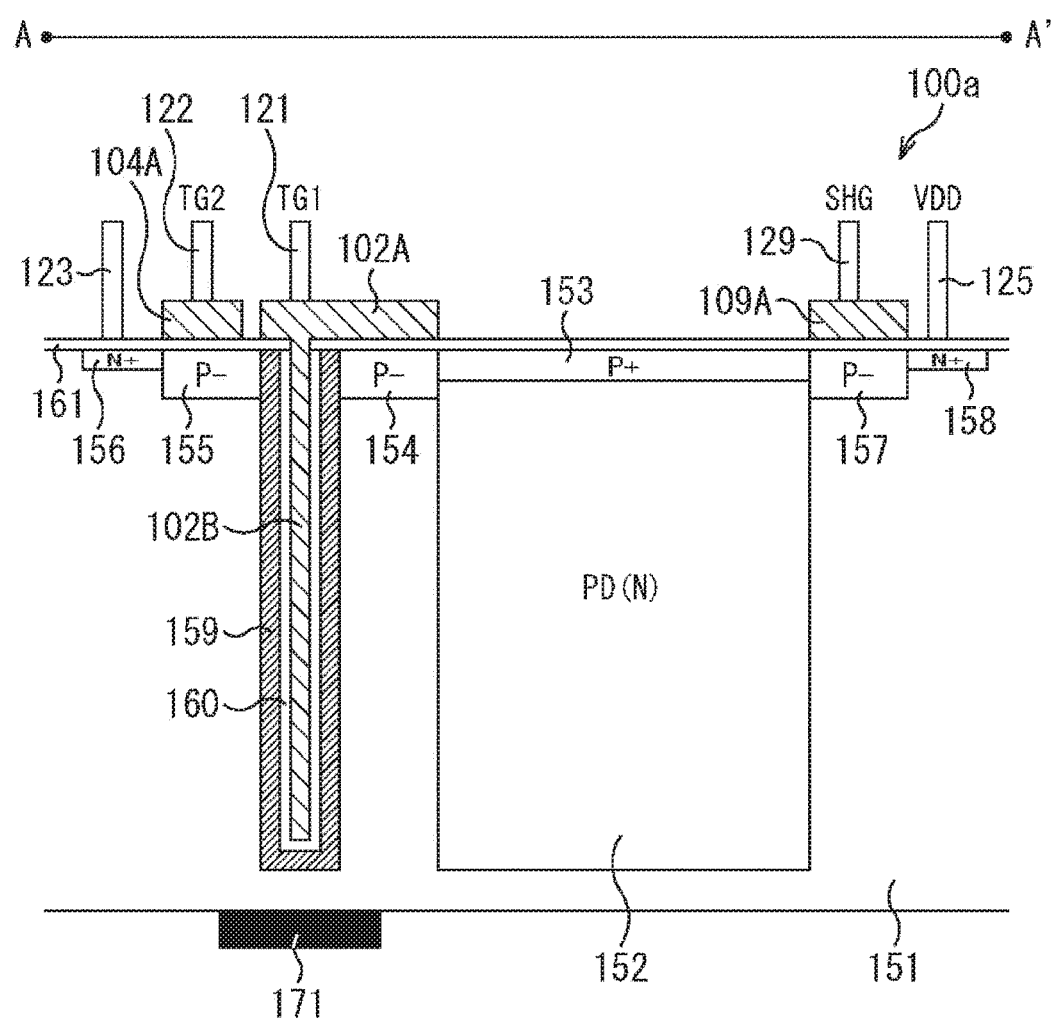
FIG. 8 is a cross-sectional view schematically illustrating a first modification of the unit pixel in the first embodiment of the present technology.

FIG. 8 is a cross-sectional view schematically illustrating a configuration example of a pixel 100a being a first modification of the pixel 100. Note that FIG. 8 schematically illustrates a cross section of the pixel 100a in A-A' direction of FIG. 5. Furthermore, note that in the figure, portions corresponding to those in FIG. 6 are denoted by the same reference numerals.

The pixel 100a is different from the pixel 100 in FIG. 6 in that a light shielding film 171 is provided.

The light shielding film 171 is disposed on the incident surface of the semiconductor substrate 151 so as to cover at least the entire bottom surface of the N type semiconductor region 159 facing the incident surface of the semiconductor substrate 151. The light shielding film 171 suppresses incident light from the incident surface of the pixel 100a

(semiconductor substrate 151) from being incident on the charge storage unit 103 (N type semiconductor region 159), and reduces PLS.

Note that it is desirable that the area of the light shielding film 171 be as wide as possible within a range not blocking the light incident on the photoelectric conversion unit 101 (N type semiconductor region 152).

Second Modification

Figure 9:
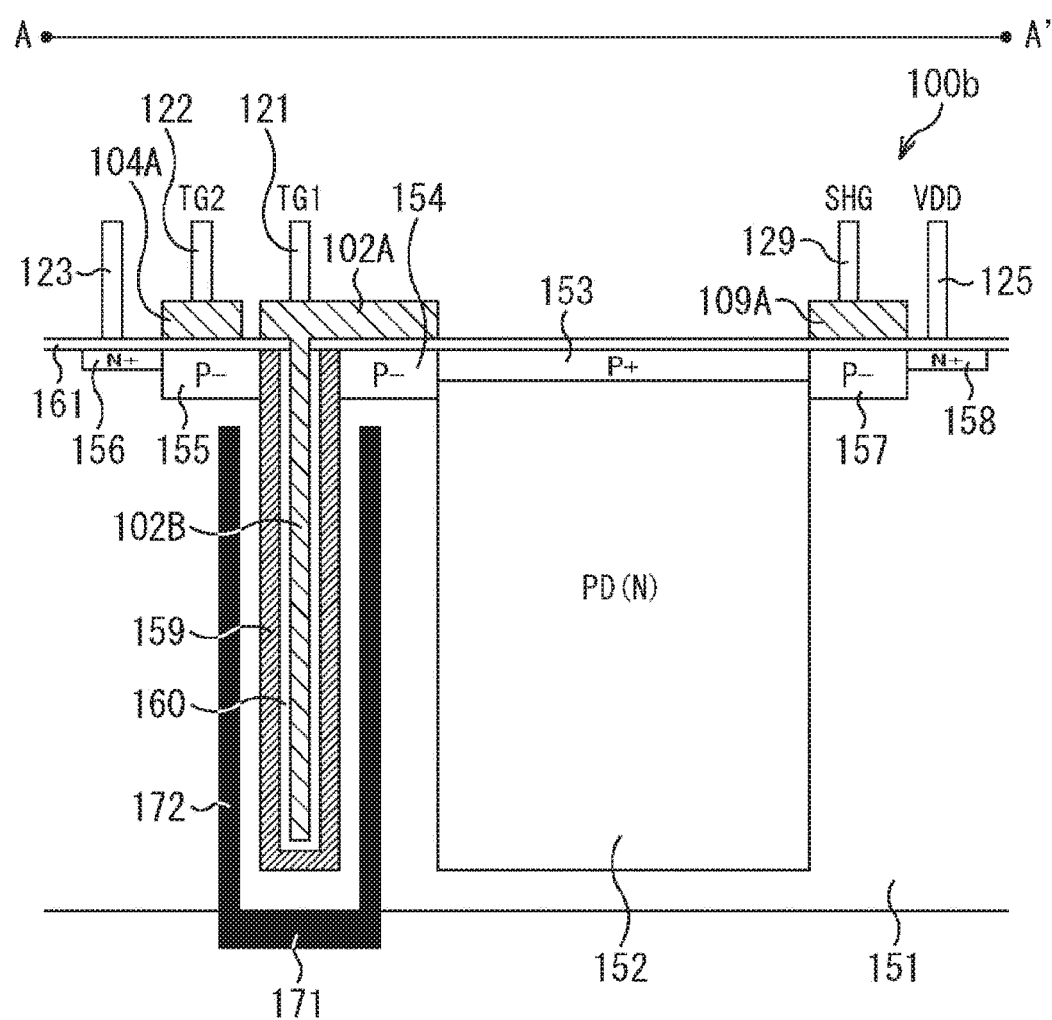
FIG. 9 is a cross-sectional view schematically illustrating a second modification of the unit pixel in the first embodiment of the present technology.

FIG. 9 is a cross-sectional view schematically illustrating a configuration example of a pixel 100b being a second modification of the pixel 100. Note that FIG. 9 schematically illustrates a cross section of the pixel 100b in A-A' direction of FIG. 5. Furthermore, note that in the figure, portions corresponding to those in FIG. 8 are denoted by the same reference numerals.

The pixel 100b is different from the pixel 100a of FIG. 8 in that a light shielding film 172 is provided.

The light shielding film 172 is formed to extend upward from the outer peripheral portion of the upper surface of the light shielding film 171, and surrounds a portion except the upper end portion of the side surface of the N type semiconductor region 159. Accordingly, the light shielding film 171 and the light shielding film 172 cover the side surface except the upper end portion, and the bottom surface, of the N type semiconductor region 159. This configuration further reduces parasitic light incident on the charge storage unit 103 (N type semiconductor region 159) and further reduces PLS.

Third Modification

Figure 10:
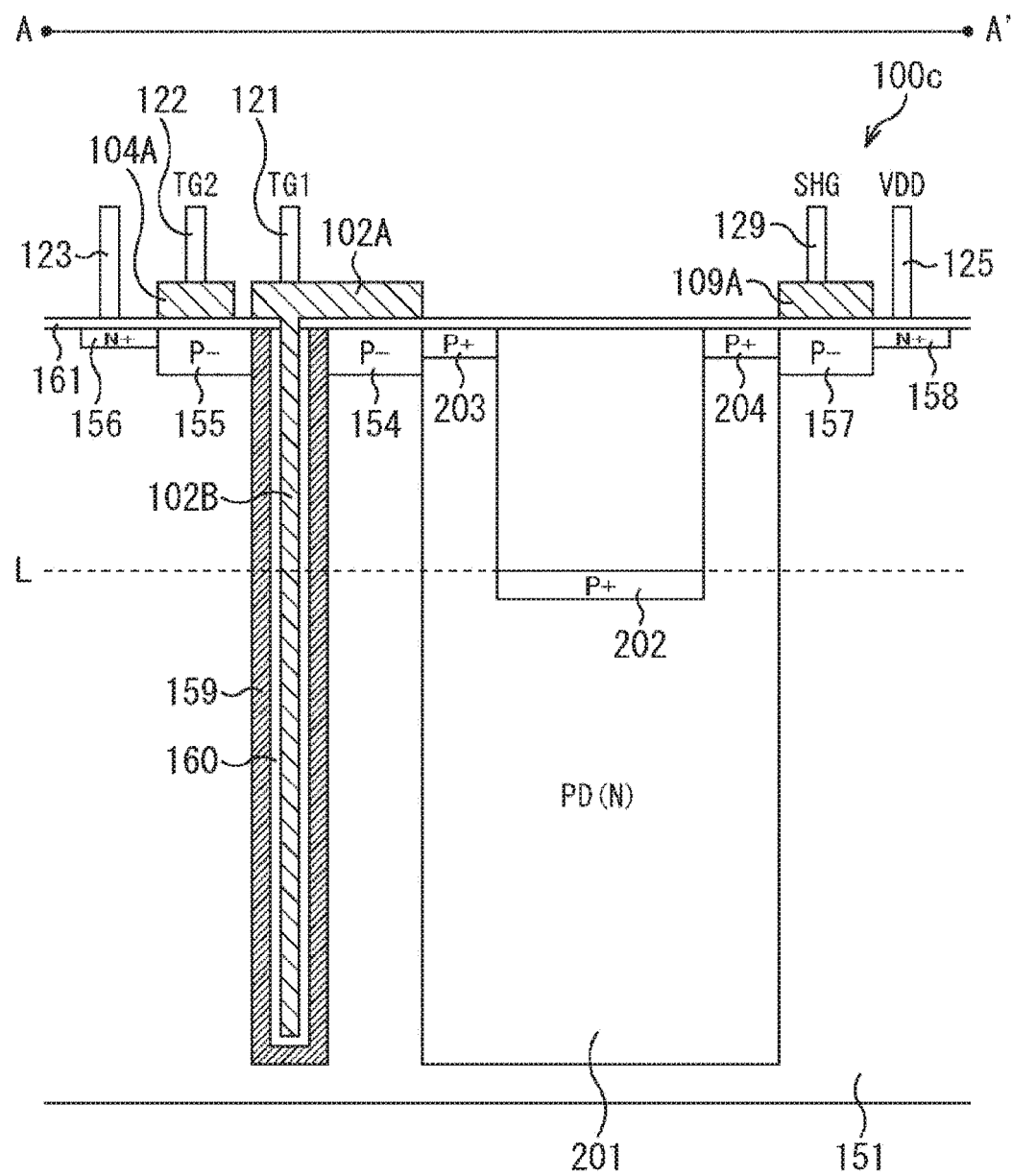
FIG. 10 is a cross-sectional view schematically illustrating a third modification of the unit pixel in the first embodiment of the present technology.

FIG. 10 is a cross-sectional view schematically illustrating a configuration example of a pixel 100c being a third modification of the pixel 100. Note that FIG. 10 schematically illustrates a cross section of the pixel 100c in A-A' direction of FIG. 5. Furthermore, note that in the figure, portions corresponding to those in FIG. 6 are denoted by the same reference numerals.

In the pixel 100c, the thickness of the semiconductor substrate 151 is increased as compared to the pixel 100 in FIG. 6. In other words, the distance from the incident surface to the front surface of the semiconductor substrate 151 is increased.

Furthermore, the pixel 100c is different from the pixel 100 in the configuration of the photoelectric conversion unit 101. Specifically, the photoelectric conversion unit 101 in the pixel 100c is configured with an N type semiconductor region 201, a P+ type semiconductor region 202, a P+ type semiconductor region 203, and a P+ type semiconductor region 204. The P+ type semiconductor region 203 is formed on the right side of the P− type semiconductor region 154 near the front surface of the semiconductor substrate 151. The P+ type semiconductor region 204 is formed on the left side of the P− type semiconductor region 157 near the front surface of the semiconductor substrate 151. The P+ type semiconductor region 202 is formed between the P+ type semiconductor region 203 and the P+ type semiconductor region 204 at a position indicated by a broken auxiliary line L separated from the front surface of the semiconductor substrate 151 by a predetermined distance or more in the vertical direction. That is, the upper surface of the P+ type semiconductor region 202, which is the upper surface (opposite surface) on the opposite side of the incident surface of the photoelectric conversion unit 101, is separated from the front surface of the semiconductor substrate 151 by a predetermined distance or more in the vertical direction.

The N type semiconductor region 201 is formed between the P− type semiconductor region 154 and the P− type semiconductor region 157. A lower surface of the P+ type semiconductor region 202 becomes an upper end of a central portion of the N type semiconductor region 201. Lower surfaces of the P+ type semiconductor region 203 and the P+ type semiconductor region 204 becomes upper ends of the end portions of the N type semiconductor region 201.

Furthermore, with an increased thickness of the semiconductor substrate 151, it is possible to increase the lengths of the gate electrode 102B, the N type semiconductor region 159, and the insulating film 160, in the vertical direction. With this configuration, it is possible to increase the capacitance of the charge storage unit 103 including the gate electrode 102B, the N type semiconductor region 159, and the insulating film 160.

Furthermore, since a region between the front surface of the semiconductor substrate 151 and the P+ type semiconductor region 202 becomes vacant, it is possible to arrange a transistor (for example, the amplification transistor 107, the selection transistor 108, or the like) or the like in this region, for example. This would increase the degree of freedom of the pixel layout, making it possible to expand the areas of the photoelectric conversion unit 101 and the charge storage unit 103 and possible to enhance the sensitivity and the saturation characteristic of the pixel 100c, for example.

Note that in the case of manufacturing a CMOS image sensor 10 including the pixel 100c, an impurity structure under the auxiliary line L is first formed, for example. Subsequently, a portion above the auxiliary line L is formed by stacking and increasing silicon layers constituting the semiconductor substrate 151 by epitaxial growth.

Fourth Modification

Figure 11:
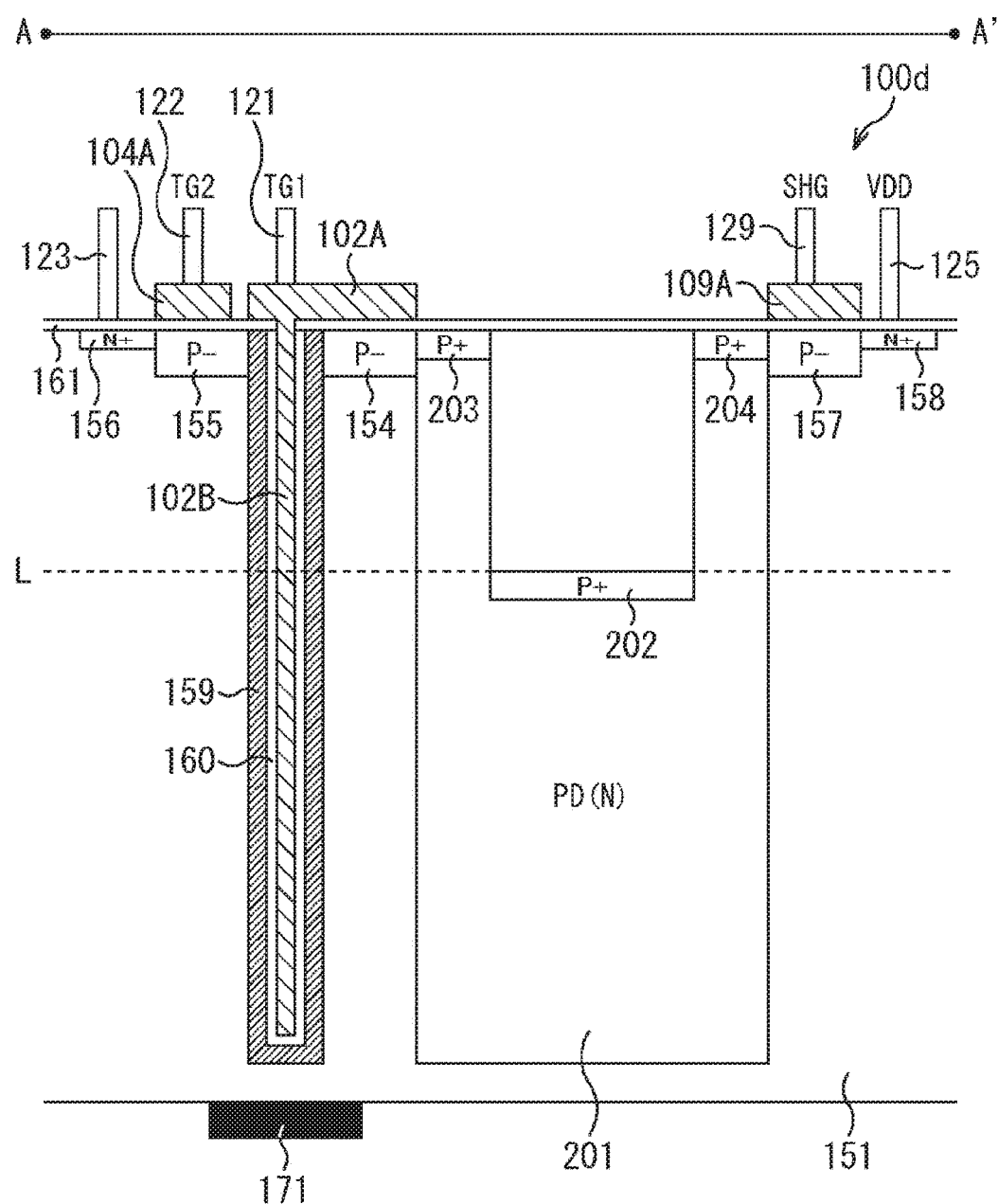
FIG. 11 is a cross-sectional view schematically illustrating a fourth modification of the unit pixel in the first embodiment of the present technology.

FIG. 11 is a cross-sectional view schematically illustrating a configuration example of a pixel 100d being a fourth modification of the pixel 100. Note that FIG. 11 schematically illustrates a cross section of the pixel 100d in A-A' direction of FIG. 5. Furthermore, note that in the figure, portions corresponding to those in FIGS. 8 and 10 are denoted by the same reference numerals.

The pixel 100d is different from the pixel 100c of FIG. 10 in that the light shielding film 171 for shielding light incident on the N type semiconductor region 159 is provided on the incident surface of the semiconductor substrate 151, similarly to the pixel 100a of FIG. 8. This light shielding film 171 can reduce parasitic light incident on the charge storage unit 103 (N type semiconductor region 159) and can reduce PLS.

Fifth Modification

Figure 12:
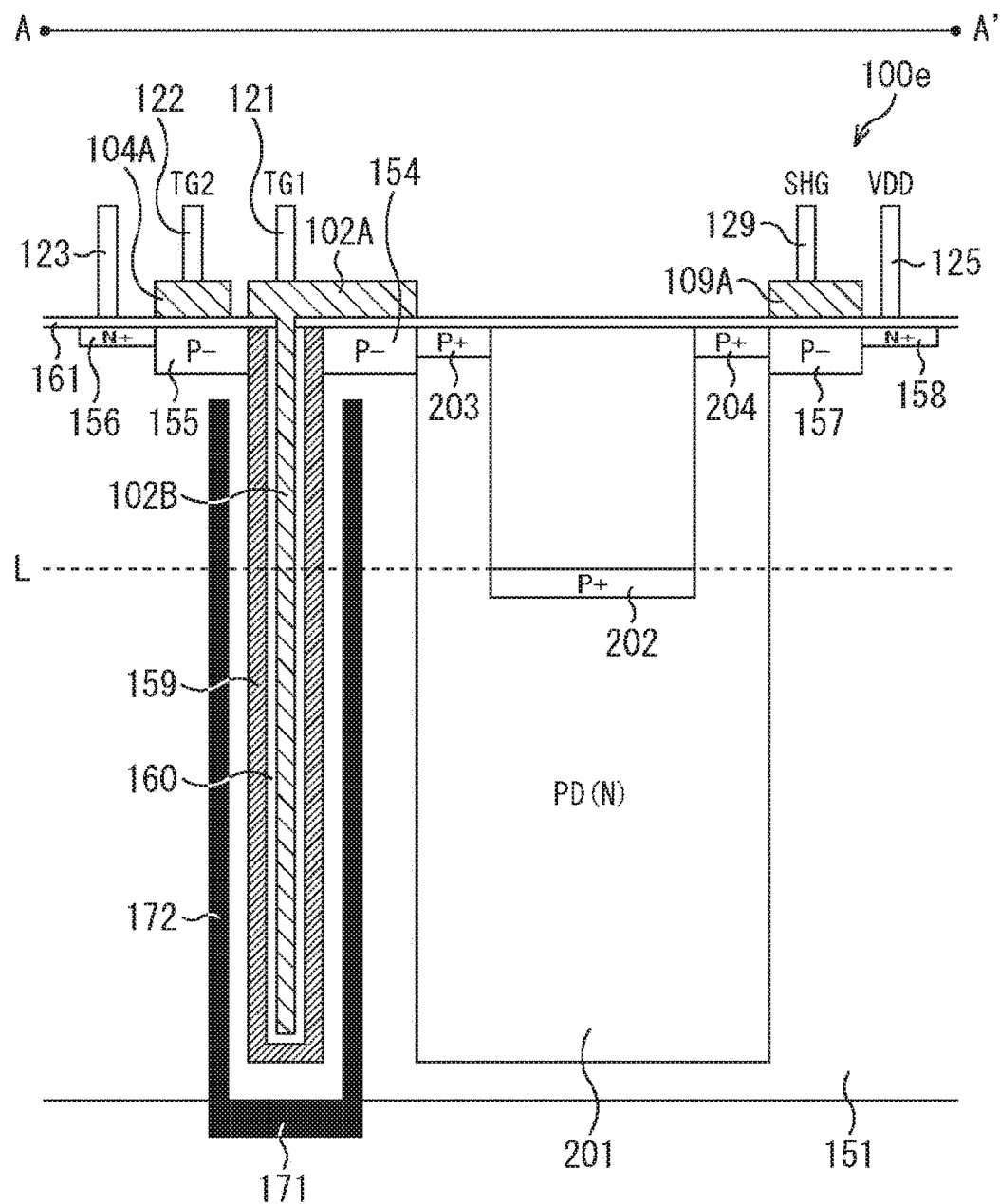
FIG. 12 is a cross-sectional view schematically illustrating a fifth modification of the unit pixel in the first embodiment of the present technology.

FIG. 12 is a cross-sectional view schematically illustrating a configuration example of a pixel 100e being a fifth modification of the pixel 100. Note that FIG. 12 schematically illustrates a cross section of the pixel 100e in A-A' direction of FIG. 5. Furthermore, note that in the figure, portions corresponding to those in FIGS. 9 and 11 are denoted by the same reference numerals.

The pixel 100e is different from the pixel 100d of FIG. 11 in that the light shielding film 172 surrounding the side surface of the N type semiconductor region 159 is provided similarly to the pixel 100b of FIG. 9. This light shielding film 172 can further reduce parasitic light incident on the charge storage unit 103 (N type semiconductor region 159) and can further reduce PLS.

Sixth Modification

Figure 13:
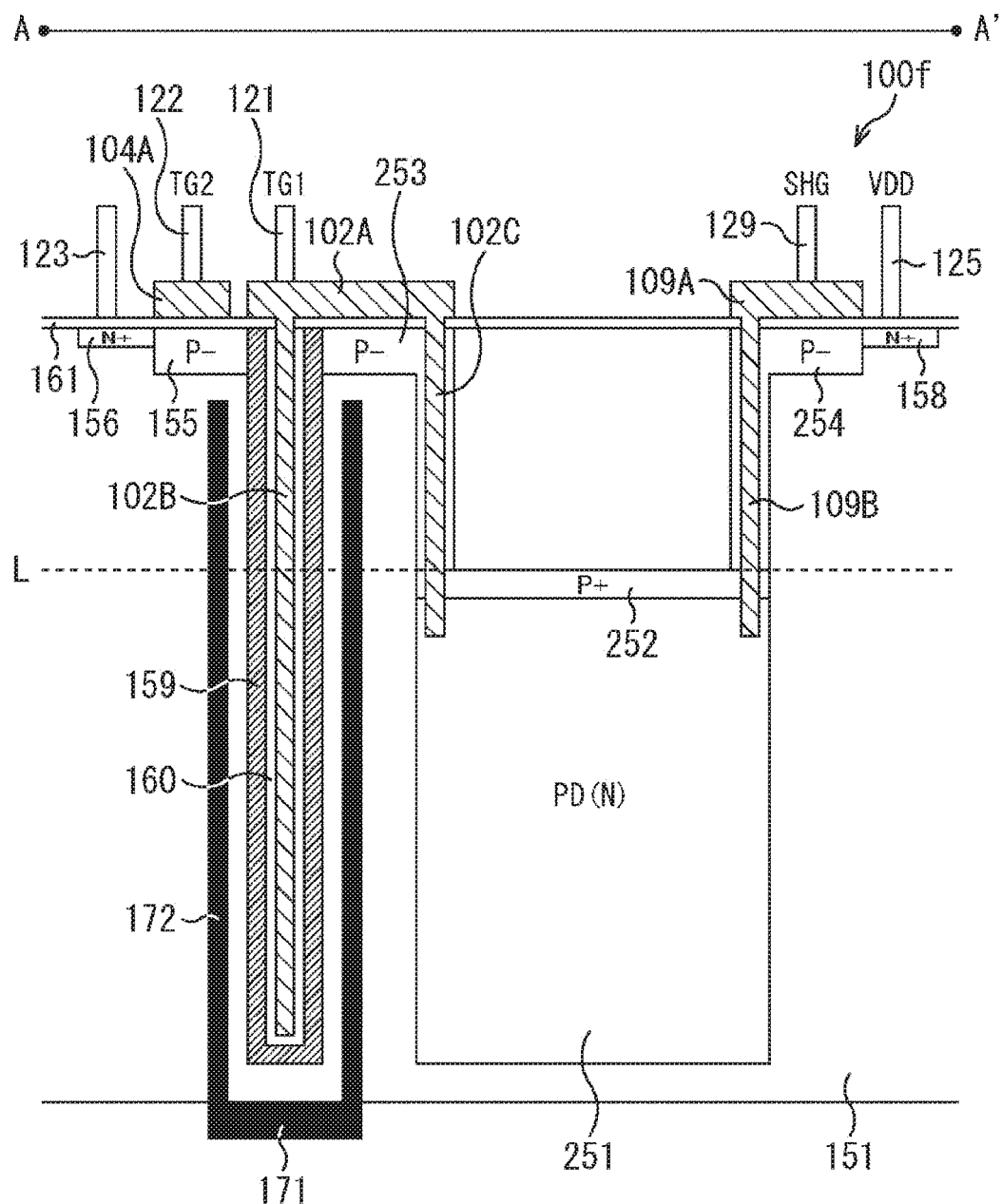
FIG. 13 is a cross-sectional view schematically illustrating a sixth modification of the unit pixel in the first embodiment of the present technology.

FIG. 13 is a cross-sectional view schematically illustrating a configuration example of a pixel 100f being a sixth modification of the pixel 100. Note that FIG. 13 schematically illustrates a cross section of the pixel 100f in A-A' direction of FIG. 5. Furthermore, note that in the figure, portions corresponding to those in FIG. 12 are denoted by the same reference numerals.

The pixel 100f is different from the pixel 100e of FIG. 12 in the configuration of the photoelectric conversion unit 101.

Specifically, the photoelectric conversion unit 101 in the pixel 100f includes the N type semiconductor region 251 and the P+ type semiconductor region 252.

The P+ type semiconductor region 252 is embedded at substantially the same depth as the P+ type semiconductor region 202 of the pixel 100e. Under the P+ type semiconductor region 252, the N type semiconductor region 152 is embedded. Note that the P+ type semiconductor region 252 is wider than the P+ type semiconductor region 202 of the pixel 100e and covers the entire upper surface of the N type semiconductor region 251.

As compared with the P− type semiconductor region 154 of the pixel 100e, the P− type semiconductor region 253 spreads in the right direction and overlaps with the left end portion of the P+ type semiconductor region 252 in the vertical direction. The right end portion of the P− type semiconductor region 253 extends downward, so as to be in contact with the left end portion of the upper surface of the P+ type semiconductor region 252.

Furthermore, a gate electrode 102C extends downward from the vicinity of the right end of the lower surface of the gate electrode 102A of the memory transfer gate unit 102 so as to penetrate a portion of the P− type semiconductor region 253 extending downward. The gate electrode 102C penetrates the P+ type semiconductor region 252 so as to allow its tip to reach the inside of the N type semiconductor region 251.

In this manner, the gate electrode 102C of the memory transfer gate unit 102 is formed into the shape of a trench and inserted into the N type semiconductor region 251, making it possible to efficiently transfer the charge stored in the N type semiconductor region 251 to the charge storage unit 103 (N type semiconductor region 159) via the memory transfer gate unit 102.

As compared with the P− type semiconductor region 157 of the pixel 100e, the P− type semiconductor region 254 spreads in the left direction and overlaps with the right end portion of the P+ type semiconductor region 252 in the vertical direction. The left end portion of the P− type semiconductor region 254 extends downward, so as to be in contact with the right end portion of the upper surface of the P+ type semiconductor region 252.

Furthermore, a gate electrode 109B extends downward from the vicinity of the left end of the lower surface of the gate electrode 109A of the charge discharging gate unit 109 so as to penetrate a portion of the P− type semiconductor region 254 extending downward. The gate electrode 109B penetrates the P+ type semiconductor region 252 so as to allow its tip to reach the inside of the N type semiconductor region 251.

In this manner, the gate electrode 109B of the charge discharging gate unit 109 is formed into the shape of a trench and inserted into the N type semiconductor region 251, making it possible to efficiently transfer the charge stored in the N type semiconductor region 251 to the N+ type semiconductor region 158 (power supply VDD) via the charge discharging gate unit 109.

Note that the capacitance of the charge storage unit 103 is increased and PLS is reduced in the pixel 100f, similarly to the pixel 100e. Furthermore, a vacant region is formed between the front surface of the semiconductor substrate 151 and the P+ type semiconductor region 252, leading to an increase in the degree of freedom of the pixel layout.

Note that, for example, in the pixel 100c in FIG. 10 and the pixel 100d in FIG. 11, the configuration around the photoelectric conversion unit 101 can be set similar to that of the pixel 100f.

Seventh Modification

Figure 14:
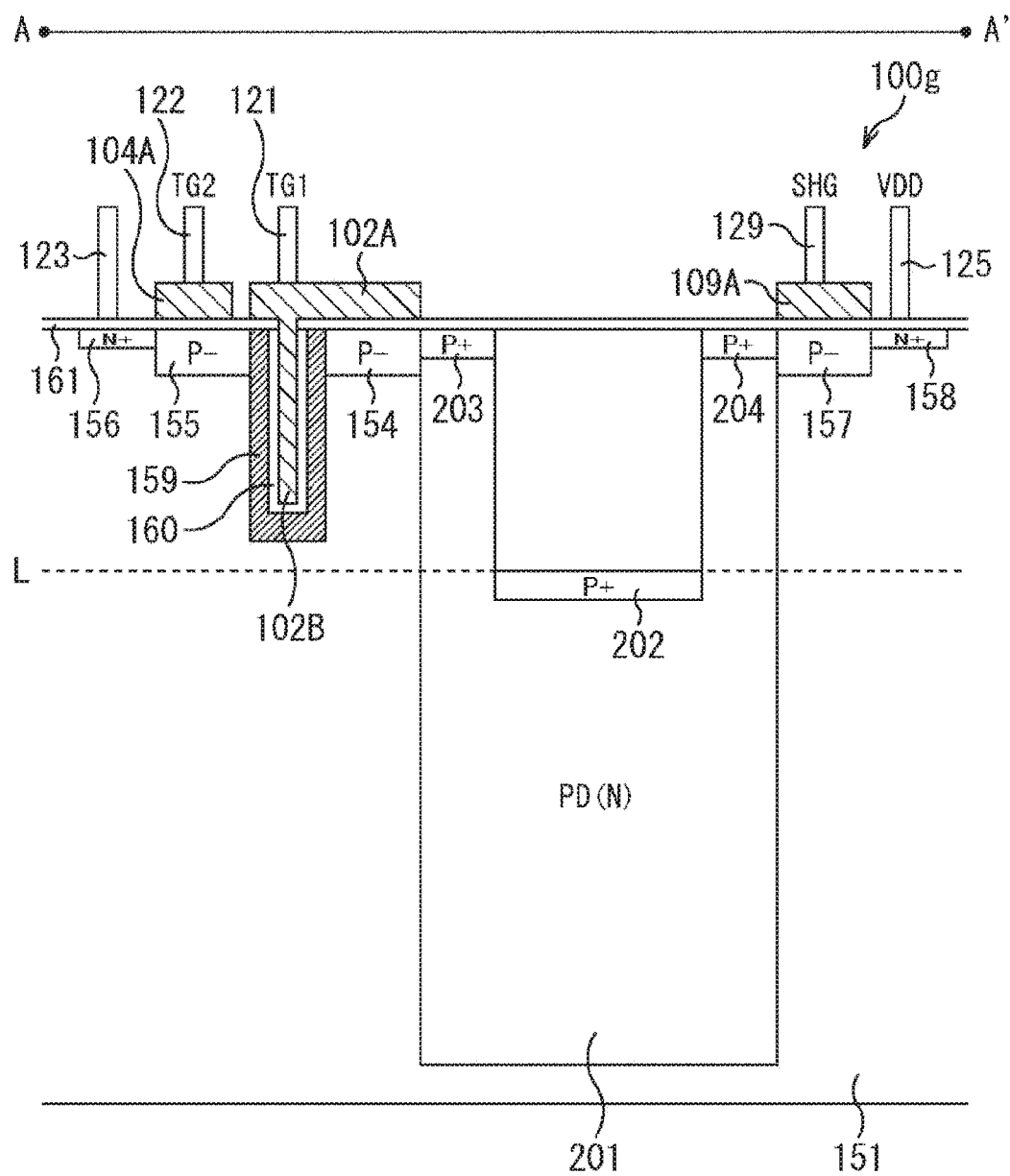
FIG. 14 is a cross-sectional view schematically illustrating a seventh modification of the unit pixel in the first embodiment of the present technology.

FIG. 14 is a cross-sectional view schematically illustrating a configuration example of a pixel 100g being a seventh modification of the pixel 100. Note that FIG. 14 schematically illustrates a cross section of the pixel 100g in A-A' direction of FIG. 5. Furthermore, note that in the figure, portions corresponding to those in FIG. 10 are denoted by the same reference numerals.

The pixel 100g is different from the pixel 100c of FIG. 10 in that the length of the charge storage unit 103 is shorter in the depth direction. Specifically, in the pixel 100g, the lower ends of the gate electrode 102B, the N type semiconductor region 159, and the insulating film 160 are disposed above the auxiliary line L in the semiconductor substrate 151. That is, in the pixel 100g, the charge storage unit 103 is formed in the region above the auxiliary line L of the semiconductor substrate 151, and the bottom surface of the charge storage unit 103 (N type semiconductor region 159) is arranged at a position closer to the front surface of the semiconductor substrate 151 above the upper surface of the photoelectric conversion unit 101 (P+ type semiconductor region 202).

With this configuration, the distance from the incident surface of the semiconductor substrate 151 to the N type semiconductor region 159 is increased, making it possible to suppress transmission of light incident on the semiconductor substrate 151 to the N type semiconductor region 159. Therefore, it is possible to reduce parasitic light incident on the charge storage unit 103 (N type semiconductor region 159) and reduce PLS even without the use of the light shielding film.

Eighth Modification

Figure 15:
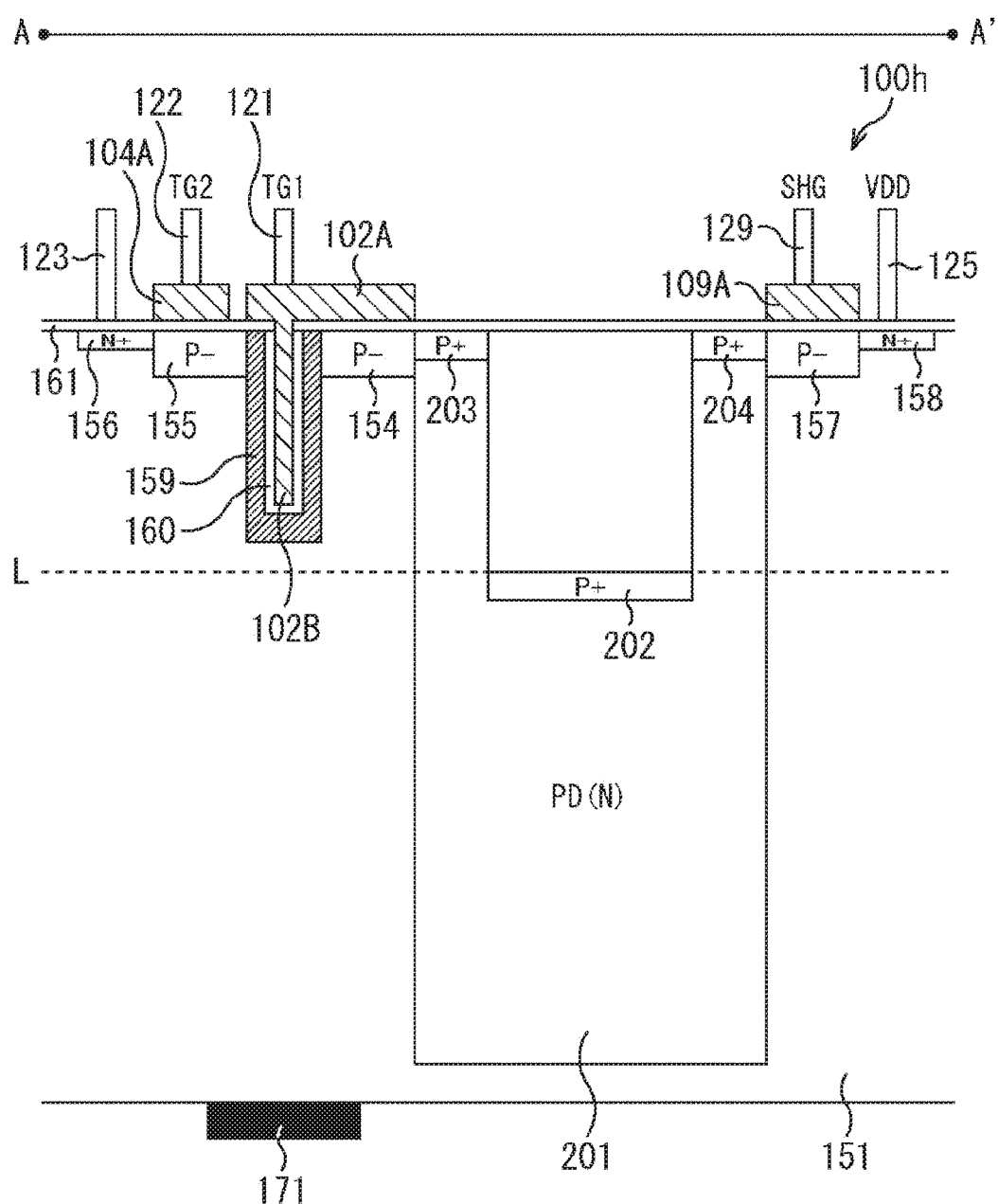
FIG. 15 is a cross-sectional view schematically illustrating an eighth modification of the unit pixel in the first embodiment of the present technology.

FIG. 15 is a cross-sectional view schematically illustrating a configuration example of a pixel 100h being an eighth modification of the pixel 100. Note that FIG. 15 schematically illustrates a cross section of the pixel 100h in A-A' direction of FIG. 5. Furthermore, note that in the figure, portions corresponding to those in FIGS. 11 and 14 are denoted by the same reference numerals.

The pixel 100h is different from the pixel 100g of FIG. 14 in that the light shielding film 171 for shielding light incident on the N type semiconductor region 159 is provided on the incident surface of the semiconductor substrate 151, similarly to the pixel 100d of FIG. 11. This light shielding film 171 can reduce parasitic light incident on the charge storage unit 103 (N type semiconductor region 159) and can reduce PLS.

Ninth Modification

Figure 16:
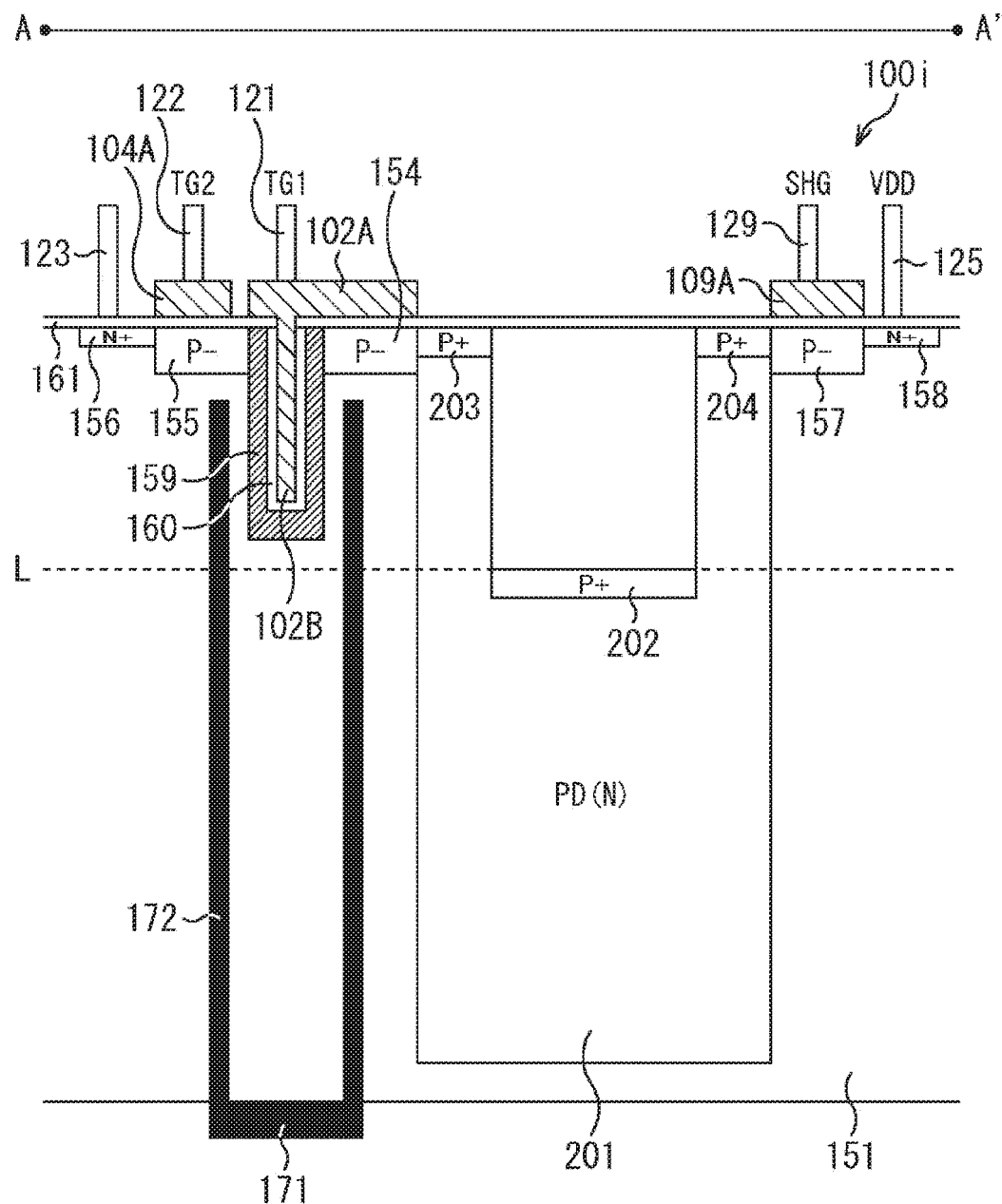
FIG. 16 is a cross-sectional view schematically illustrating a ninth modification of the unit pixel in the first embodiment of the present technology.

FIG. 16 is a cross-sectional view schematically illustrating a configuration example of a pixel 100i being a ninth modification of the pixel 100. Note that FIG. 16 schematically illustrates a cross section of the pixel 100i in A-A' direction of FIG. 5. Furthermore, note that in the figure, portions corresponding to those in FIGS. 12 and 15 are denoted by the same reference numerals.

The pixel 100i is different from the pixel 100j of FIG. 15 in that the light shielding film 172 surrounding the side surface of the N type semiconductor region 159 is provided similarly to the pixel 100e of FIG. 12. This light shielding film 172 can further reduce parasitic light incident on the charge storage unit 103 (N type semiconductor region 159) and can further reduce PLS.

Tenth Modification

Figure 17:
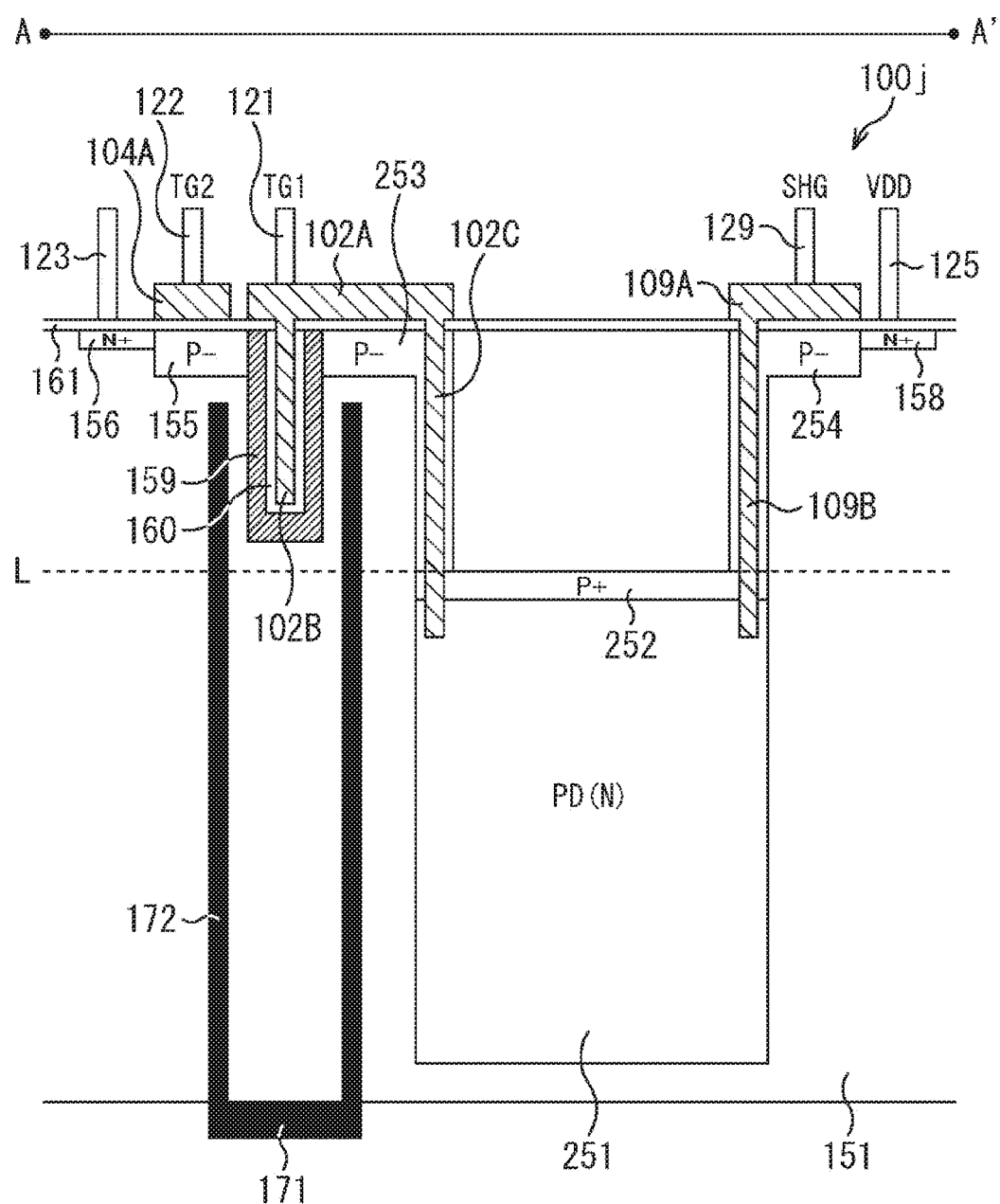
FIG. 17 is a cross-sectional view schematically illustrating a tenth modification of the unit pixel in the first embodiment of the present technology.

FIG. 17 is a cross-sectional view schematically illustrating a configuration example of a pixel 100j which is a tenth modification of the pixel 100. Note that FIG. 17 schematically illustrates a cross section of the pixel 100j in A-A' direction of FIG. 5. Furthermore, note that in the figure, portions corresponding to those in FIG. 13 are denoted by the same reference numerals.

The pixel 100j is different from the pixel 100i in FIG. 16 in that the configuration around the photoelectric conversion unit 101 is similar to the configuration of the photoelectric conversion unit 100f in FIG. 13.

Note that, for example, in the pixel 100g in FIG. 14 and the pixel 100h in FIG. 15, the configuration around the photoelectric conversion unit 101 can be set similar to that of the pixel 100j.

Eleventh Modification

Figure 18:
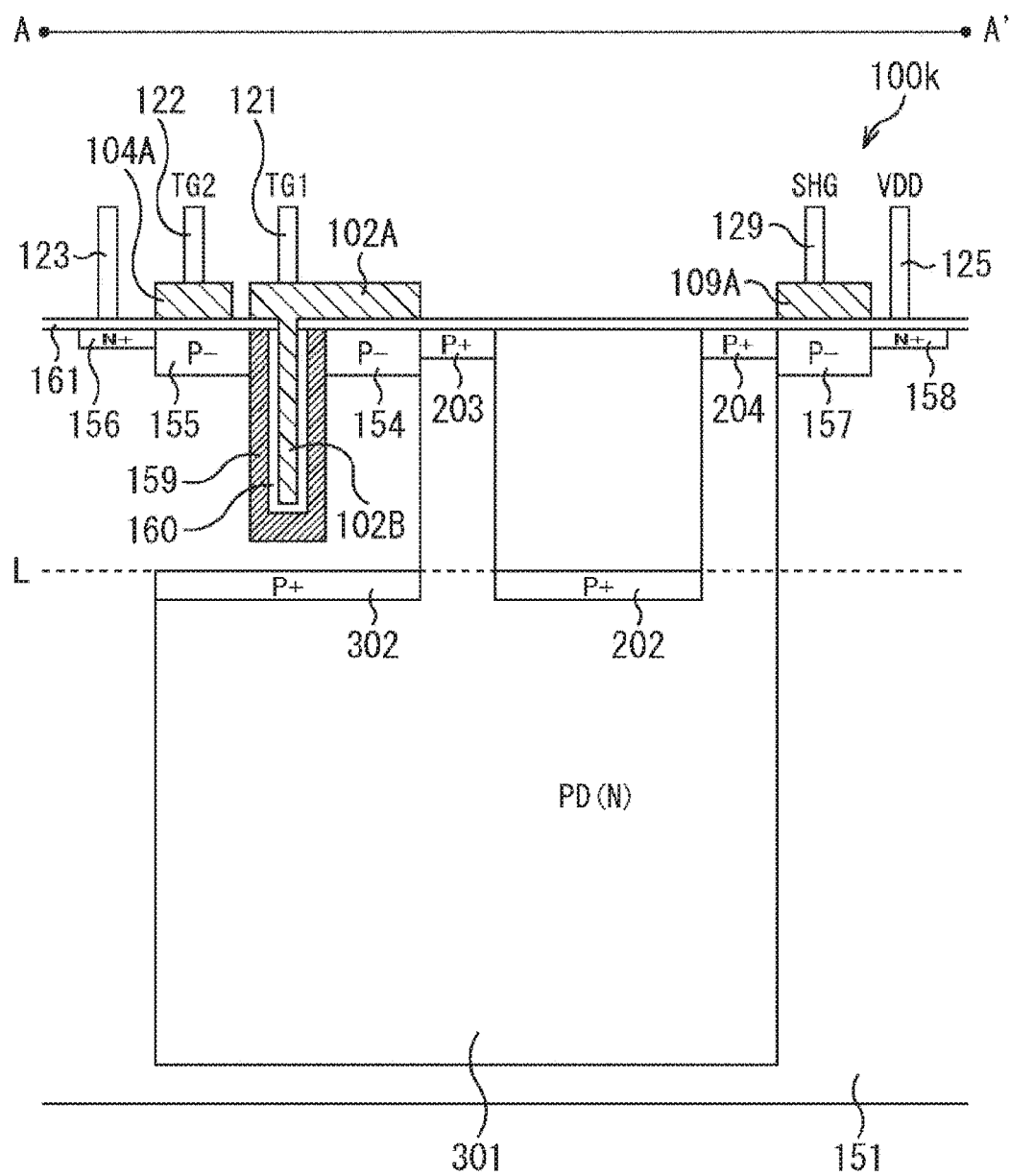
FIG. 18 is a cross-sectional view schematically illustrating an eleventh modification of the unit pixel in the first embodiment of the present technology.

FIG. 18 is a cross-sectional view schematically illustrating a configuration example of a pixel 100k being an eleventh modification of the pixel 100. Note that FIG. 18 schematically illustrates a cross section of the pixel 100k in A-A' direction of FIG. 5. Furthermore, note that in the figure, portions corresponding to those in FIG. 14 are denoted by the same reference numerals.

The pixel 100k is different from the pixel 100g of FIG. 14 in the configuration of the photoelectric conversion unit 101.

Specifically, an N type semiconductor region 301 constituting the photoelectric conversion unit 101 extends to the lower side of the charge storage unit 103. That is, the N type semiconductor region 301 extends in the horizontal direction to the vicinity of the left end of the gate electrode 104A in a region below the auxiliary line L as compared to the N type semiconductor region 201 of the pixel 100g in FIG. 14. Furthermore, on an upper surface of a region of the N type semiconductor region 301, which is wider than the N type semiconductor region 201, a P+ type semiconductor region 302 is formed. Accordingly, the gate electrode 102B constituting the charge storage unit 103, the N type semiconductor region 159, and the insulating film 160 are arranged between the front surface of the semiconductor substrate 151 and the upper surface of the photoelectric conversion unit 101 (P+ type semiconductor region 302).

With this configuration, light incident in the direction of the N type semiconductor region 159 from the incident surface of the semiconductor substrate 151 is first photoelectrically converted by the photoelectric conversion unit 101, making it possible to suppress light incidence to the N type semiconductor region 159 without providing a light shielding film.

Furthermore, the light receiving area of the photoelectric conversion unit 101 (N type semiconductor region 301) can be increased, leading to improvement of the sensitivity.

Note that, for example, depending on the thickness of the N type semiconductor region 301, light having a long wavelength such as infrared light might reach the N type semiconductor region 159 without being absorbed by the N type semiconductor region 301. To overcome this, for example, by providing an infrared cut-off filter in an optical system (not illustrated) disposed on the subject side with respect to the incident surface of the semiconductor substrate 151, it is possible to prevent incidence of light having a long wavelength such as infrared light onto the semiconductor substrate 151.

Twelfth Modification

Figure 19:
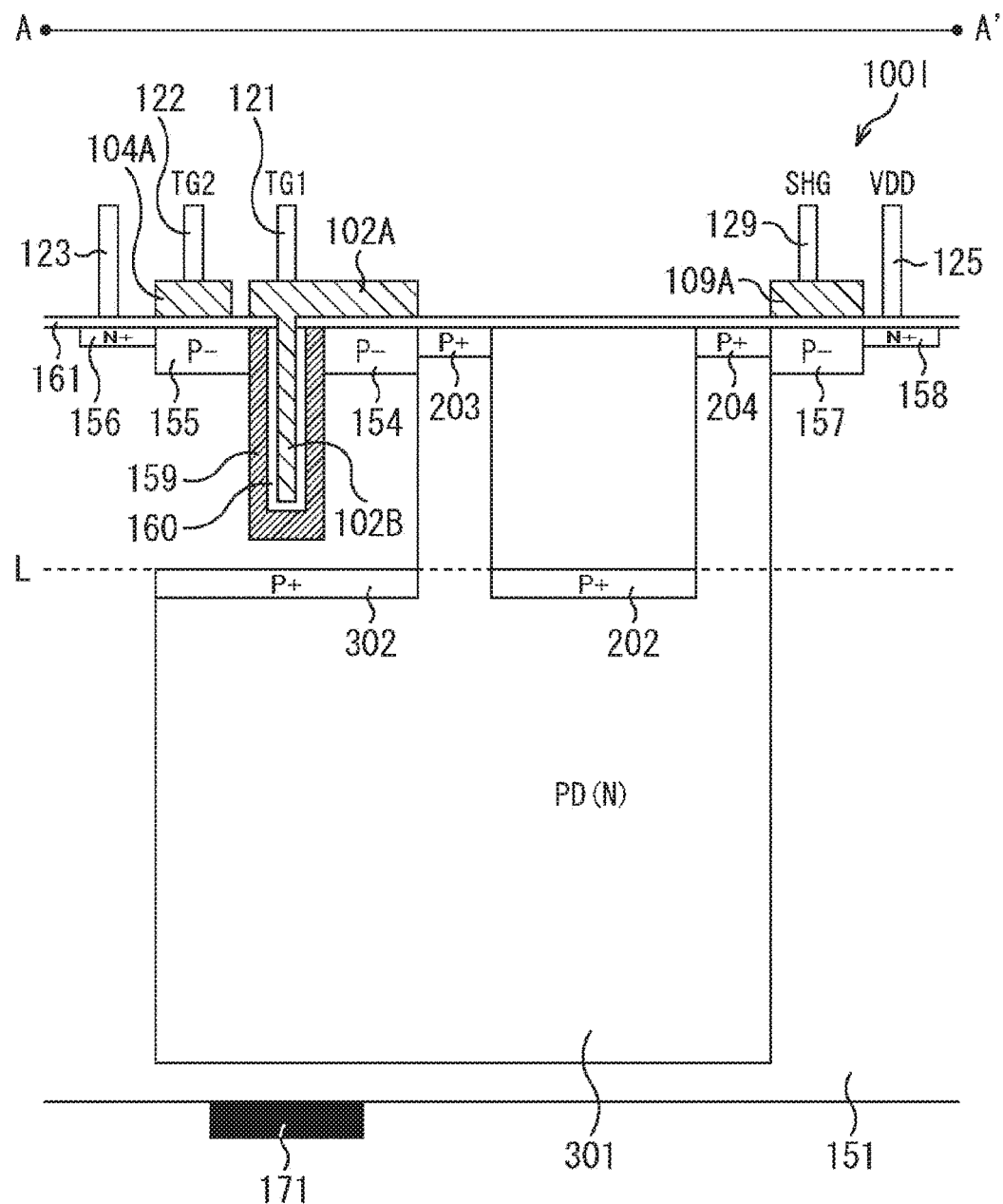
FIG. 19 is a cross-sectional view schematically illustrating a twelfth modification of the unit pixel in the first embodiment of the present technology.

FIG. 19 is a cross-sectional view schematically illustrating a configuration example of a pixel 100l being a twelfth modification of the pixel 100. Note that FIG. 19 schematically illustrates a cross section of the pixel 100l in A-A' direction of FIG. 5. Furthermore, note that in the figure, portions corresponding to those in FIGS. 15 and 18 are denoted by the same reference numerals.

The pixel 100l is different from the pixel 100k of FIG. 18 in that the light shielding film 171 for shielding light incident on the N type semiconductor region 159 is provided on the incident surface of the semiconductor substrate 151, similarly to the pixel 100h of FIG. 15. This light shielding film 171 can reduce parasitic light incident on the charge storage unit 103 (N type semiconductor region 159) and can reduce PLS.

Thirteenth Modification

Figure 20:
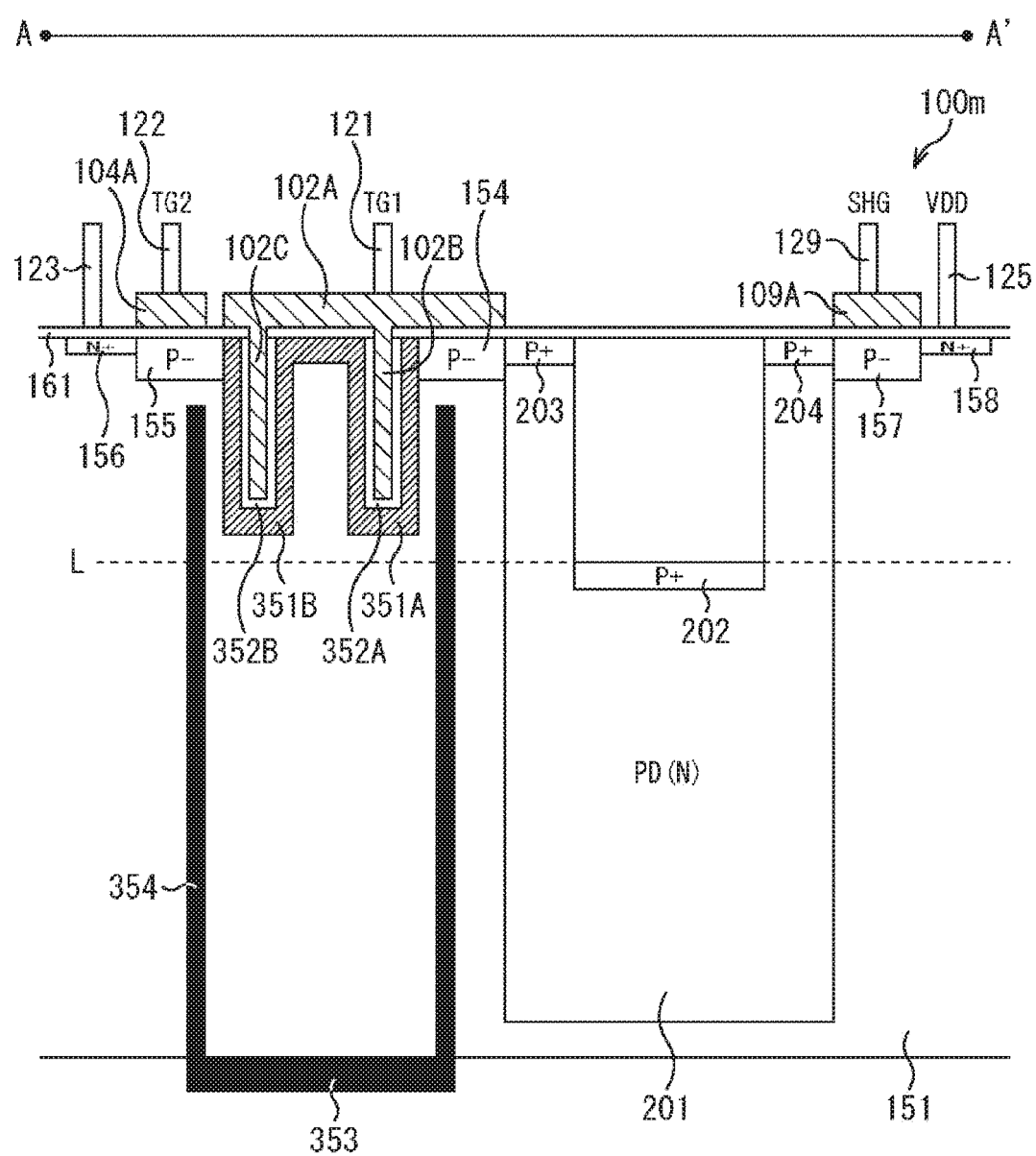
FIG. 20 is a cross-sectional view schematically illustrating a thirteenth modification of the unit pixel in the first embodiment of the present technology.

FIG. 20 is a cross-sectional view schematically illustrating a configuration example of a pixel 100m which is a thirteenth modification of the pixel 100. Note that FIG. 20 schematically illustrates a cross section of the pixel 100m in A-A' direction of FIG. 5. Furthermore, note that in the figure, portions corresponding to those in FIG. 16 are denoted by the same reference numerals.

The pixel 100m is different from the pixel 100i in FIG. 16 in that the photoelectric conversion unit 101 includes a plurality of capacitors.

Specifically, in the pixel 100m, the gate electrode 102B and the gate electrode 102C extend downward to the vicinity of the auxiliary line L at an interval from the lower surface of the gate electrode 102A.

The periphery of the gate electrode 102B is covered with an N type semiconductor region 351A serving as a counter electrode via an insulating film 352A. The bottom surface of the N type semiconductor region 351A is disposed above the auxiliary line L. The gate electrode 102B, the N type semiconductor region 351A, and the insulating film 352A constitute a first trench type capacitor.

The periphery of the gate electrode 102C is covered with an N type semiconductor region 351B serving as a counter electrode via an insulating film 352B. The bottom surface of the N type semiconductor region 351B is disposed above the auxiliary line L, similarly to the bottom surface of the N type semiconductor region 351A. The N type semiconductor region 351A and the N type semiconductor region 351B are connected in the vicinity of the front surface of the semiconductor substrate 151. The gate electrode 102C, the N type semiconductor region 351B, and the insulating film 352B constitute a second trench capacitor.

Additionally, the first capacitor and the second capacitor constitute the charge storage unit 103.

Furthermore, a light shielding film 353 is disposed on the incident surface of the semiconductor substrate 151 so as to cover at least the entire bottom surfaces of the N type semiconductor region 351A and the N type semiconductor region 351B. Note that it is desirable that the area of the light shielding film 353 be as wide as possible within a range not blocking the light incident on the photoelectric conversion unit 101 (N type semiconductor region 201).

Furthermore, the light shielding film 354 extends upward from the outer peripheral portion of the upper surface of the light shielding film 353, and surrounds the portions of the N type semiconductor region 351A and the N type semiconductor region 351B except the upper end portions of the side surfaces. Accordingly, the light shielding film 353 and the light shielding film 354 cover the side surface except the upper end portion, and the bottom surface, of the N type semiconductor region 351A and the N type semiconductor region 351B. This configuration can reduce parasitic light incident on the charge storage unit 103 (N type semiconductor region 351A and N type semiconductor region 351B) and can reduce PLS.

In this manner, by configuring the charge storage unit 103 with a plurality of capacitors, it is possible to increase the capacitance of the charge storage unit 103.

Note that the number of capacitors constituting the charge storage unit 103 may be three or more. However, note that when the number of capacitors is increased, the area occupied by the charge storage unit 103 would be increased and the light receiving area of the photoelectric conversion unit 101 would be reduced.

Furthermore, each of capacitors may be formed to a position deeper than the auxiliary line L, as illustrated by the pixel 100c of FIG. 10, for example. With this configuration, it is possible to further increase the capacitance of the charge storage unit 103.

Moreover, it is also possible to delete the light shielding film 354 or delete both the light shielding film 353 and the light shielding film 354, for example.

3. Second Embodiment

Next, a second embodiment of the present technology will be described with reference to FIGS. 21 to 24.

The second embodiment is different from the first embodiment in the configuration of the pixels provided in the pixel array unit 11 of FIGS. 1 to 3.

[Circuit Configuration of Pixel 500]

Figure 21:
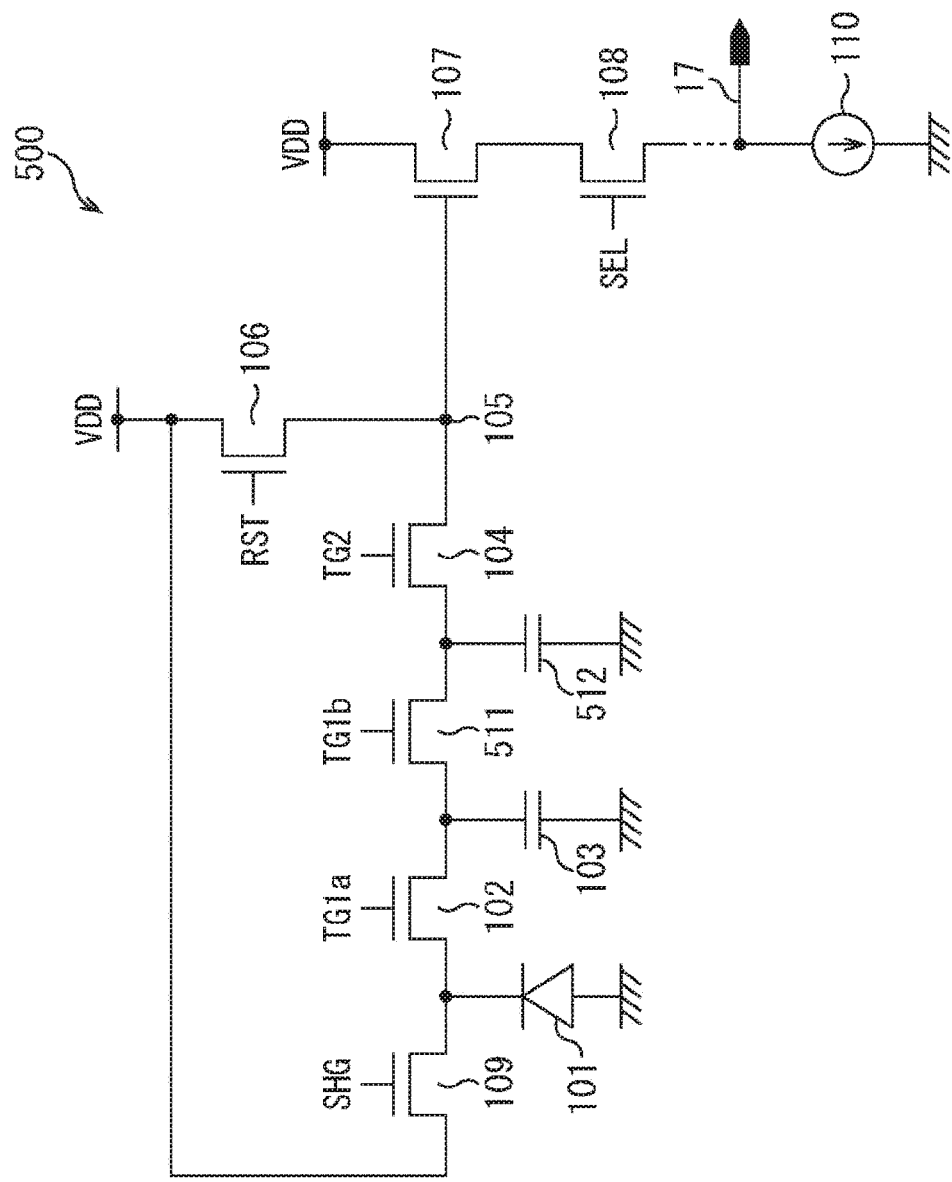
FIG. 21 is a circuit diagram illustrating a configuration example of a unit pixel according to a second embodiment of the present technology.

FIG. 21 is a circuit diagram illustrating a configuration example of the pixel 500 arranged in the pixel array unit 11 of FIGS. 1 to 3 in the second embodiment of the present technology. Note that in the figure, portions corresponding to those in FIG. 4 are denoted by the same reference numerals.

The pixel 500 is different from the pixel 100 of FIG. 4 in that a second memory transfer gate unit 511 and a second charge storage unit 512 have been added.

Note that hereinafter, the memory transfer gate unit 102 will be referred to as a first memory transfer gate unit 102 in order to distinguish it from the second memory transfer gate unit 511. Furthermore, note that hereinafter, the charge storage unit 103 will be referred to as a first charge storage unit 103 in order to distinguish it from the second charge storage unit 512.

The second memory transfer gate unit 511 is disposed between the first charge storage unit 103 and the second charge storage unit 512. The second charge storage unit 512 is connected between the second memory transfer gate unit 511 and the FD transfer gate unit 104.

A drive signal TG1*b* is supplied to the gate electrode of the second memory transfer gate unit 511 from the vertical drive unit 12 of FIG. 1 via the signal line. When the drive signal TG1*b* is turned on, the second memory transfer gate unit 511 becomes conductive, and the charge stored in the first charge storage unit 103 is transferred to the second charge storage unit 512 via the second memory transfer gate unit 511.

The second charge storage unit 512 includes a capacitor, for example, and temporarily stores the charge transferred from the first charge storage unit 103.

Note that the drive signal TG1 applied to the gate electrode of first memory transfer gate unit 102 will be referred to as a drive signal TG1*a* in order to distinguish it from the drive signal TG1*b* applied to the gate electrode of second memory transfer gate unit 511.

Figure 22:
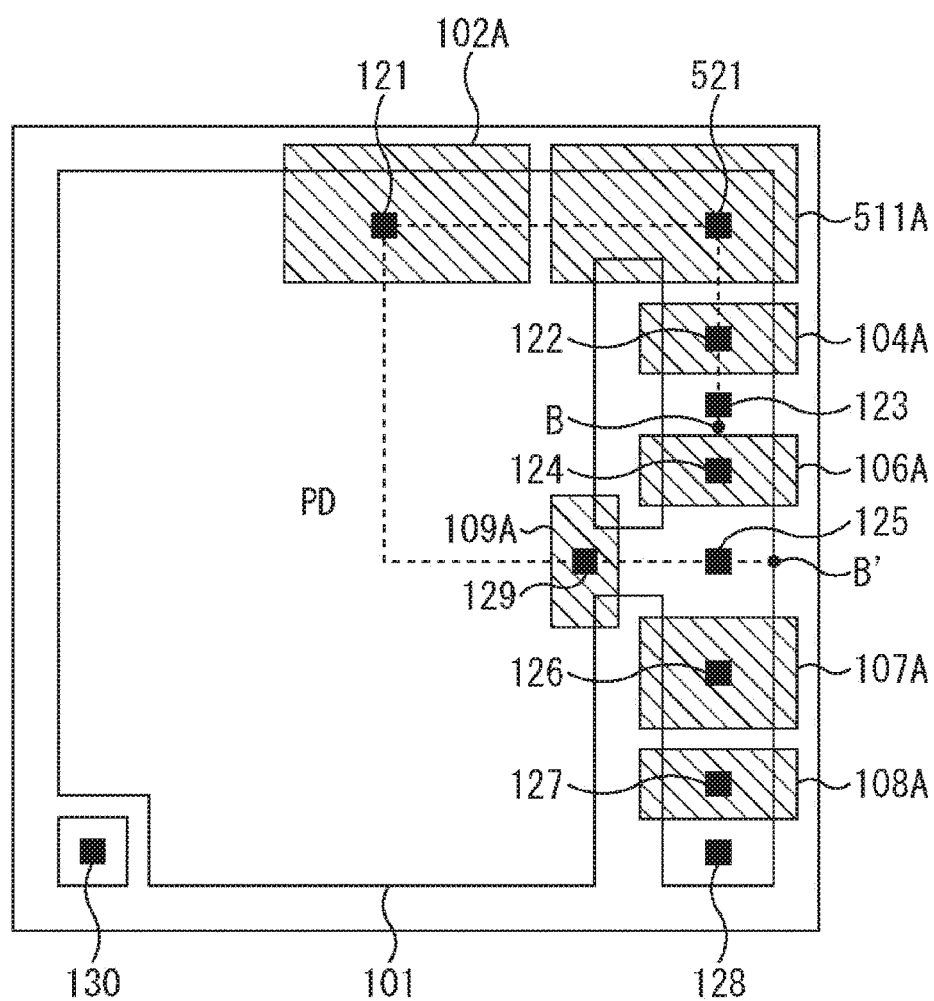
FIG. 22 is a plan view schematically illustrating a configuration example of the unit pixel of FIG. 21.
Figure 23:
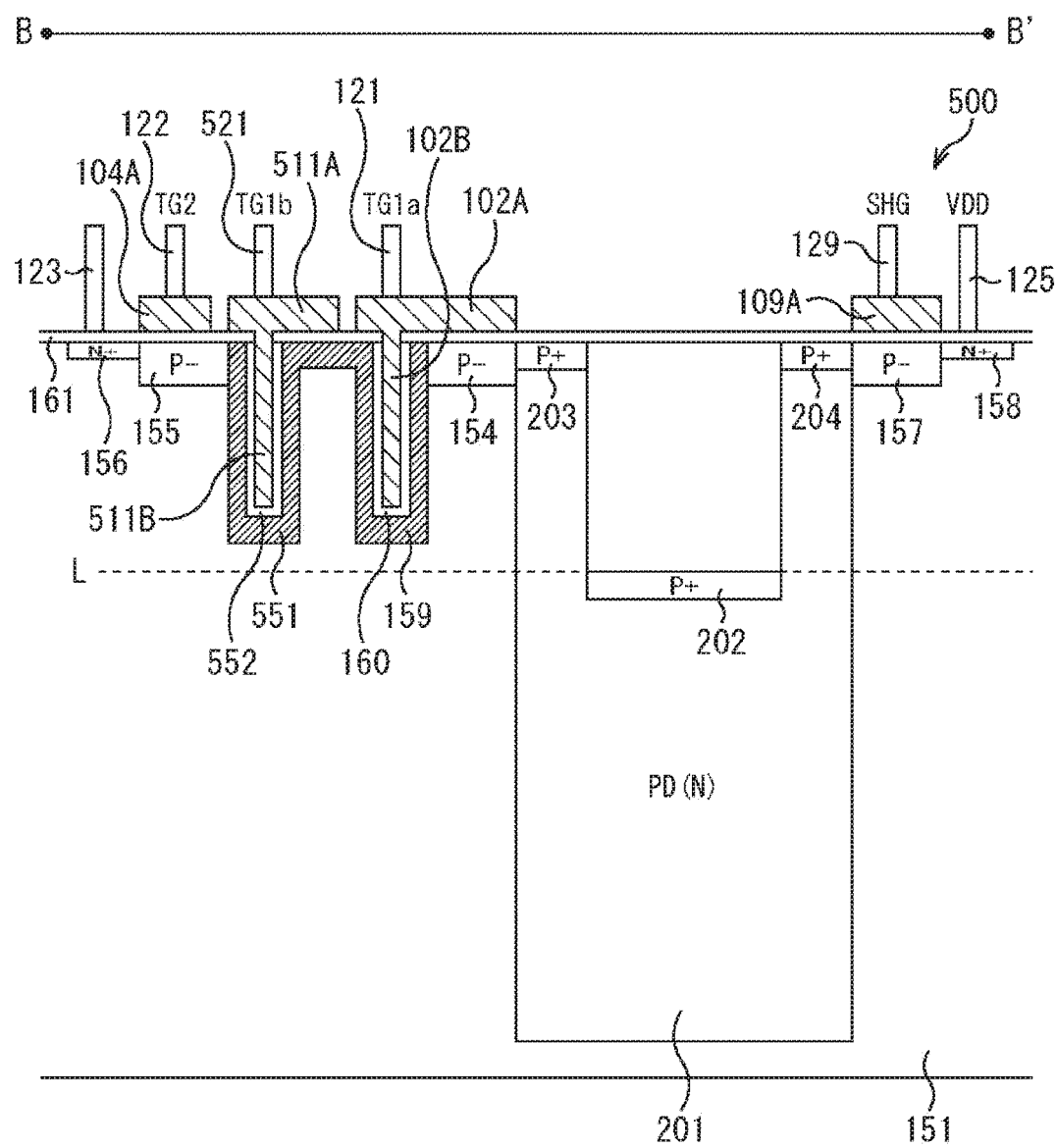
FIG. 23 is a cross-sectional view schematically illustrating a configuration example of the unit pixel of FIG. 21.

Next, a configuration example of the pixel 500 will be described with reference to FIGS. 22 and 23. FIG. 22 is a plan view schematically illustrating a configuration example of the pixel 500. Note that FIG. 22 omits illustration of wiring layers. Furthermore, note that in the figure, portions corresponding to those in FIG. 5 are denoted by the same reference numerals. FIG. 23 schematically illustrates a cross section of the pixel 500 in B-B' direction of FIG. 22. Note that in the figure, portions corresponding to those in FIG. 14 are denoted by the same reference numerals.

First, the arrangement of the pixels 500 in the horizontal direction will be mainly described with reference to FIG. 22.

The pixel 500 is different from the pixel 100 of FIG. 5 in the positions of the gate electrode 102A of the first memory transfer gate unit 102 and the contact 121, and in that a gate electrode 511A of the second memory transfer gate unit 511 and a contact 521 have been added.

The gate electrode 511A and the contact 521 are arranged at the same position as the gate electrode 102A and the contact 121 of the pixel 100 in FIG. 5.

The gate electrode 102A is disposed to be aligned with the left side in the drawing of the gate electrode 511A. The contact 121 is connected to the upper surface of the gate electrode 102A.

Next, arrangement of the pixels 500 in the vertical direction in the B-B' direction of FIG. 22 will be mainly described with reference to FIG. 23.

The pixel 500 is different from the pixel 100g in FIG. 14 in that the gate electrode 511A, a gate electrode 511B, the contact 521, an N type semiconductor region 551, and an insulating film 552 have been added.

The gate electrode 511A is disposed on the front surface of the semiconductor substrate 151 via the insulating film 161 between the gate electrode 102A and the gate electrode 104A. The contact 521 is connected to the upper surface of the gate electrode 511A.

Furthermore, the gate electrode 511B extends vertically downward in the semiconductor substrate 151 from the lower surface of the gate electrode 511A. The gate electrode 511B is formed to substantially the same depth as the gate electrode 102B. The periphery of the gate electrode 511B is covered with the N type semiconductor region 551 serving as a counter electrode via the insulating film 552. The N type semiconductor region 159 and the N type semiconductor region 551 are connected in the vicinity of the front surface of the semiconductor substrate 151. The insulating film 552 is formed of the same material as the insulating film 160, for example.

The gate electrode 511B, the N type semiconductor region 551, and the insulating film 552 constitute the charge storage unit 512 being a trench capacitor.

In the pixel 500, similarly to the pixel 100g in FIG. 14, the distance from the incident surface of the semiconductor substrate 151 to the N type semiconductor region 159 and the N type semiconductor region 551 is increased, making it possible to suppress transmission of light incident on the semiconductor substrate 151 to the N type semiconductor region 159 and N type semiconductor region 551. Therefore, it is possible to reduce parasitic light incident on the first charge storage unit 103 (N type semiconductor region 159) and the second charge storage unit 512 (N type semiconductor region 551) and reduce PLS even without the use of the light shielding film.

[Operation of Pixel 500]

Figure 24:
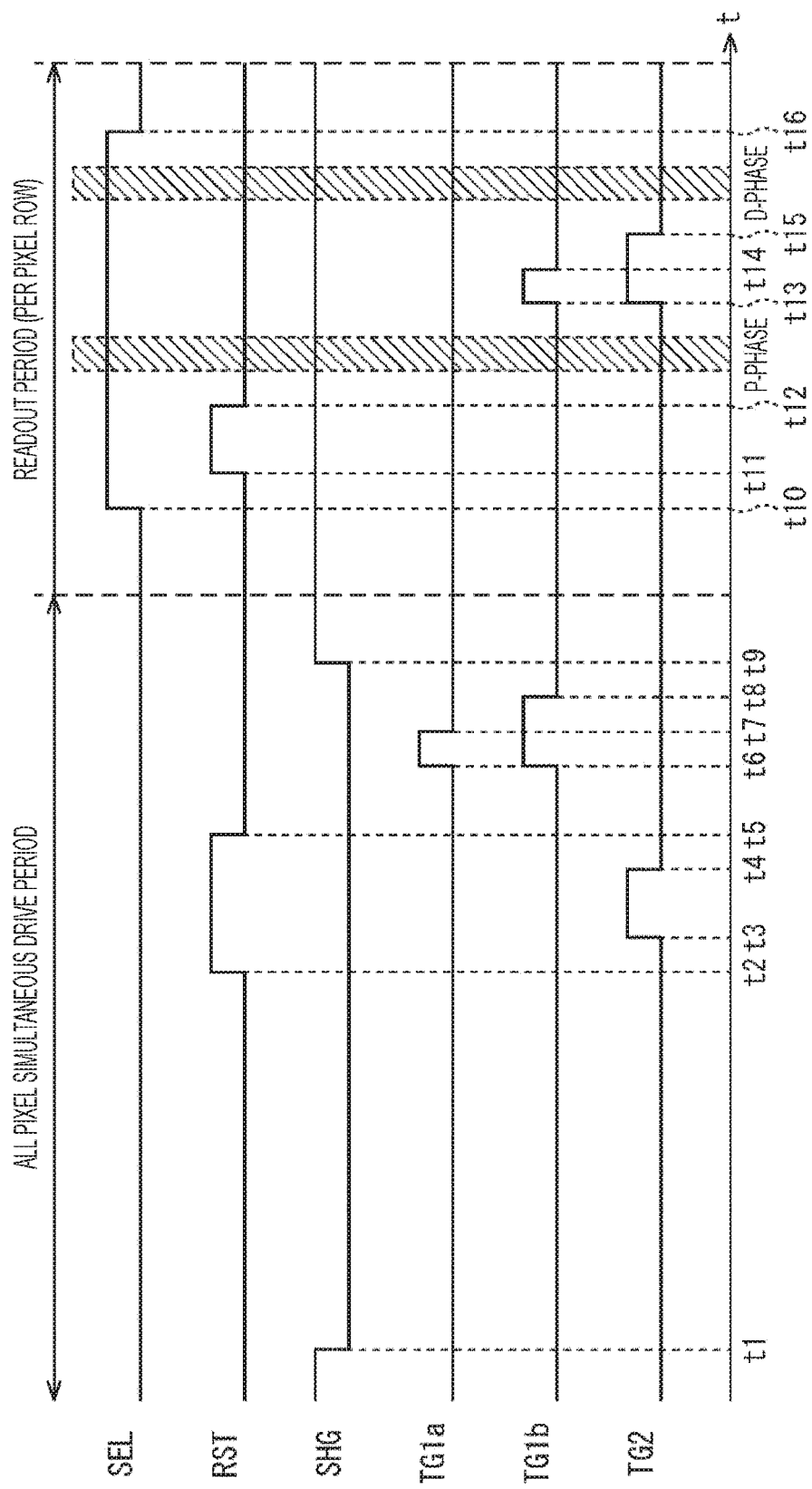
FIG. 24 is a timing chart illustrating operation of the unit pixel of FIG. 21.

Next, operation of the pixel 500 will be described with reference to the timing chart of FIG. 24. Note that FIG. 24 illustrates a timing chart of the drive signals SEL, RST, SHG, TG1a, TG1b, and TG2.

Note that processing in the exposure period from time t1 to time t9 is simultaneously executed for all pixels. The processing in the readout period from time t10 to time t16 is performed, for example, in a predetermined scanning order for each of pixel rows of the pixel array unit 11 or for each of a plurality of pixel rows.

Processing executed from time t1 to time t5 is similar to the processing from time t1 to t5 in FIG. 7.

At time t6, the drive signals TG1a and TG1b are turned on, and accordingly, the first memory transfer gate unit 102 and the second memory transfer gate unit 511 are turned on. With this operation, the exposure period is finished simultaneously for all pixels, and the charges stored in the photoelectric conversion unit 101 during the exposure period are transferred to the first charge storage unit 103 via the first memory transfer gate unit 102. Moreover, the charges transferred to the first charge storage unit 103 are transferred to the second charge storage unit 512 via the second memory transfer gate unit 511.

At time t7, the drive signal TG1a is turned off, and accordingly, the first memory transfer gate unit 102 is turned off. This operation completes the transfer of the charge from the photoelectric conversion unit 101 to the first charge storage unit 103.

At this time, the charges transferred from the photoelectric conversion unit 101 to the first charge storage unit 103 have been mostly transferred to the second charge storage unit 512, and are not left. Therefore, it is possible to suppress backflow of the charge from the first charge storage unit 103 to the photoelectric conversion unit 101 when the first memory transfer gate unit 102 is turned off.

At time t8, the drive signal TG1b is turned off, and accordingly, the second memory transfer gate unit 511 is turned off. This operation completes the transfer of the charge from the first charge storage unit 103 to the second charge storage unit 512.

Processing executed from time t9 to time t12 is similar to the processing from time t8 to t11 in FIG. 7.

Subsequently, between time t12 and time t13, a signal based on the potential of the FD unit 105 is read out via the amplification transistor 107, the selection transistor 108, and the vertical signal line 17. The signal read out at this time is a P-phase signal based on the potential in the state where the FD unit 105 is reset.

At time t13, the drive signals TG1b and TG2 are turned on, and accordingly, the second memory transfer gate unit 511 and the FD transfer gate unit 104 are turned on. With this operation, the charge stored in the first charge storage unit 103 is transferred to the second charge storage unit 512 via the second memory transfer gate unit 511. Moreover, the charge stored in the second charge storage unit 512 is transferred to the FD unit 105 via the FD transfer gate unit 104.

At time t14, the drive signal TG1b is turned off, and accordingly, the second memory transfer gate unit 511 is turned off. This operation completes the transfer of the charge from the first charge storage unit 103 to the second charge storage unit 512.

At this time, the charges transferred from the first charge storage unit 103 to the second charge storage unit 512 have been mostly transferred to the FD unit 105 and are not left. Therefore, it is possible to suppress backflow of the charge from the second charge storage unit 512 to the first charge storage unit 103 when the second memory transfer gate unit 511 is turned off.

At time t15, the drive signal TG2 is turned off, and accordingly, the FD transfer gate unit 104 is turned off. This operation stops transfer of the charge from the second charge storage unit 512 to the FD unit 105.

Subsequently, between time t15 and time t16, a signal based on the potential of the FD unit 105 is read out via the amplification transistor 107, the selection transistor 108, and the vertical signal line 17. The signal read out at this time is a D-phase signal based on the charge generated by the photoelectric conversion unit 101 during the exposure period.

Subsequently, for example, the column processing unit 13 performs DDS processing for calculating a difference between the D-phase signal and the P-phase signal of each of the pixels 500, so as to remove fixed pattern noise unique to each of the pixels 500.

At time t16, the drive signal SEL is turned off, and accordingly, the selection transistor 108 is turned off. This operation finishes the readout period of the pixel 500.

4. Modification of Second Embodiment

Next, modifications of the pixel 500 according to the second embodiment of the present technology will be described with reference to FIGS. 25 and 26.

First Modification

Figure 25:
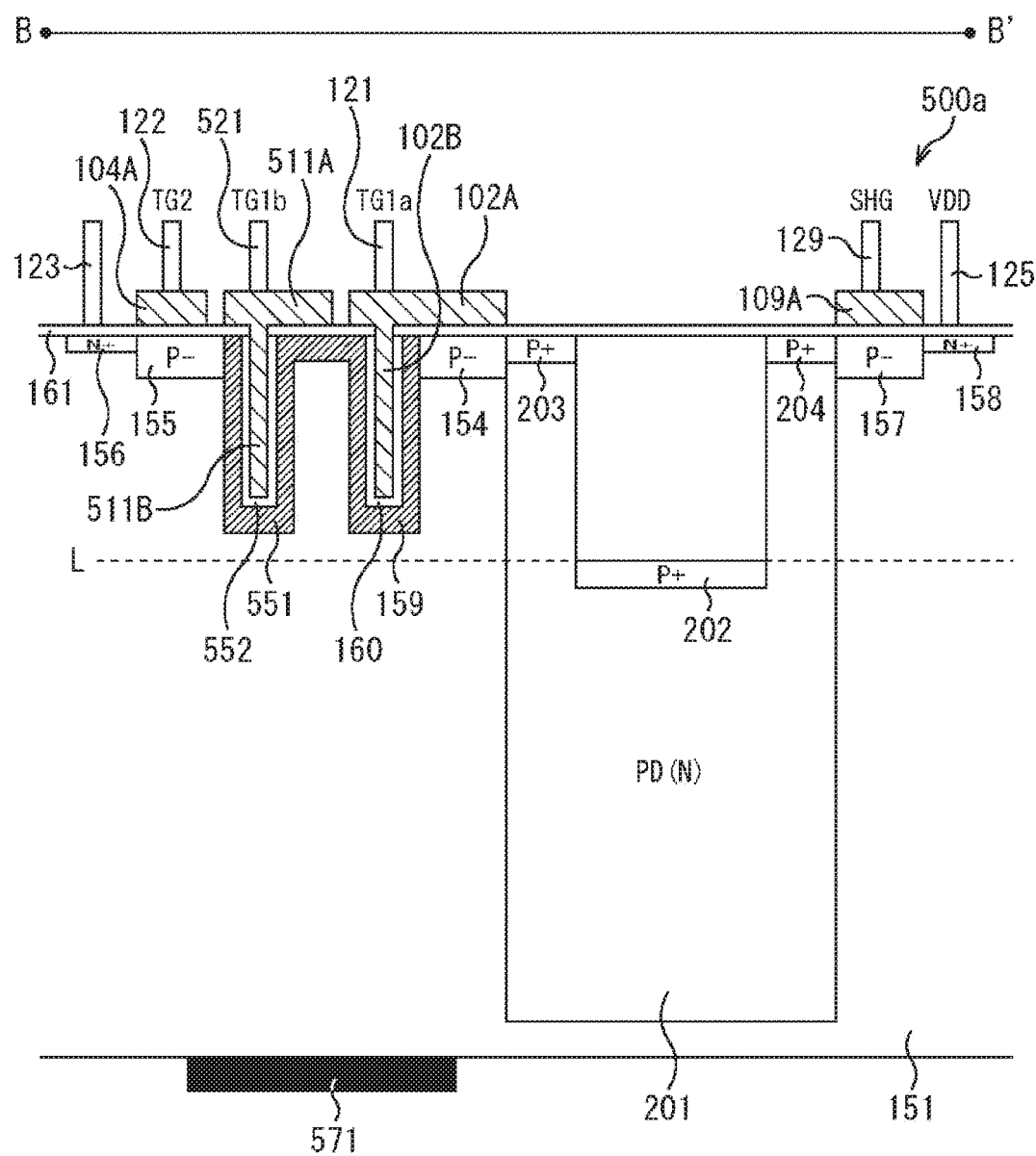
FIG. 25 is a cross-sectional view schematically illustrating a first modification of the unit pixel in the second embodiment of the present technology.

FIG. 25 is a cross-sectional view schematically illustrating a configuration example of a pixel 500a which is a first modification of the pixel 500. Note that FIG. 25 schematically illustrates a cross section of the pixel 500a in B-B' direction of FIG. 22. Furthermore, note that in the figure, portions corresponding to those in FIG. 23 are denoted by the same reference numerals.

The pixel 500a is different from the pixel 500 in FIG. 23 in that a light shielding film 571 is provided.

The light shielding film 571 is disposed on the incident surface of the semiconductor substrate 151 so as to cover at least the entire bottom surfaces of the N type semiconductor region 159 and the N type semiconductor region 551. The light shielding film 571 suppresses incident light from the incident surface of the pixel 500a (semiconductor substrate 151) from being incident on the first charge storage unit 103 (N type semiconductor region 159) and the second charge storage unit 512 (N type semiconductor region 551), and reduces PLS.

Note that it is desirable that the area of the light shielding film 171 be as wide as possible within a range not blocking the light incident on the photoelectric conversion unit 101 (N type semiconductor region 201).

Second Modification

Figure 26:
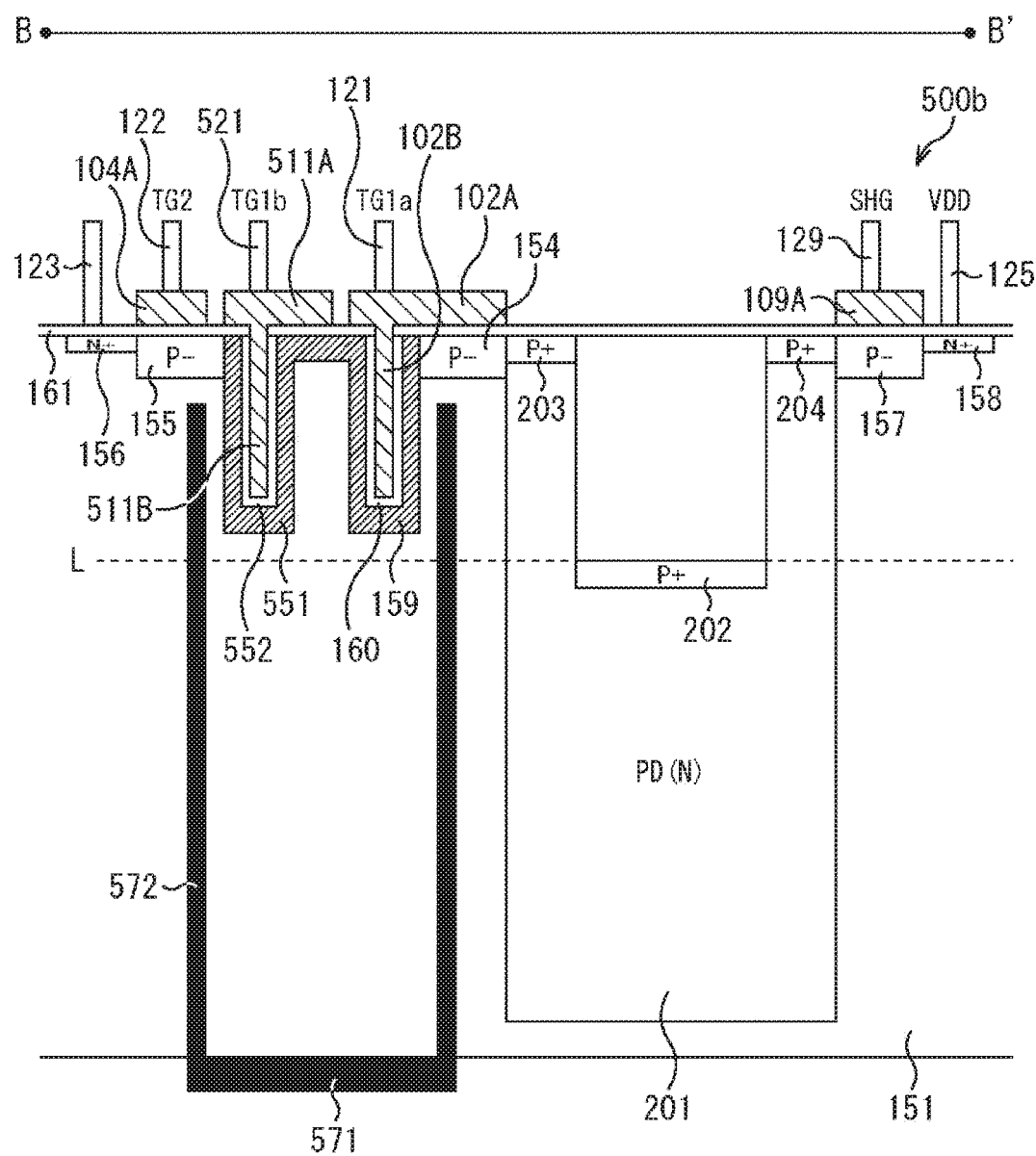
FIG. 26 is a cross-sectional view schematically illustrating a second modification of the unit pixel in the second embodiment of the present technology.

FIG. 26 is a cross-sectional view schematically illustrating a configuration example of a pixel 500*b* which is a second modification of the pixel 500. Note that FIG. 26 schematically illustrates a cross section of the pixel 500*b* in B-B' direction of FIG. 22. Furthermore, note that in the figure, portions corresponding to those in FIG. 25 are denoted by the same reference numerals.

The pixel 500*b* is different from the pixel 500*a* in FIG. 25 in that a light shielding film 572 is provided.

The light shielding film 572 is formed to extend upward from the outer peripheral portion of the upper surface of the light shielding film 571, and surrounds a portion except the upper end portion of the side surface of the N type semiconductor region 159 and the N type semiconductor region 551. Accordingly, the light shielding film 571 and the light shielding film 572 cover the side surface except the upper end portion, and the bottom surface, of the N type semiconductor region 159 and the N type semiconductor region 551. With this configuration, it is possible to further reduce parasitic light incident on the first charge storage unit 103 (N type semiconductor region 159) and the second charge storage unit 512 (N type semiconductor region 551) and further reduce PLS.

Other Modifications

For example, similarly to the pixel 100*m* in FIG. 20, the number of capacitors constituting each of the first charge storage unit 103 and the second charge storage unit 512 may be two or more.

Furthermore, each of capacitors may be formed to a position deeper than the auxiliary line L, as illustrated by the pixel 100*c* of FIG. 10, for example. With this configuration, it is possible to further increase the capacitance of the first charge storage unit 103 and the second charge storage unit 512.

5. Third Embodiment

Next, a third embodiment of the present technology will be described with reference to FIGS. 27 and 28. The third embodiment is different from the first embodiment in that the charge storage unit 103 is stacked above the photoelectric conversion units 101 of some pixels.

[Example of Pixel Arrangement]

Figure 27:
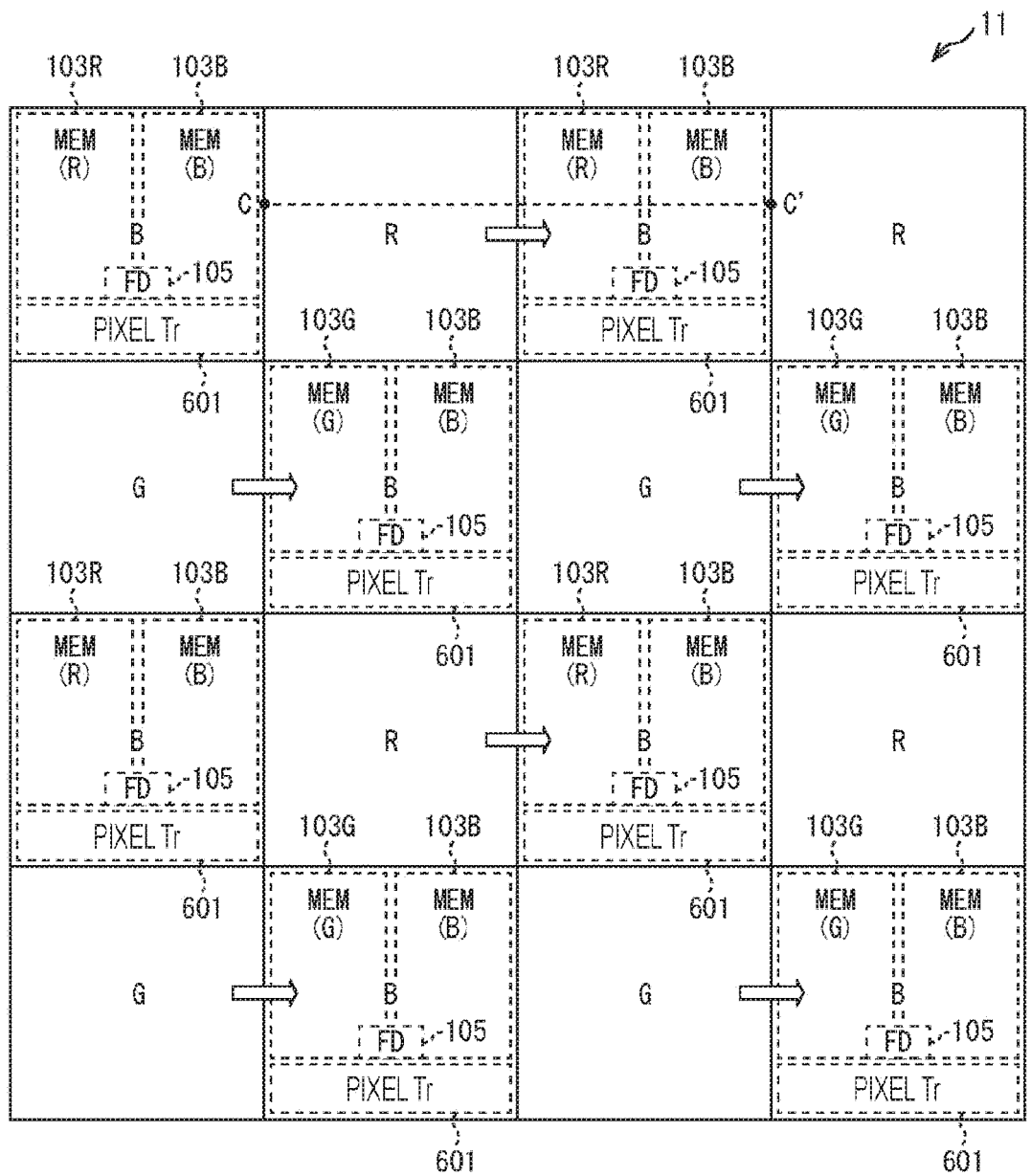
FIG. 27 is a view schematically illustrating a configuration example of a pixel array unit in a third embodiment of the present technology.

FIG. 27 illustrates an example of pixel arrangement in the pixel array unit 11 of FIG. 1. Furthermore, the figure schematically illustrates positions of the charge storage unit 103, the FD unit 105, and the pixel transistor 601 (for example, the reset gate unit 106, the amplification transistor 107, and the selection transistor 108) in each of pixels.

Note that while FIG. 27 illustrates pixel blocks including vertical two pixels× horizontal two pixels simply arranged in vertical two columns× horizontal two rows, an actual configuration includes more pixel blocks arranged in the pixel array unit 11 in a grid-like pattern.

In one pixel block, one R pixel for detecting red light, one G pixel for detecting green light, and two B pixels for detecting blue light are arranged. Furthermore, R pixels and G pixels are arranged diagonally, and two B pixels are arranged diagonally.

The charge storage unit 103, the FD unit 105, and the pixel transistor 601 are disposed in the B pixel alone. Specifically, in the row in which the R pixel and the B pixel are arranged, a charge storage unit 103R for the R pixel, a charge storage unit 103B for the B pixel, the FD unit 105, and the pixel transistor 601 are arranged in the B pixel. The FD unit 105 and the pixel transistor 601 are shared by the adjacent R pixel and B pixel. In the row in which the G pixel and the B pixel are arranged, a charge storage unit 103G for the G pixel, the charge storage unit 103B for the B pixel, and the FD unit 105 and the pixel transistor 601 are arranged in the B pixel. The FD unit 105 and the pixel transistor 601 are shared by adjacent G pixels and B pixels.

[Configuration Example of Pixel]

Figure 28:
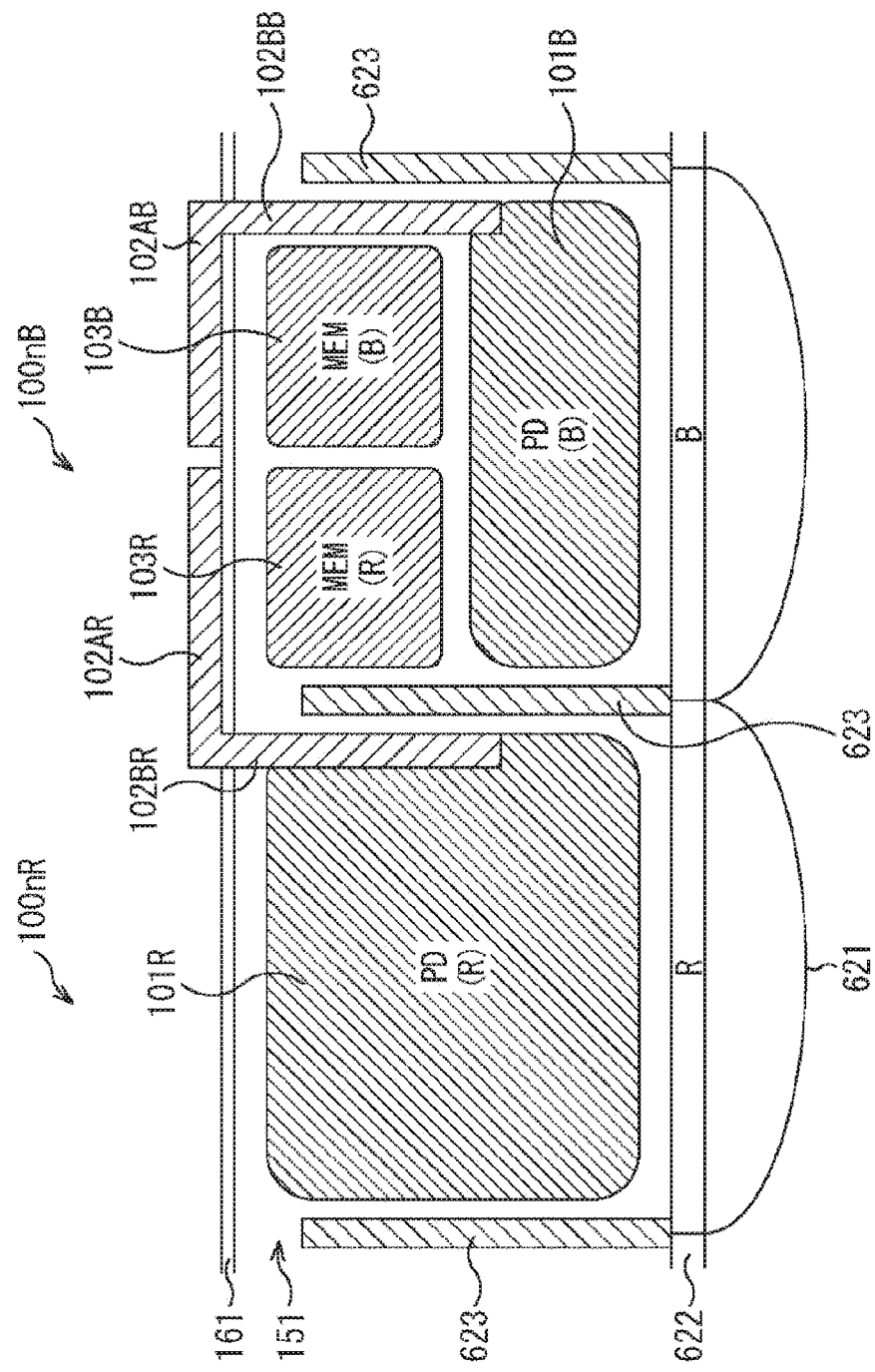
FIG. 28 is a cross-sectional view schematically illustrating a configuration example of a unit pixel in the third embodiment of the present technology.

FIG. 28 is a cross-sectional view schematically illustrating a configuration example of the pixel 100*n* which is the pixel 100 used for the pixel array unit 11 in FIG. 27, particularly an arrangement example of the photoelectric conversion unit 101 and the charge storage unit 103. Note that FIG. 28 schematically illustrates a cross section of an R pixel (pixel 100*n*R) and a B pixel (pixel 100*n*B) in C-C' direction of FIG. 27. Furthermore, note that in the figure, portions corresponding to those in FIG. 6 are denoted by the same reference numerals.

FIG. 28 illustrates a color filter 622 and a microlens 621 (not illustrated in FIG. 6) stacked on the incident surface of the semiconductor substrate 151. Note that as for the color filter 622, a red filter is disposed for the pixel 100*n*R, and a blue filter is disposed for the pixel 100*n*B.

Between the adjacent pixels 100*n*, an element isolation portion 623 formed from the incident surface side of the semiconductor substrate 151.

The thickness of a photoelectric conversion unit 101R of the pixel 100*n*R is substantially equal to the thickness in the vertical direction of the semiconductor substrate 151. In comparison, a photoelectric conversion unit 101B of the pixel 100*n*B is thinner than the photoelectric conversion unit 101R, and the front surface of the semiconductor substrate 151 is separated from the upper surface of the photoelectric conversion unit 101B by a predetermined distance. In addition, in the space between the front surface of the semiconductor substrate 151 and the upper surface of the photoelectric conversion unit 101B, the charge storage unit 103R and the charge storage unit 103B are formed to be aligned in the horizontal direction. The charge storage unit 103R is disposed closer to the pixel 100*n*R, while the charge storage unit 103B is disposed farther from the pixel 100*n*R.

On the front surface of the semiconductor substrate 151, a gate electrode 102AR and a gate electrode 102AB are disposed via the insulating film 161.

The gate electrode 102AR covers the upper surface of the charge storage unit 103R and extends to a position overlapping with the right end portion of the photoelectric conversion unit 101R. Furthermore, the gate electrode 102BR extends vertically downward in the semiconductor substrate 151 from the vicinity of the left end of the lower surface of the gate electrode 102AR, and reaches the inside of the photoelectric conversion unit 101R. In addition, a charge is transferred from the photoelectric conversion unit 101R to the charge storage unit 103R via the gate electrode 102BR and the gate electrode 102AR.

The gate electrode 102AB covers the upper surface of the charge storage unit 103B. Furthermore, a gate electrode 102BB extends vertically downward in the semiconductor substrate 151 from the vicinity of the right end of the lower surface of the gate electrode 102AB, and reaches the inside of the photoelectric conversion unit 101B. In addition, charge is transferred from the photoelectric conversion unit 101B to the charge storage unit 103B via the gate electrode 102BB and the gate electrode 102AB.

Blue light has a shorter wavelength compared with red light, and is absorbed at a position close to the incident surface of the semiconductor substrate 151. Accordingly, even when the photoelectric conversion unit 101B is thinner than the photoelectric conversion unit 101R, light incident on the pixel 100nB is substantially absorbed by the photoelectric conversion unit 101B and hardly reaches the charge storage unit 103R or the charge storage unit 103B. Therefore, stacking the photoelectric conversion unit 101B with the charge storage unit 103R and the charge storage unit 103B would cause substantially no increase in PLS.

Furthermore, stacking the photoelectric conversion unit 101B with the charge storage unit 103R and the charge storage unit 103B makes it possible to increase the light receiving area of the photoelectric conversion unit 101R and the photoelectric conversion unit 101B, leading to improvement of sensitivity.

Note that although not illustrated, the configuration of the G pixel (pixel 100nG) and the B pixel (pixel 100nB) adjacent to the G pixel in the horizontal direction is similar to the configuration of the R pixel (pixel 100nR) and the B pixel (pixel 100nB) adjacent to the R pixel in the horizontal direction, illustrated in FIG. 28.

6. Modification of Third Embodiment

Next, modifications of the third embodiment of the present technology will be described with reference to FIGS. 29 to 34.

First Modification

Figure 29:
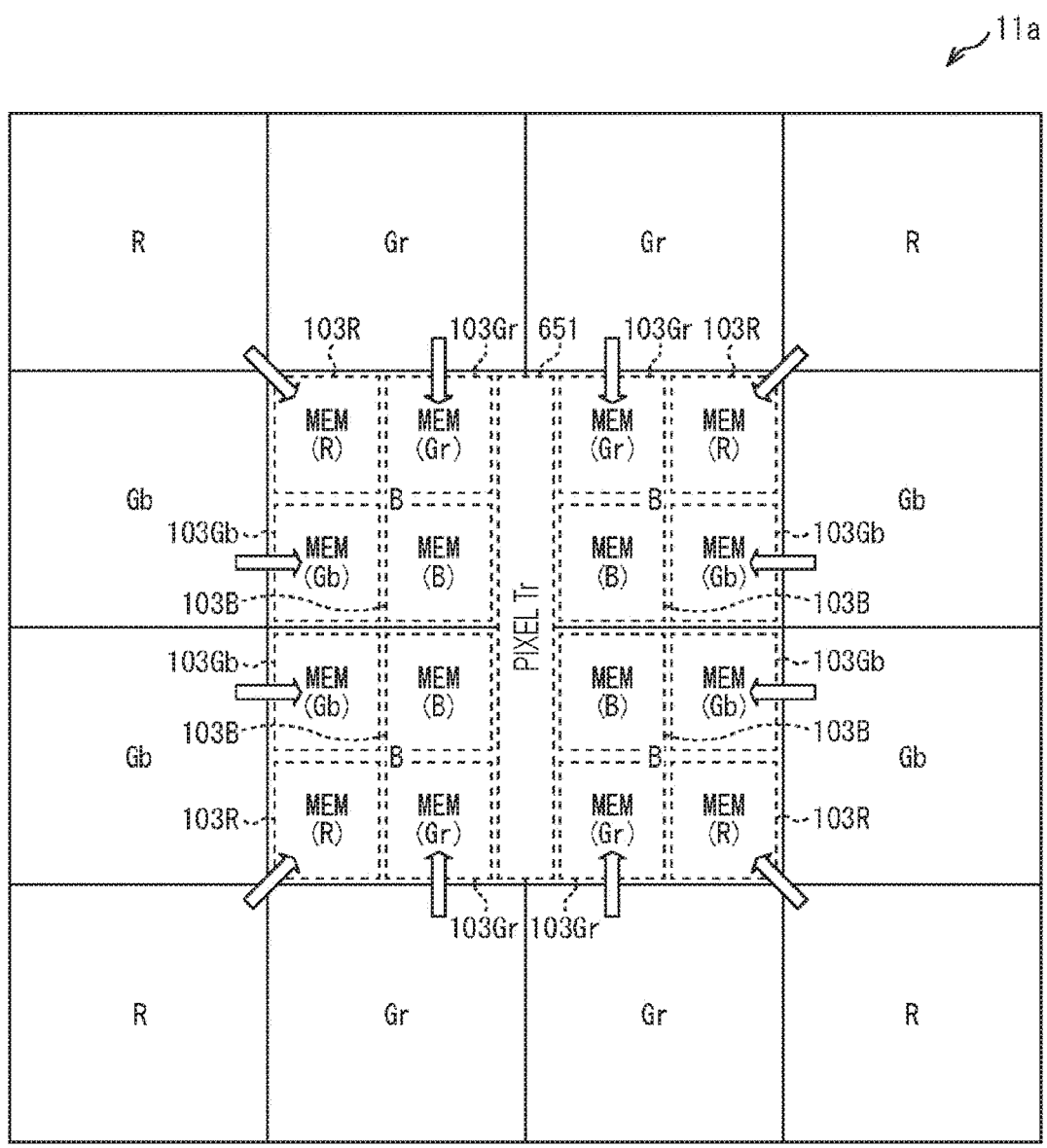
FIG. 29 is a view schematically illustrating a first modification of the pixel array unit in the third embodiment of the present technology.

FIG. 29 illustrates an example of arrangement of pixels in a pixel array unit 11a being a first modification of the pixel array unit 11. Furthermore, positions of the charge storage unit 103 and the pixel transistor 651 (for example, the reset gate unit 106, the amplification transistor 107, and the selection transistor 108) in each of pixels are schematically illustrated.

Note that while FIG. 29 illustrates pixel blocks including vertical 4 pixels×horizontal 4 pixels, an actual configuration includes more pixel blocks arranged in the pixel array unit 11a in a grid-like pattern.

In one pixel block, four R pixels, eight G pixels (Gr pixels and Gb pixels), and four B pixels are arranged. Furthermore, a block of B pixels including two vertical pixels×two horizontal pixels is disposed at the center of the pixel block. The block of B pixels has Gr pixels adjacent to the upper and lower sides of the block of B pixels, while having Gb pixels adjacent to the left and right sides of the block of B pixels. The block of B pixels has R pixels adjacent in the diagonal direction.

The charge storage unit 103 and the pixel transistor 651 are disposed in the B pixel alone. Specifically, in each of the B pixels, a charge storage unit 103R for R pixel, a charge storage unit 103Gr for Gr pixel, a charge storage unit 103Gb for Gb pixel, and a charge storage unit 103B for B pixel are arranged. The charge storage unit 103R, the charge storage unit 103Gr, the charge storage unit 103Gb, and the charge storage unit 103B are arranged in two rows×two columns in each of B pixels. The charge storage unit 103R, the charge storage unit 103Gr, and the charge storage unit 103Gb are disposed at positions close to the R pixel, the Gr pixel, and the Gb pixel, respectively. Note that although not illustrated, the charge storage unit 103R, the charge storage unit 103Gr, the charge storage unit 103Gb, and the charge storage unit 103B are stacked above the photoelectric conversion unit 101B of the B pixel, similarly to the example of FIG. 28. The pixel transistor 651 is disposed to extend vertically at the center of the block of B pixels in the horizontal direction.

With this configuration, similarly to the third embodiment, it is possible to suppress the occurrence of PLS and improve sensitivity. Furthermore, the pixel color ratio is equal to that of the Bayer array, leading to enhanced color reproducibility as compared with the third embodiment.

Second Modification

Figure 30:
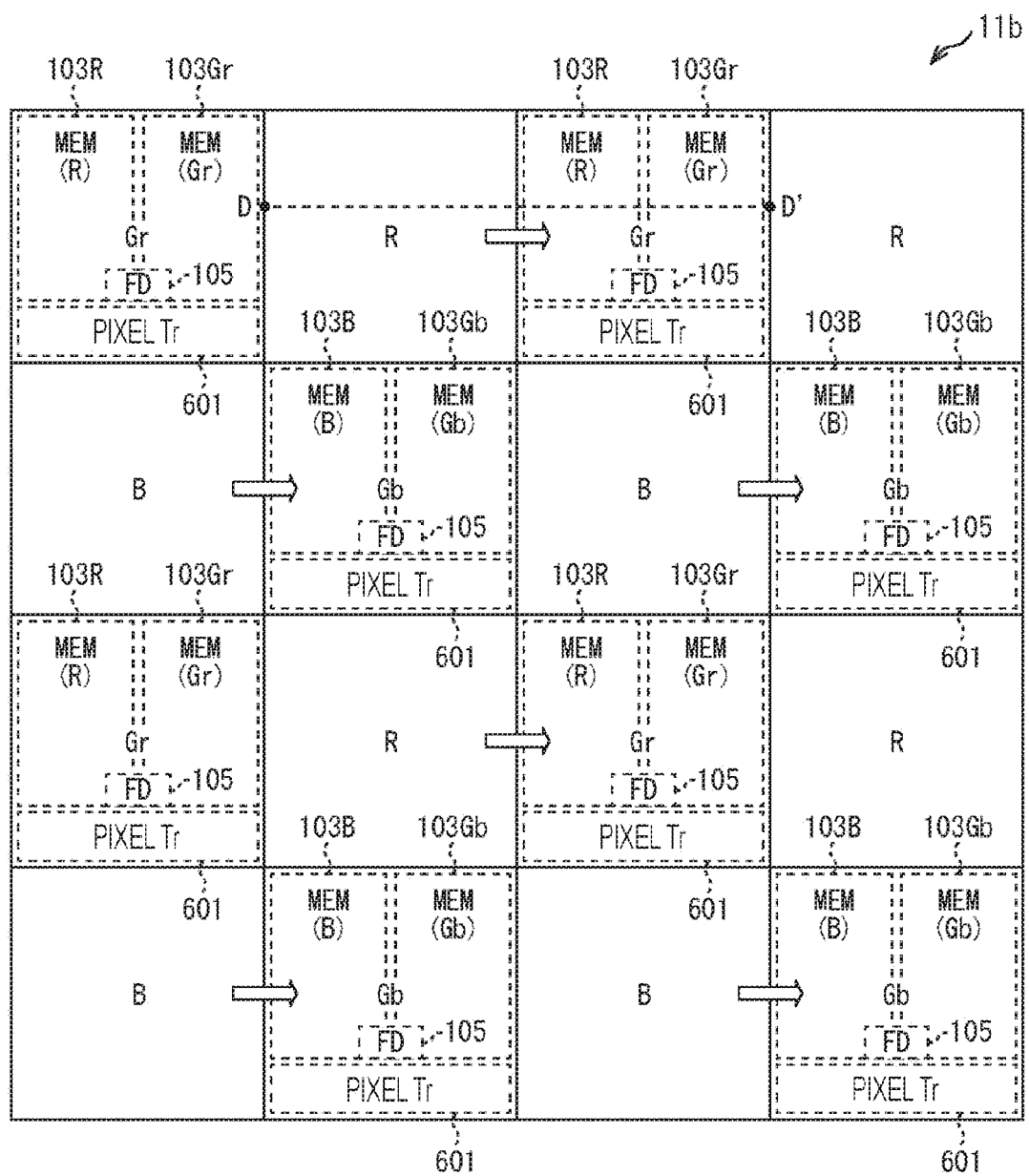
FIG. 30 is a view schematically illustrating a second modification of the pixel array unit in the third embodiment of the present technology.

FIG. 30 illustrates an example of arrangement of pixels in a pixel array unit 11b being a second modification of the pixel array unit 11. Note that in the figure, portions corresponding to those in FIG. 27 are denoted by the same reference numerals.

The pixel array unit 11b is different from the pixel array unit 11 of FIG. 27 in that individual pixel colors are arranged in accordance with the Bayer array. Furthermore, a difference also exists in that the charge storage unit 103, the FD unit 105, and the pixel transistor 601 are disposed in the G pixel, rather than in the B pixel. Specifically, the charge storage unit 103R for the R pixel, the charge storage unit 103Gr for the Gr pixel, and the FD unit 105 and the pixel transistor 601 are disposed in the Gr pixel. The charge storage unit 103B for the B pixel, the charge storage unit 103Gb for the Gb pixel, and the FD unit 105 and the pixel transistor 601 are disposed in the Gb pixel.

Figure 31:
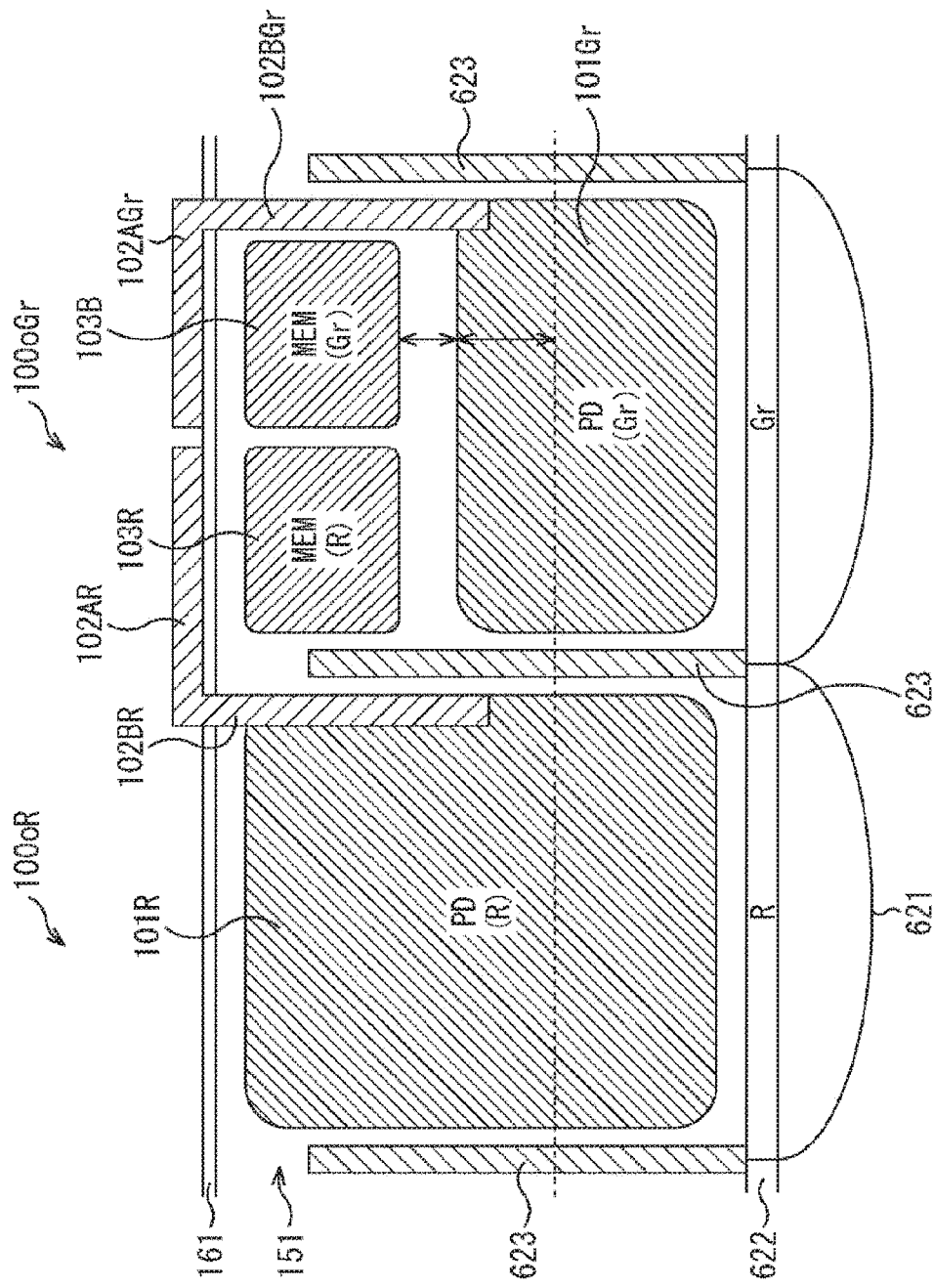
FIG. 31 is a cross-sectional view schematically illustrating a configuration example of a unit pixel provided in the pixel array unit of FIG. 30.

FIG. 31 is a cross-sectional view schematically illustrating a configuration example of a pixel 100o which is the pixel 100 used in the pixel array unit 11b of FIG. 30, in particular, an arrangement example of the photoelectric conversion unit 101 and the charge storage unit 103. Note that FIG. 31 schematically illustrates a cross section of an R pixel (pixel 100oR) and a Gr pixel (pixel 100oGr) in D-D' direction of FIG. 30. Furthermore, in the figure, portions corresponding to those in FIG. 28 are denoted by same reference numerals, and the description thereof will be omitted as appropriate.

As described above, the pixel 100o is different from the pixel 100n in FIG. 28 in that the charge storage unit 103 is disposed in the Gr pixel (pixel 100oGr), rather than in the B pixel.

Specifically, the semiconductor substrate 151 in the pixel 100o is thicker than the semiconductor substrate 151 in the pixel 100n in FIG. 28. Additionally, the thickness of the photoelectric conversion unit 101R of the pixel 100oR is also increased by the increase of the thickness of the semiconductor substrate 151.

In contrast, the thickness of a photoelectric conversion unit 101Gr of the pixel 100oGr is substantially the same as the thickness of the photoelectric conversion unit 101R of the pixel 100nR of FIG. 28, and is just thicker than the photoelectric conversion unit 101B of the pixel 100nB of FIG. 28 by a portion indicated by an arrow. Accordingly, the front surface of the semiconductor substrate 151 and the upper surface of the photoelectric conversion unit 101Gr are separated by a predetermined distance. Additionally, in a space between the front surface of the semiconductor substrate 151 and the upper surface of the photoelectric conversion unit 101Gr, the charge storage unit 103R and the charge storage unit 103Gr are arranged in the horizontal direction at a position slightly away from the upper surface of the photoelectric conversion unit 101Gr. The charge storage unit 103R is disposed closer to the pixel 100oR, while the charge storage unit 103Gr is disposed farther from the pixel 100oR.

On the front surface of the semiconductor substrate 151, a gate electrode 102AR and a gate electrode 102AGr are disposed via the insulating film 161.

The gate electrode 102AR covers the upper surface of the charge storage unit 103R and extends to a position overlapping with the right end portion of the photoelectric conversion unit 101R. Furthermore, the gate electrode 102BR extends vertically downward in the semiconductor substrate 151 from the vicinity of the left end of the lower surface of the gate electrode 102AR, and reaches the inside of the photoelectric conversion unit 101R. In addition, a charge is transferred from the photoelectric conversion unit 101R to the charge storage unit 103R via the gate electrode 102BR and the gate electrode 102AR.

The gate electrode 102AGr covers the upper surface of the charge storage unit 103Gr. Furthermore, a gate electrode 102BGr extends vertically downward in the semiconductor substrate 151 from the vicinity of the right end of the lower surface of the gate electrode 102AGr, and reaches the inside of the photoelectric conversion unit 101Gr. In addition, a charge is transferred from the photoelectric conversion unit 101Gr to the charge storage unit 103Gr via the gate electrode 102BGr and the gate electrode 102AGr.

Green light has a longer wavelength compared with the blue light, and reaches a deep portion of the semiconductor substrate 151. Correspondingly, with a configuration in which the semiconductor substrate 151 is thickened, the photoelectric conversion unit 101Gr is thicker than the photoelectric conversion unit 101B in FIG. 28, and the interval between the upper surface of the photoelectric conversion unit 101Gr and the bottom surface of the charge storage unit 103R and the charge storage unit 103Gr is increased, the light incident into the pixel 100oGr is reliably absorbed by the photoelectric conversion unit 101Gr, leading to suppression of arrival of the light on the charge storage unit 103R or the charge storage unit 103Gr.

Note that although not illustrated, the configuration of the B pixel (pixel 100oB) and the Gb pixel (pixel 100oGb) adjacent to the B pixel in the horizontal direction is similar to the configuration of the R pixel (pixel 100oR) and the Gr pixel (pixel 100oGr) adjacent to the R pixel in the horizontal direction, illustrated in FIG. 31.

Third Modification

Figure 32:
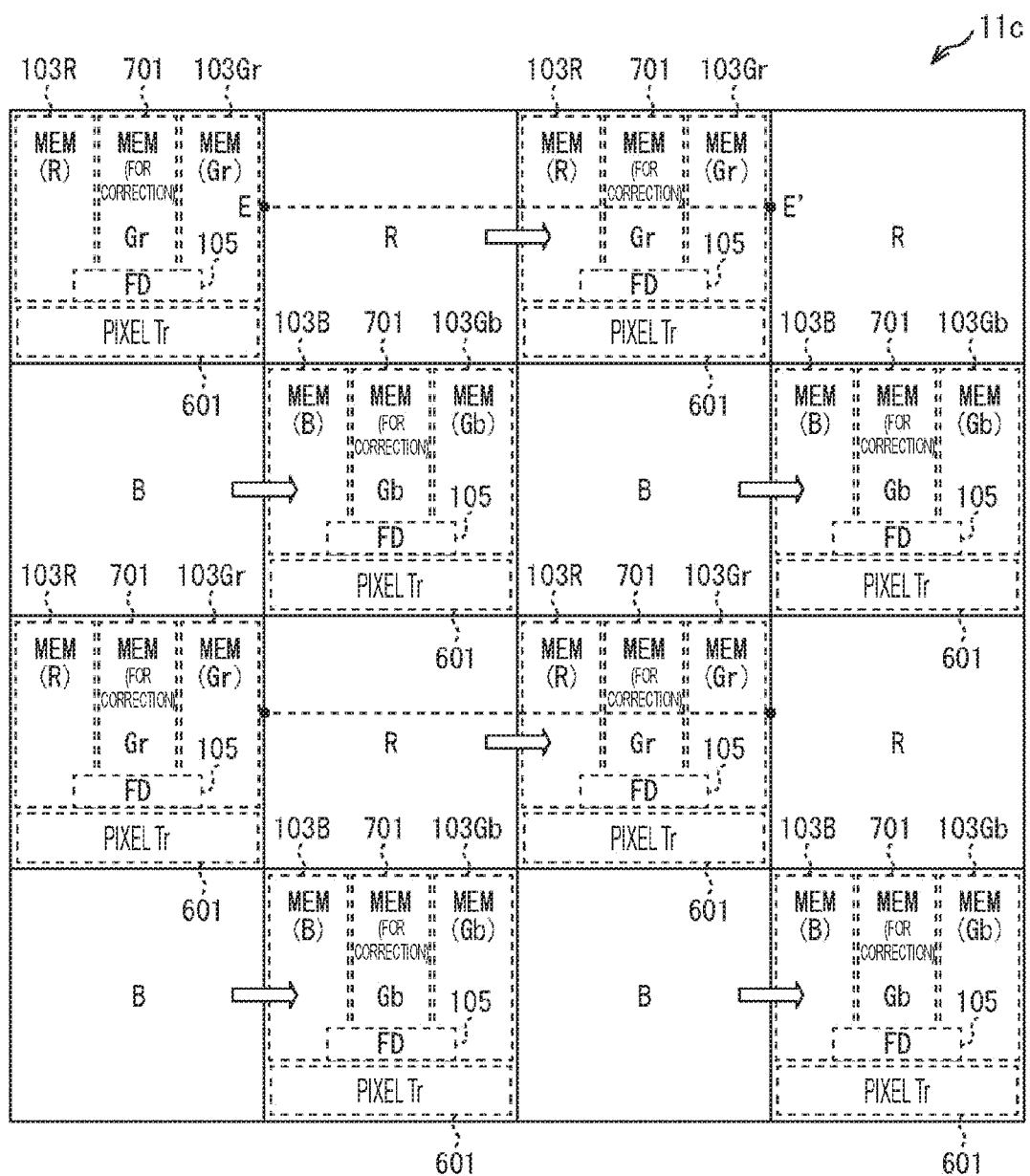
FIG. 32 is a view schematically illustrating a third modification of the pixel array unit in the third embodiment of the present technology.

FIG. 32 illustrates an example of arrangement of pixels in a pixel array unit 11c being a third modification of the pixel array unit 11. Note that in the figure, portions corresponding to those in FIG. 30 are denoted by the same reference numerals.

The pixel array unit 11c is different from the pixel array unit 11b of FIG. 30 in that a charge storage unit 701 for correction has been added in the Gr pixel and the Gb pixel.

Specifically, in the Gr pixel, the widths of the charge storage unit 103R and the charge storage unit 103Gr are reduced, and the charge storage unit 701 is disposed between the charge storage unit 103R and the charge storage unit 103Gr. Furthermore, in the Gb pixel, the widths of the charge storage unit 103R and the charge storage unit 103Gb are reduced, and the charge storage unit 701 is disposed between the charge storage unit 103R and the charge storage unit 103Gb.

Figure 33:
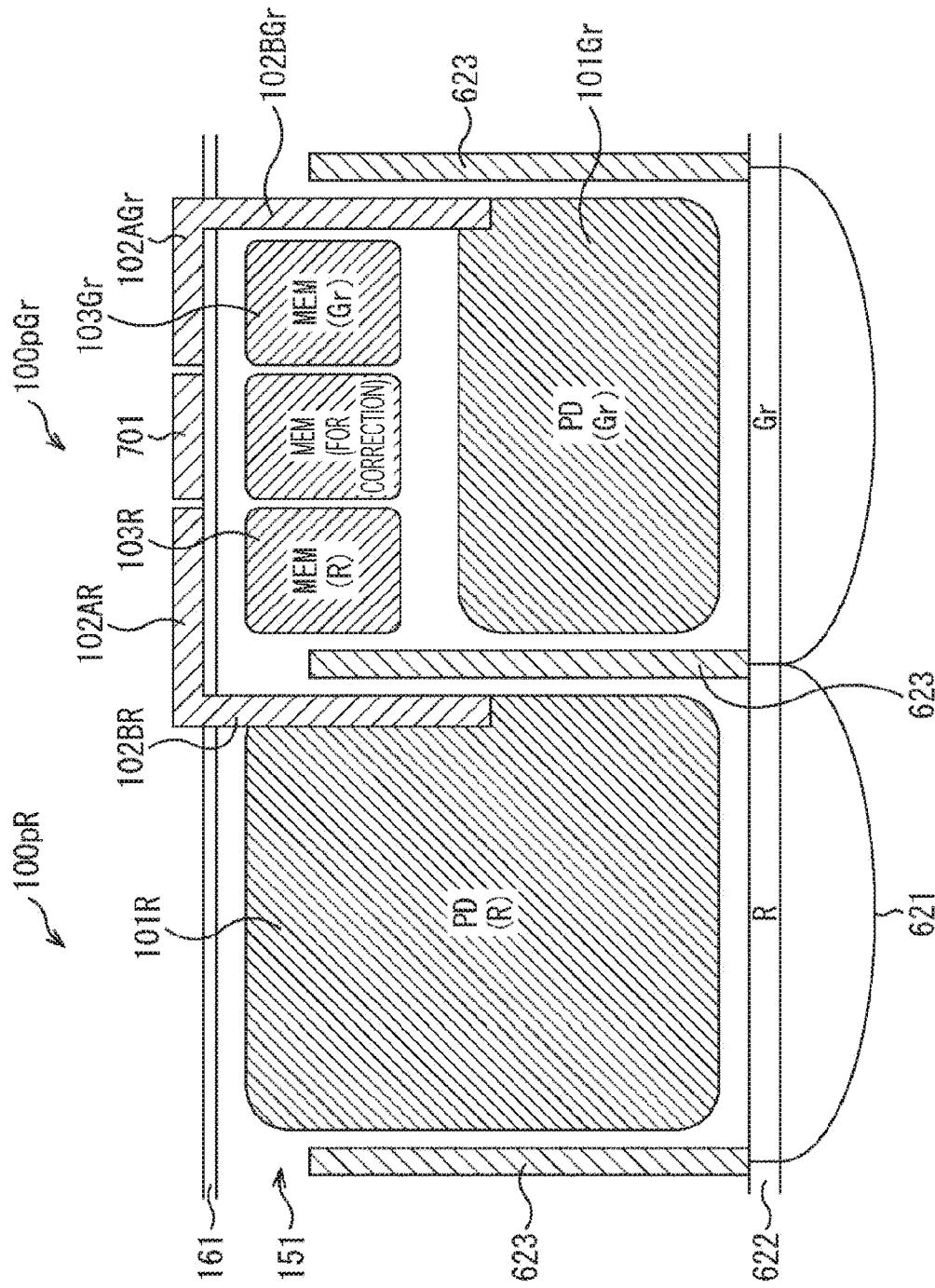
FIG. 33 is a cross-sectional view schematically illustrating a configuration example of a unit pixel provided in the pixel array unit of FIG. 32.

FIG. 33 is a cross-sectional view schematically illustrating a configuration example of a pixel 100p which is the pixel 100 used for the pixel array unit 11c of FIG. 32. Note that FIG. 33 schematically illustrates a cross section of an R pixel (pixel 100pR) and a Gr pixel (pixel 100pGr) in E-E' direction of FIG. 32. Furthermore, in the figure, portions corresponding to those in FIG. 31 are denoted by same reference numerals, and the description thereof will be omitted as appropriate.

The pixel 100p is different from the pixel 100o in FIG. 31 in that a charge storage unit 701 for correction and a gate electrode 702 have been added in the pixel 100pGr.

Specifically, in the pixel 100pGr, the widths of the charge storage unit 103R and the charge storage unit 103Gr are reduced, and the charge storage unit 701 is disposed between the charge storage unit 103R and the charge storage unit 103Gr. Furthermore, the gate electrode 702 is disposed on the front surface of the semiconductor substrate 151 so as to cover the upper surface of the charge storage unit 701 via the insulating film 161. The gate electrode 702 is used to read out the charge stored in the charge storage unit 701.

Most of the light incident on the pixel 100pGr is absorbed by the photoelectric conversion unit 101Gr. However, a part of the light is transmitted through the photoelectric conversion unit 101Gr and reaches the charge storage unit 103R, the charge storage unit 103Gr, and the charge storage unit 701. The light transmitted through the photoelectric conversion unit 101Gr increases PLS.

That is, the charge storage unit 103R stores charges (hereinafter referred to as a PLS component) by light transmitted through the photoelectric conversion unit 101Gr in addition to the charge (hereinafter referred to as a signal component) generated in the photoelectric conversion unit 101R. Similarly, the charge storage unit 103Gr stores a PLS component in addition to the signal component generated by the photoelectric conversion unit 101Gr. In contrast, the charge storage unit 701 stores the PLS component alone. Therefore, by calculating a difference between the charge stored in the charge storage unit 103R and the charge stored in the charge storage unit 701, it is possible to remove the PLS component from the charge stored in the charge storage unit 103R to extract the signal component. Similarly, by calculating a difference between the charge stored in the charge storage unit 103Gr and the charge stored in the charge storage unit 701, it is possible to remove the PLS component from the charge stored in the charge storage unit 103Gr to extract the signal component.

Note that it is preferable that charges generated by light transmitted through the photoelectric conversion unit 101Gr be substantially equally incident on each of the charge storage unit 103R, the charge storage unit 103Gr, and the charge storage unit 701. For example, the bottom surface areas of the charge storage unit 103R, the charge storage unit 103Gr, and the charge storage unit 701 are set to substantially the same size.

Furthermore, note that although not illustrated, the configuration of the B pixel (pixel 100pB) and the Gb pixel (pixel 100pGb) adjacent to the B pixel in the horizontal direction is similar to the configuration of the R pixel (pixel 100pR) and the Gr pixel (pixel 100pGr) adjacent to the R pixel in the horizontal direction, illustrated in FIG. 33.

7. Fourth Embodiment

Figure 38:
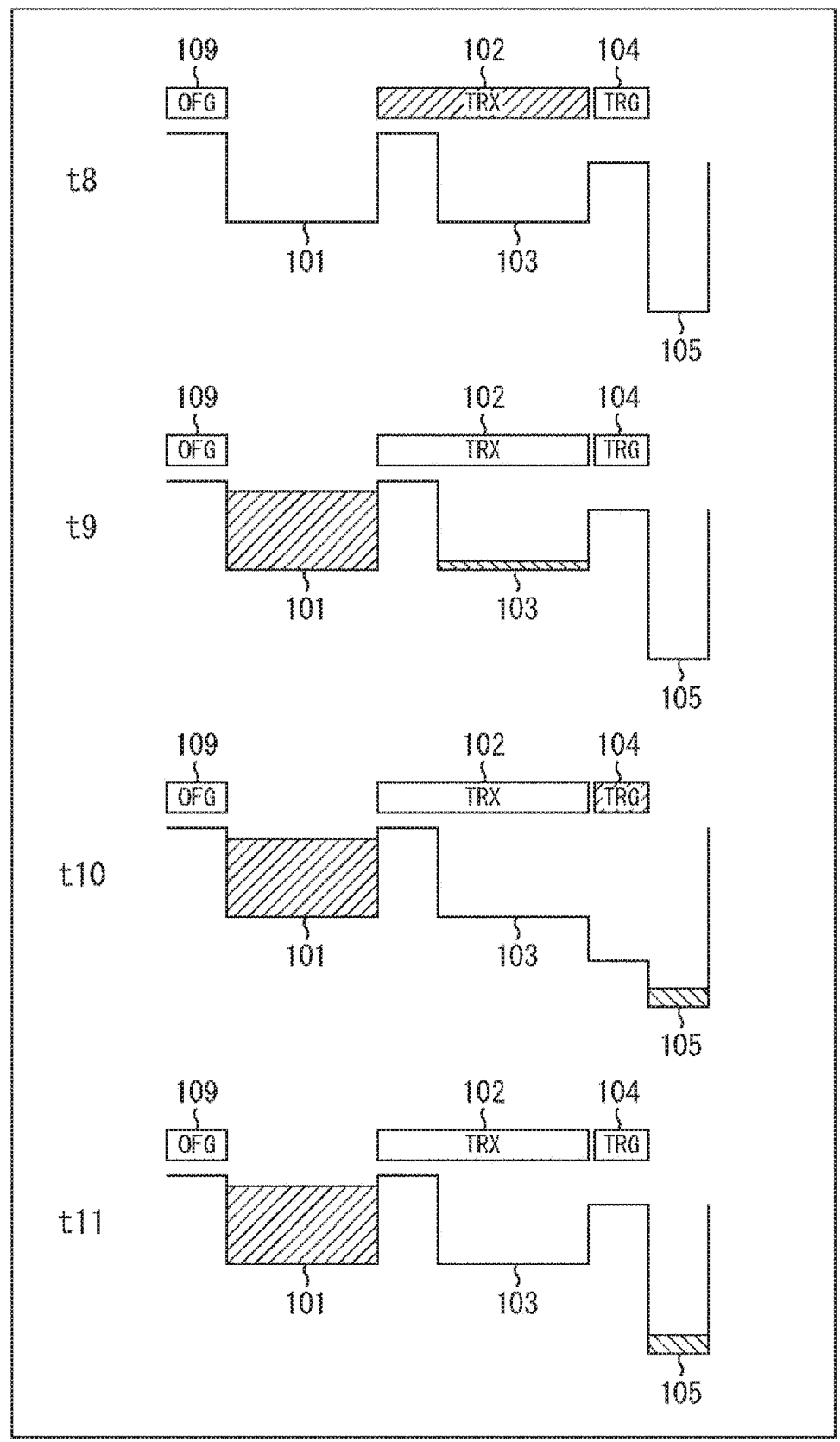
FIG. 38 is a timing chart illustrating operation of the unit pixel of FIG. 35.

Next, a fourth embodiment of the present technology will be described with reference to FIGS. 34 and 38. The fourth embodiment is different from the third embodiment in that the charge storage unit 103 is stacked above the photoelectric conversion units 101 of all the pixels.

[Example of Pixel Arrangement]

Figure 34:
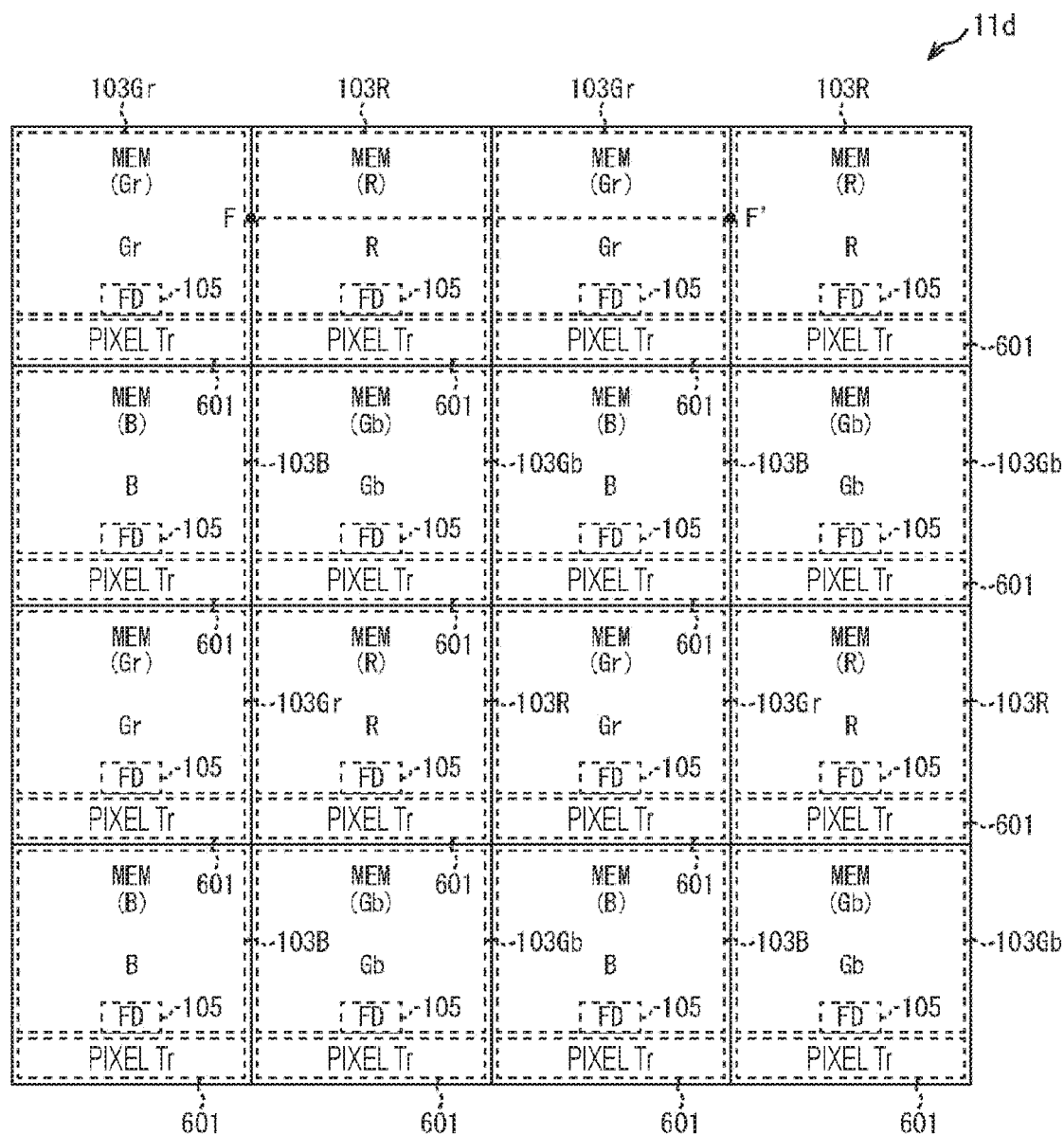
FIG. 34 is a view schematically illustrating a configuration example of a pixel array unit in a fourth embodiment of the present technology.

FIG. 34 illustrates an example of the arrangement of pixels in a pixel array unit 11d being a fourth modification of the pixel array unit 11. Note that in the figure, portions corresponding to those in FIG. 27 are denoted by the same reference numerals.

The pixel array unit 11d is different from the pixel array unit 11 in FIG. 27 in that the charge storage unit 701, the FD unit 105, and the pixel transistor 601 are disposed in each of pixels.

Specifically, the charge storage unit 103R for the R pixel is disposed in the R pixel, the charge storage unit 103Gr for the Gr pixel is disposed in the Gr pixel, the charge storage unit 103Gb for the Gb pixel is disposed in the Gb pixel, and the charge storage unit 103B for the B pixel is disposed in the B pixel. In addition, the FD unit 105 and the pixel transistor 601 are disposed in each of the R pixel, the Gr pixel, the Gb pixel, and the B pixel.

[Configuration Example of Pixel]

Figure 35:
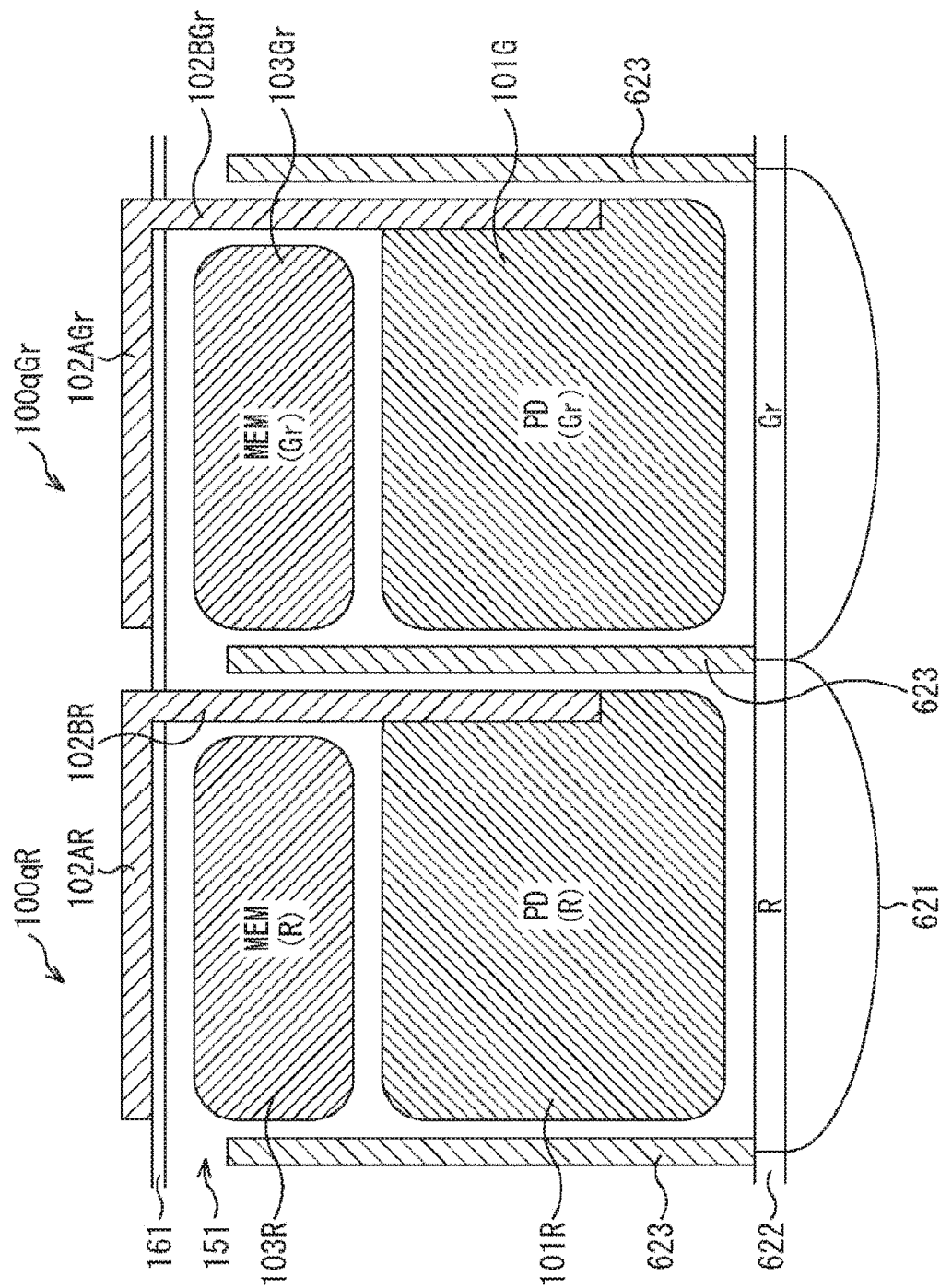
FIG. 35 is a cross-sectional view schematically illustrating a configuration example of a unit pixel provided in the pixel array unit of FIG. 34.

FIG. 35 is a cross-sectional view schematically illustrating a configuration example of a pixel 100q which is the pixel 100 used in the pixel array unit 11d of FIG. 34, in particular, an arrangement example of the photoelectric conversion unit 101 and the charge storage unit 103. Note that FIG. 35 schematically illustrates a cross section of an R pixel (pixel 100qR) and a Gr pixel (pixel 100qGr) in F-F' direction of FIG. 34. Furthermore, in the figure, portions corresponding to those in FIG. 28 are denoted by same reference numerals, and the description thereof will be omitted as appropriate.

The pixel 100q is different from the pixel 100n of FIG. 28 in that, as described above, the charge storage unit 103 is disposed in each of the pixels 100q.

Specifically, in the pixel 100qR, the charge storage unit 103R is disposed between the front surface of the semiconductor substrate 151 and the upper surface of the photoelectric conversion unit 101R. Furthermore, the gate electrode 102AR is disposed on the front surface of the semiconductor substrate 151 so as to cover the upper surface of the charge storage unit 103R via the insulating film 161. Furthermore, the gate electrode 102BR extends vertically downward in the semiconductor substrate 151 from the vicinity of the right end of the lower surface of the gate electrode 102AR, and reaches the inside of the photoelectric conversion unit 101R. In addition, a charge is transferred from the photoelectric conversion unit 101R to the charge storage unit 103R via the gate electrode 102BR and the gate electrode 102AR.

Similarly, in the pixel 100qGr, the charge storage unit 103Gr is disposed between the front surface of the semiconductor substrate 151 and the upper surface of the photoelectric conversion unit 101Gr. Furthermore, the gate electrode 102AGr is disposed on the front surface of the semiconductor substrate 151 so as to cover the upper surface of the charge storage unit 103Gr via the insulating film 161. Furthermore, a gate electrode 102BGr extends vertically downward in the semiconductor substrate 151 from the vicinity of the right end of the lower surface of the gate electrode 102AGr, and reaches the inside of the photoelectric conversion unit 101Gr. In addition, a charge is transferred from the photoelectric conversion unit 101Gr to the charge storage unit 103Gr via the gate electrode 102BGr and the gate electrode 102AGr.

Note that although not illustrated, the configuration of the B pixel (pixel 100qB) and the Gb pixel (pixel 100qGb) adjacent to the B pixel in the horizontal direction is similar to the configuration of the R pixel (pixel 100qR) and the Gr pixel (pixel 100qGr) adjacent to the R pixel in the horizontal direction, illustrated in FIG. 35.

Figure 36:
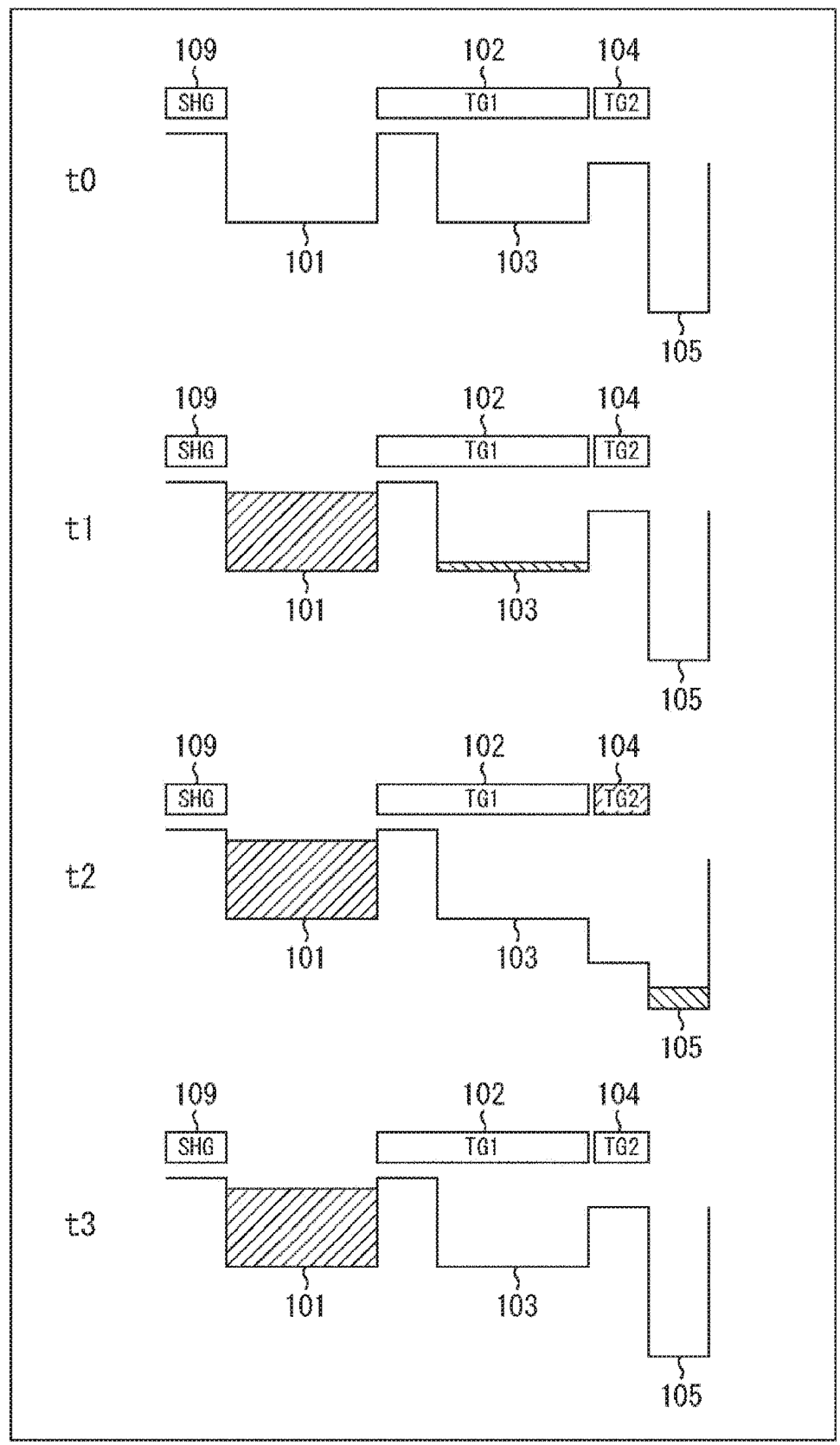
FIG. 36 is a timing chart illustrating operation of the unit pixel of FIG. 35.
Figure 37:
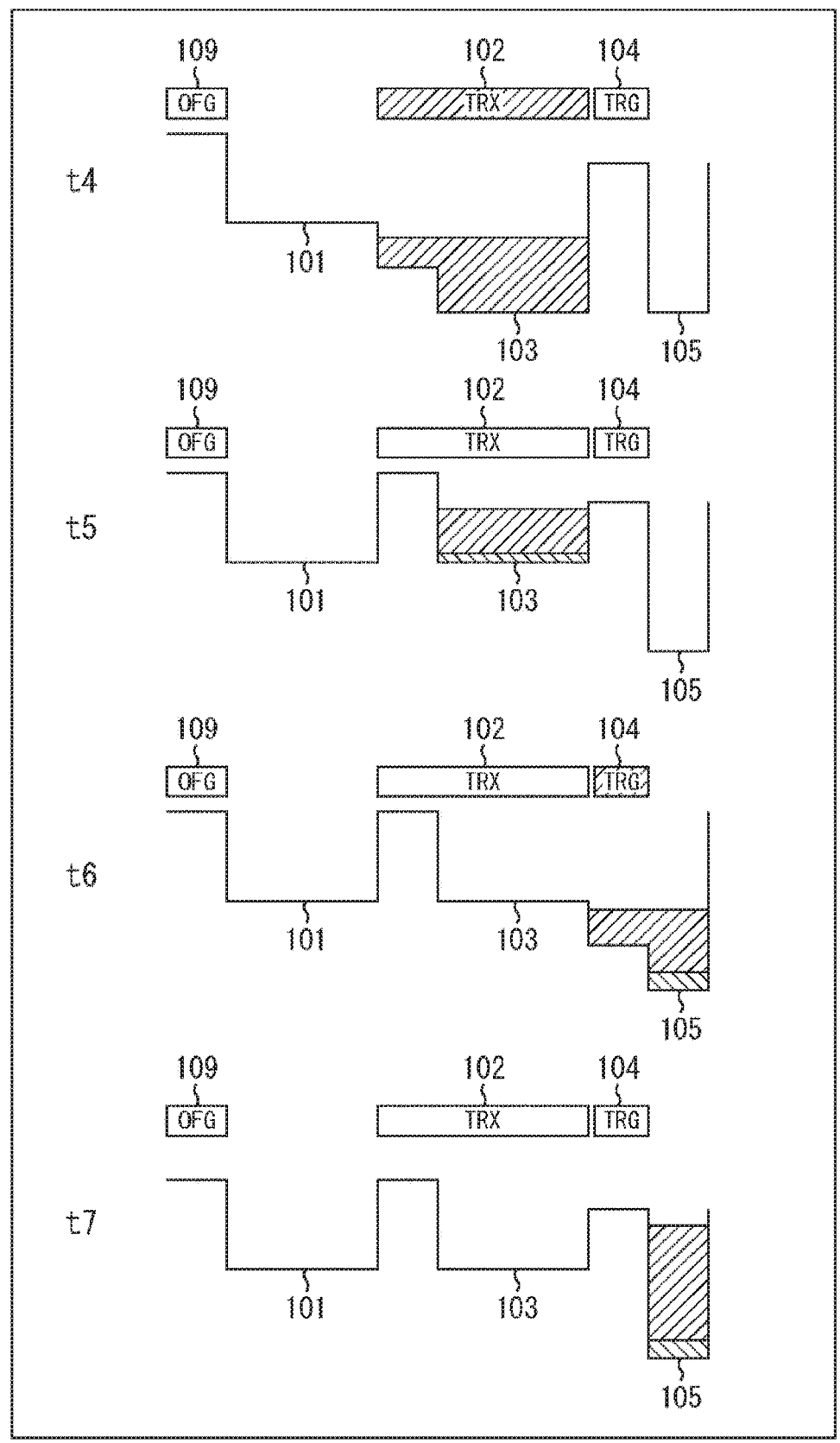
FIG. 37 is a timing chart illustrating operation of the unit pixel of FIG. 35.

Next, operation of the pixel 100q will be described with reference to FIGS. 36 to 38.

Time t0 indicates a state of the pixel 100q after reset. That is, the drive signals TG1, TG2, RST, and SHG are turned on, and accordingly, the memory transfer gate unit 102, the FD transfer gate unit 104, the reset gate unit 106, and the charge discharging gate unit 109 are turned on, and then, charges of the photoelectric conversion unit 101, the charge storage unit 103, and the FD unit 105 are discharged. Thereafter, the drive signals TG1, TG2, RST, and SHG are turned off, and accordingly, the memory transfer gate unit 102, the FD transfer gate unit 104, the reset gate unit 106, and the charge discharging gate unit 109 are turned off, starting a first exposure period.

Time t1 is during the first exposure period, in which the signal component is stored in the photoelectric conversion unit 101 while the PLS component is stored in the charge storage unit 103.

At time t2, the drive signal TG2 is turned on, and accordingly, the FD transfer gate unit 104 is turned on. This allows the charge corresponding to the PLS component stored in the charge storage unit 103 to be transferred to the FD unit 105 via the FD transfer gate unit 104.

At time t3, the drive signal RST is turned on, and accordingly, the reset gate unit 106 (not illustrated) is turned on, resetting the potential of the FD unit 105 to the level of the power supply voltage VDD, leading to discharge of the charge of the FD unit 105.

At time t4, the drive signal TG1 is turned on, and accordingly, the memory transfer gate unit 102 is turned on, allowing the charge stored in the photoelectric conversion unit 101 to be transferred to the charge storage unit 103 via the memory transfer gate unit 102. This completes the exposure period.

Time t5 is a period during which the charge storage unit 103 holds the charge until readout of the charge. While the charge is held in the charge storage unit 103, parasitic light is incident on the charge storage unit 103, and the PLS component is stored in the charge storage unit 103 in addition to the signal component transferred from the photoelectric conversion unit 101.

At time t6, the drive signal TG2 is turned on, and accordingly, the FD transfer gate unit 104 is turned on, allowing the charge stored in the charge storage unit 103 to be transferred to the FD unit 105 via the FD transfer gate unit 104.

At time t7, the drive signal TG2 is turned off. At this time, the signal component and the PLS component are stored in the FD unit 105. Subsequently, the drive signal SEL is turned on, and accordingly, the selection transistor 108 is turned on, so as to allow a pixel signal corresponding to the charge stored in the FD unit 105 to be read out. The pixel signal read out at this time includes a signal component and a PLS component.

At time t8, similarly to time t0, the pixel 100q is reset and thereafter a second exposure period is started.

Time t9 is during the second exposure period, in which the signal component is stored in the photoelectric conversion unit 101 while the PLS component is stored in the charge storage unit 103.

At time t10, the drive signal TG2 is turned on, and accordingly, the FD transfer gate unit 104 is turned on, allowing the charge stored in the charge storage unit 103 to be transferred to the FD unit 105 via the FD transfer gate unit 104.

At time t11, the drive signal TG2 is turned off. At this time, the PLS component is stored the FD unit 105. Subsequently, the drive signal SEL is turned on, and accordingly, the selection transistor 108 is turned on, so as to allow a pixel signal corresponding to the charge stored in the FD unit 105 to be read out. The pixel signal read out at this time includes the PLS component alone, without including the signal component. Therefore, by calculating a difference between the pixel signal (charge) read out at time t7 and the pixel signal (charge) read out at time t11, it is possible to remove the PLS component of pixel 100q, leading to extraction of the signal component.

Note that it is desirable to set the length of the storage period from the end of the first exposure until execution of the readout of the pixel signal to be the equal to the second exposure period so that the PLS component of the pixel signal at the first readout at time t7 becomes substantially same as the PLS component of the pixel signal at the second readout at time t11.

Thereafter, the pixel 100q is reset, and thereafter, the first exposure period is started.

In this manner, by disposing the charge storage unit 103 in each of pixels 100q, it is possible to increase the capacitance of the charge storage unit 103, leading to an increase in the saturation charge amount. Furthermore, driving the pixel 100q as illustrated in FIGS. 36 to 38 would be able to remove the PLS component from the pixel signal, leading to improvement of image quality.

8. Other Modifications

Hereinafter, a modification of the above-described embodiments of the present technology will be described.

The present technology can also be applied to general imaging elements other than the CMOS image sensor, which are back-illuminated type and store charges in the charge storage unit before readout.

Furthermore, it is possible to mutually combine above-described individual embodiments and modifications in allowable ranges.

9. Application Example of Imaging Element

[Application Example of Imaging Element]

Figure 39:
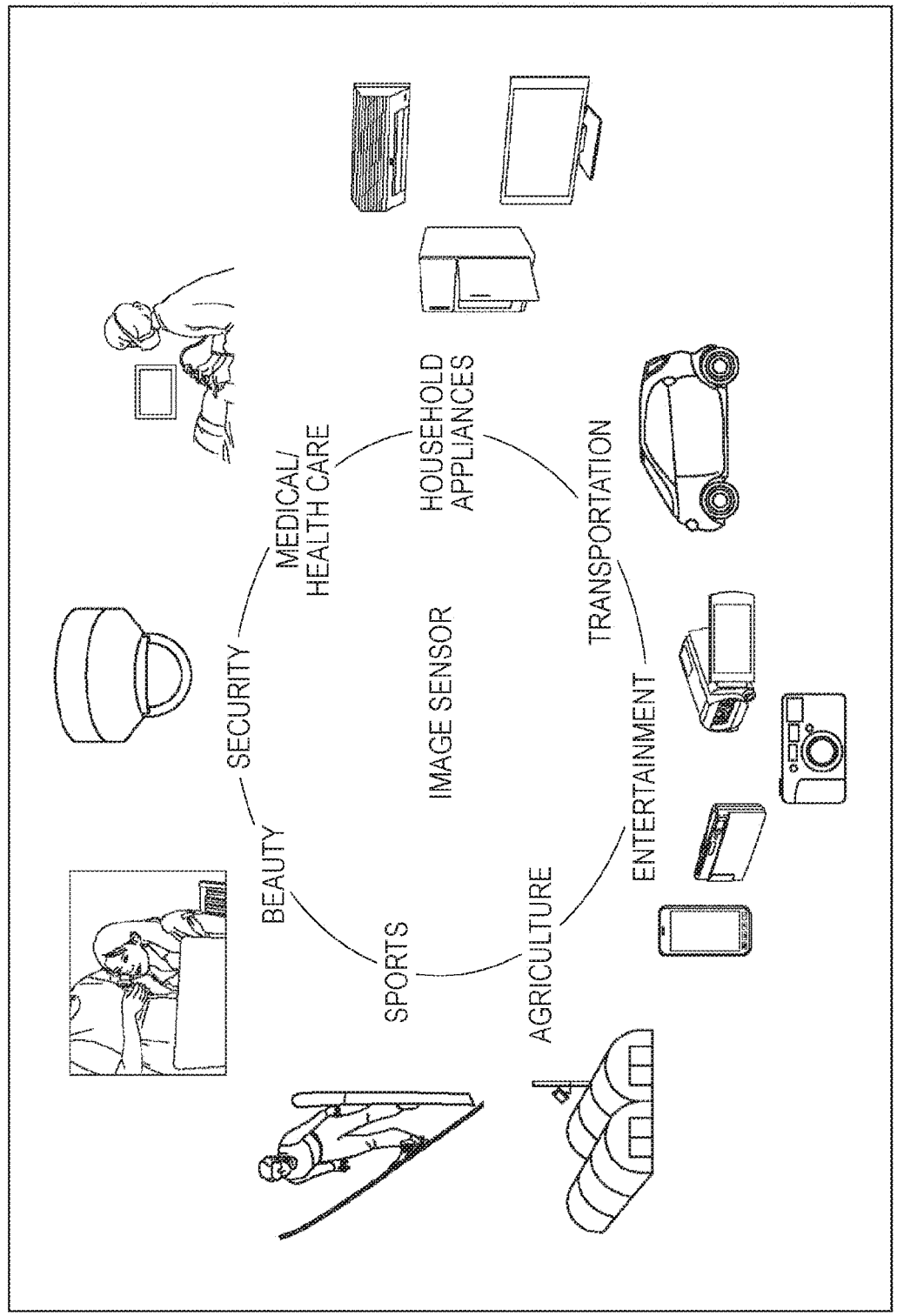
FIG. 39 is a view illustrating a use example of an imaging device.

FIG. 39 is a diagram illustrating exemplary application of the above-described imaging element.

The above-described imaging element is applicable to the following various situations in which sensing is performed for light including visual light, infrared light, ultraviolet light, X-ray, and the like, for example.

A device for capturing an image for entertainment, such as a digital camera and a mobile phone with a camera function.

A device for transportation, such as an on-vehicle sensor that images a front, back, surroundings, interior, or the like, of a vehicle in order to, for example, ensure safe driving including automatic stop and the like, and to recognize driver's conditions, a surveillance camera to monitor driving vehicles and roads, and a range-finding sensor to perform measurement of a distance between vehicles, or the like.

A device for household appliances including a TV, a refrigerator, an air conditioner, and the like to photograph user's gesture and perform operation of the apparatus according to the gesture.

A device for medical and health care fields, such as an endoscope, and a device for angiography using reception of infrared light.

A device for security, such as a surveillance camera for crime prevention, and a camera for personal authentication.

A device for beauty, such as a skin measuring instrument to photograph the skin, and a microscope to photograph the scalp.

A device for sports, such as an action camera and a wearable camera for sports applications and the like.

A device for agriculture, such as a camera to monitor conditions of fields and crops.

[Example of Applying an Imaging Element to an Electronic Device]

Figure 40:
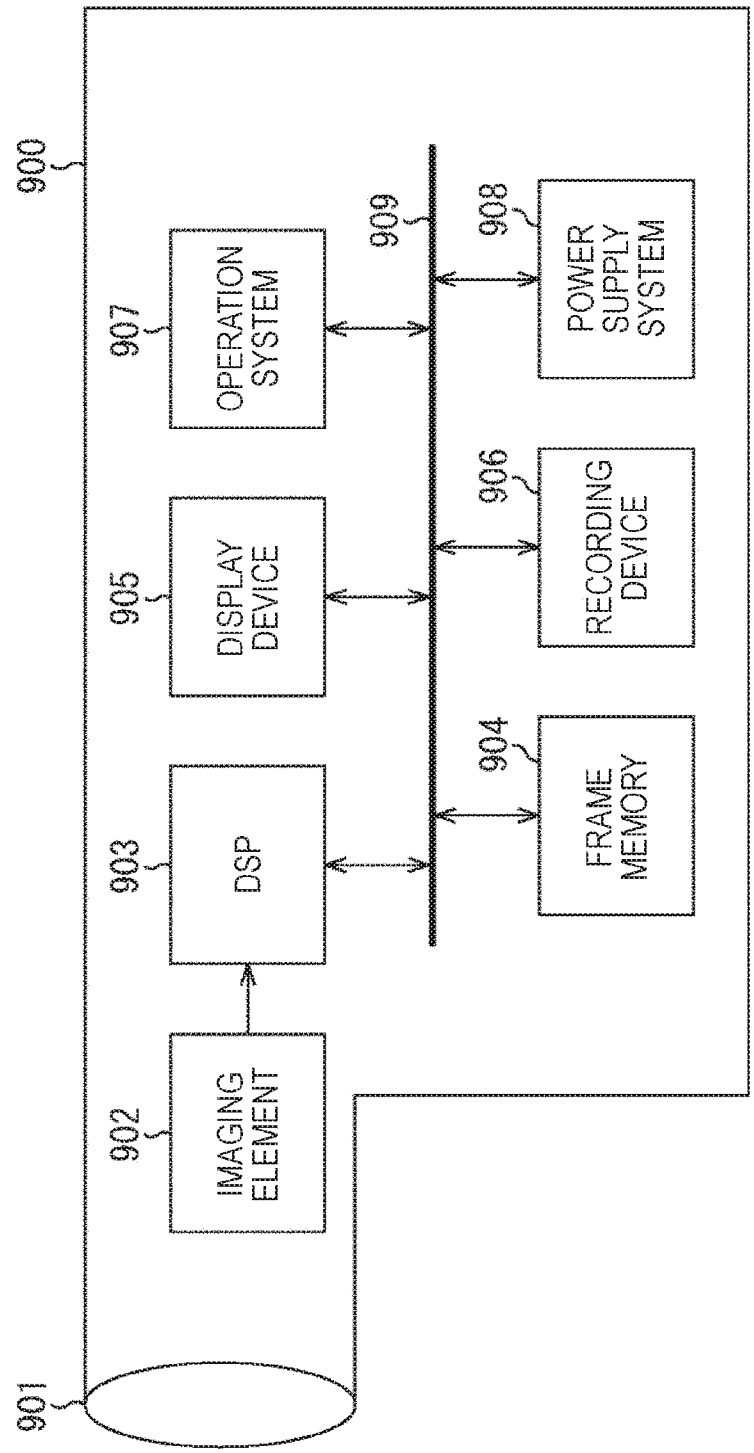
FIG. 40 is a block diagram illustrating a configuration example of an electronic device.

FIG. 40 is a view illustrating a configuration example of an electronic device 900 to which an imaging element is applied.

The electronic device 900 is, for example, an electronic device such as an imaging device such as a digital still camera or a video camera, or a portable terminal device such as a smartphone or a tablet terminal.

In FIG. 40, the electronic device 900 includes a lens 901, an imaging element 902, a DSP circuit 903, a frame memory 904, a display unit 905, a recording unit 906, an operation unit 907, and a power supply unit 908. Furthermore, in the electronic device 900, the DSP circuit 903, the frame memory 904, the display unit 905, the recording unit 906, the operation unit 907, and the power supply unit 908 are mutually connected via a bus line 909.

In addition, the CMOS image sensors 10 to 10B respectively illustrated in FIGS. 1 to 3 can be applied as the imaging element 902.

The DSP circuit 903 is a signal processing circuit that processes a signal supplied from the imaging element 902. The DSP circuit 903 outputs image data obtained by processing the signal from the imaging element 902. The frame memory 904 temporarily holds the image data processed by the DSP circuit 903 in frame units.

The display unit 905 is a panel type display apparatus such as a liquid crystal display or an organic electro luminescence (EL) panel, for example, and displays moving images or still images captured by the imaging element 902. The recording unit 906 records image data of a moving image or a still image captured by the imaging element 902 in a recording medium such as a semiconductor memory or a hard disk.

The operation unit 907 outputs operation commands for various functions of the electronic device 900 in accordance with user's operation. The power supply unit 908 appropriately provides various types of power supply serving as operating power supply to the DSP circuit 903, the frame memory 904, the display unit 905, the recording unit 906, and the operation unit 907, to these supply targets.

Note that embodiments of the present technology are not limited to the above-described embodiments but can be modified in a variety of ways without departing from a scope of the present technology.

In addition, the present technology may also be configured as follows, for example.

(1) An imaging element including, within a pixel:

a semiconductor substrate;

a photoelectric conversion unit formed in the semiconductor substrate;

a first charge storage unit that stores a charge generated by the photoelectric conversion unit; and a first transfer gate unit formed on an opposite surface of the semiconductor substrate on an opposite side of a light incident surface and used for transfer of a charge from the photoelectric conversion unit to the first charge storage unit,
in which the first transfer gate unit
includes a first electrode embedded in a first trench formed in the semiconductor substrate from the opposite surface of the semiconductor substrate, and
the photoelectric conversion unit includes:
the first electrode; and
a second electrode surrounding at least a portion of a periphery of the first electrode.

(2)
The imaging element according to (1),
further including a light shielding film that covers a bottom surface of the second electrode facing the incident surface of the semiconductor substrate, provided on the incident surface of the semiconductor substrate.

(3)
The imaging element according to (2),
in which the light shielding film covers at least a portion of a side surface of the second electrode.

(4)
The imaging element according to any of (1) to (3),
in which a predetermined distance or more is provided to separate between the opposite surface of the semiconductor substrate and an opposite surface of the photoelectric conversion unit on an opposite side of the light incident surface.

(5)
The imaging element according to (4),
in which the bottom surface of the second electrode is disposed at a position closer to the opposite surface of the semiconductor substrate than the opposite surface of the photoelectric conversion unit.

(6)
The imaging element according to (4) or (5),
in which the first transfer gate unit
further includes a third electrode embedded in a second trench formed in the semiconductor substrate from the opposite surface of the semiconductor substrate, and connected to the photoelectric conversion unit.

(7)
The imaging element according to any of (4) to (6),
in which the first electrode and the second electrode are disposed between the opposite surface of the semiconductor substrate and the opposite surface of the photoelectric conversion unit.

(8)
The imaging element according to any of (1) to (7),
in which the first transfer gate unit
includes a plurality of the first electrodes embedded in a plurality of the first trenches formed in the semiconductor substrate from the opposite surface of the semiconductor substrate, and
the photoelectric conversion unit
includes:
the plurality of first electrodes; and
a plurality of the second electrodes surrounding the periphery of each of the first electrodes.

(9)
The imaging element according to any of (1) to (8),
further including, within a pixel:
a second charge storage unit; and
a second transfer gate unit formed on the opposite surface of the semiconductor substrate and used for transfer of a charge from the first charge storage unit to the second charge storage unit,
in which the second transfer gate unit
includes a fourth electrode embedded in a third trench formed in the semiconductor substrate from the opposite surface of the semiconductor substrate, and
the photoelectric conversion unit
includes:
the fourth electrode; and
a fifth electrode surrounding at least a portion of a periphery of the fourth electrode.

(10)
The imaging element according to (9), further including a light shielding film to cover a bottom surface of the second electrode facing the incident surface of the semiconductor substrate and cover a bottom surface of the fifth electrode facing the incident surface of the semiconductor substrate, provided on the incident surface of the semiconductor substrate.

(11)
The imaging element according to (10),
in which the light shielding film covers at least a portion of a side surface of the second electrode and at least a portion of a side surface of the fifth electrode.

(12)
An imaging element including:
a semiconductor substrate;
a first photoelectric conversion unit formed in the semiconductor substrate in a first pixel that detects light of a first color;
a first charge storage unit that stores a charge generated by the first photoelectric conversion unit;
a first transfer gate unit formed on an opposite surface of the semiconductor substrate on an opposite side of the light incident surface and used for transfer of the charge from the first photoelectric conversion unit to the first charge storage unit;
a second photoelectric conversion unit formed in the semiconductor substrate in a second pixel that detects light of a second color different from the first color;
a second charge storage unit that stores a charge generated by the second photoelectric conversion unit; and
a second transfer gate unit formed on the opposite surface of the semiconductor substrate and used for transfer of the charge from the second photoelectric conversion unit to the second charge storage unit,
in which the first charge storage unit and the second charge storage unit are arranged in the first pixel, between the opposite surface of the semiconductor substrate and an opposite surface of the first photoelectric conversion unit on an opposite side of the light incident surface.

(13)
The imaging element according to (12),
in which a wavelength of the first color is shorter than a wavelength of the second color, and
the first photoelectric conversion unit is thinner than the second photoelectric conversion unit.

(14)
The imaging element according to (13),
further including, within a third pixel that detects blue light:
a third photoelectric conversion unit formed in the semiconductor substrate;
a third charge storage unit that stores a charge generated by the third photoelectric conversion unit; and
a third transfer gate unit formed on the opposite surface of the semiconductor substrate and used for transfer of the charge from the third photoelectric conversion unit to the third charge storage unit, in which the first color is green,
the second color is red,
the first charge storage unit and the second charge storage unit are arranged in the first pixel adjacent to the second pixel in a predetermined direction, between the opposite surface of the semiconductor substrate and the opposite surface of the first photoelectric conversion unit, and
the first charge storage unit and the third charge storage unit are arranged in the first pixel adjacent to the third pixel in a predetermined direction, between the opposite surface of the semiconductor substrate and the opposite surface of the first photoelectric conversion unit.

(15)
The imaging element according to (14),
in which the first pixel to third pixel are arranged in a Bayer array.

(16)
The imaging element according to (13),
in which the first color is blue, and
the second color is red or green.

(17)
The imaging element according to any of (12) to (16),
further including, within the first pixel, a fourth charge storage unit disposed between the opposite surface of the semiconductor substrate and the opposite surface of the first photoelectric conversion unit.

(18)
The imaging element according to (17),
in which a signal based on a difference between a charge of the first charge storage unit and a charge of the fourth charge storage unit is set as a signal of the first pixel, and
a signal based on a difference between a charge of the second charge storage unit and a charge of the fourth charge storage unit is set as a signal of the second pixel.

(19)
An imaging element including, within a pixel:
a semiconductor substrate;
a photoelectric conversion unit formed in the semiconductor substrate;
a charge storage unit disposed between an opposite surface of the semiconductor substrate on the opposite side of the light incident surface and the opposite surface of the photoelectric conversion unit on the opposite side of the light incident surface, and configured to store a charge generated in the photoelectric conversion unit; and
a transfer gate unit formed on the opposite surface of the semiconductor substrate and used for transfer of the charge from the photoelectric conversion unit to the charge storage unit,
in which a signal based on a difference between a charge read out from the charge storage unit after a predetermined first period has elapsed from a point of transfer of the charge stored in the photoelectric conversion unit to the charge storage unit and a charge read out from the charge storage unit after a predetermined second period has elapsed from a point of resetting the charge storage unit, is set as a signal of the pixel.

(20)
The imaging element according to (19),
in which a length of the first period is equal to a length of the second period.

REFERENCE SIGNS LIST

10 CMOS image sensor
11 Pixel array unit
100 Unit pixel
101 Photoelectric conversion unit
102 First memory transfer gate unit
102A, 102B Gate electrode
103 Charge storage unit
104 FD transfer gate unit
105 FD unit
106 Reset gate unit
107 Amplification transistor
108 Selection transistor
109 Charge discharging gate unit
151 Semiconductor substrate
152 N type semiconductor region
153 P+ type semiconductor region
159 N type semiconductor region
160 Insulating film
171, 172 Light shielding film
201 N type semiconductor region
202 to 204 P+ type semiconductor region
251 N type semiconductor region
252 to 254 P+ type semiconductor region
301 N type semiconductor region
302 P+ type semiconductor region
351A, 351B N type semiconductor region
352A, 352B Insulating film
353, 354 Light shielding film
500 Pixel
511 Second memory transfer gate unit
511A, 511B Gate electrode
551 N type semiconductor region
552 Insulating film
571, 572 Light shielding film
701 Charge storage unit
702 Gate electrode
900 Electronic device
902 Imaging element

The invention claimed is:
1. An imaging element, comprising:
within a pixel:
a semiconductor substrate;
a photoelectric conversion unit in the semiconductor substrate, wherein the photoelectric conversion unit is configured to generate a charge;
a first charge storage unit configured to store the charge generated by the photoelectric conversion unit;
a first transfer gate unit on an opposite surface of the semiconductor substrate, wherein
the opposite surface of the semiconductor substrate is on an opposite side of a light incident surface of the semiconductor substrate,
the first transfer gate unit is configured to transfer the charge from the photoelectric conversion unit to the first charge storage unit, and
the first transfer gate unit includes:
a first electrode embedded in a first trench, wherein the first trench is in the semiconductor substrate from the opposite surface of the semiconductor substrate, and
a second electrode that surrounds at least a portion of a periphery of the first electrode; and
a light shielding film on the light incident surface of the semiconductor substrate, wherein
the light shielding film covers an entire bottom surface of the second electrode, and
the entire bottom surface of the second electrode faces the light incident surface of the semiconductor substrate.

2. The imaging element according to claim 1, wherein the light shielding film covers at least a portion of a side surface of the second electrode.

3. The imaging element according to claim 1, wherein
the opposite surface of the semiconductor substrate and an opposite surface of the photoelectric conversion unit are separated by a distance greater than or equal to a specific distance, and
the opposite surface of the photoelectric conversion unit is on the opposite side of the light incident surface of the semiconductor substrate.

4. The imaging element according to claim 3, wherein the entire bottom surface of the second electrode is at a position closer to a position of the opposite surface of the semiconductor substrate than a position of the opposite surface of the photoelectric conversion unit.

5. The imaging element according to claim 3, wherein
the first transfer gate unit further includes a third electrode embedded in a second trench,
the second trench is in the semiconductor substrate from the opposite surface of the semiconductor substrate, and
the second trench is connected to the photoelectric conversion unit.

6. The imaging element according to claim 3, wherein the first electrode and the second electrode are between the opposite surface of the semiconductor substrate and the opposite surface of the photoelectric conversion unit.

7. The imaging element according to claim 1, wherein
the first transfer gate unit further includes:
a plurality of first electrodes embedded in a plurality of first trenches, wherein
the plurality of first electrodes includes the first electrode,
the plurality of first trenches includes the first trench, and
the plurality of first trenches is in the semiconductor substrate from the opposite surface of the semiconductor substrate; and
a plurality of second electrodes, wherein
the plurality of second electrodes includes the second electrode, and
each electrode of the plurality of second electrodes surrounds a periphery of a corresponding electrode of the plurality of first electrodes.

8. The imaging element according to claim 1, further comprising:
a second charge storage unit; and
a second transfer gate unit on the opposite surface of the semiconductor substrate, wherein
the second transfer gate unit is configured to transfer the charge from the first charge storage unit to the second charge storage unit, and
the second transfer gate unit includes:
a third electrode embedded in a third trench, wherein the third trench is in the semiconductor substrate from the opposite surface of the semiconductor substrate, and
a fourth electrode that surrounds at least a portion of a periphery of the third electrode.

9. The imaging element according to claim 8, wherein the light shielding film covers a bottom surface of the fourth electrode that faces the light incident surface of the semiconductor substrate.

10. The imaging element according to claim 9, wherein the light shielding film covers at least a portion of a side surface of the second electrode and at least a portion of a side surface of the fourth electrode.

11. An imaging element, comprising:
a semiconductor substrate;
a first photoelectric conversion unit in the semiconductor substrate in a first pixel, wherein the first photoelectric conversion unit is configured to:
generate a first charge, and
detect light of a first color;
a first charge storage unit configured to store the first charge generated by the first photoelectric conversion unit;
a first transfer gate unit on an opposite surface of the semiconductor substrate, wherein
the opposite surface of the semiconductor substrate is on an opposite side of a light incident surface of the semiconductor substrate,
the first transfer gate unit is configured to transfer the first charge from the first photoelectric conversion unit to the first charge storage unit, and
the first transfer gate unit includes:
a first electrode, and
a second electrode that surrounds at least a portion of a periphery of the first electrode;
a second photoelectric conversion unit in the semiconductor substrate in a second pixel, wherein the second photoelectric conversion unit is configured to:
generate a second charge, and
detect light of a second color different from the first color;
a second charge storage unit configured to store the second charge generated by the second photoelectric conversion unit;
a second transfer gate unit on the opposite surface of the semiconductor substrate, wherein
the second transfer gate unit is configured to transfer the second charge from the second photoelectric conversion unit to the second charge storage unit, and
the second transfer gate unit includes:
a third electrode, and
a fourth electrode that surrounds at least a portion of a periphery of the third electrode; and
a light shielding film on the light incident surface of the semiconductor substrate, wherein
the light shielding film covers an entire bottom surface of each of the second electrode and the fourth electrode,
each of the first charge storage unit and the second charge storage unit is in the first pixel,
each of the first charge storage unit and the second charge storage unit is between the opposite surface of the semiconductor substrate and an opposite surface of the first photoelectric conversion unit, and
the opposite surface of the first photoelectric conversion unit is on the opposite side of the light incident surface of the semiconductor substrate.

12. The imaging element according to claim 11, wherein
a wavelength of the first color is shorter than a wavelength of the second color, and
the first photoelectric conversion unit is thinner than the second photoelectric conversion unit.

13. The imaging element according to claim 12, further comprising, within a third pixel that detects blue light:
a third photoelectric conversion unit in the semiconductor substrate, wherein the third photoelectric conversion unit is configured to generate a third charge;

a third charge storage unit configured to store the third charge generated by the third photoelectric conversion unit; and a third transfer gate unit on the opposite surface of the semiconductor substrate, wherein the third transfer gate unit is configured to transfer the third charge from the third photoelectric conversion unit to the third charge storage unit, the first color is green, the second color is red, each of the first charge storage unit and the second charge storage unit is in the first pixel adjacent to the second pixel in a first direction, each of the first charge storage unit and the second charge storage unit is between the opposite surface of the semiconductor substrate and the opposite surface of the first photoelectric conversion unit, each of the first charge storage unit and the third charge storage unit is in the first pixel adjacent to the third pixel in a second direction, and each of the first charge storage unit and the third charge storage unit is between the opposite surface of the semiconductor substrate and the opposite surface of the first photoelectric conversion unit.

14. The imaging element according to claim 13, wherein the first pixel, the second pixel, and the third pixel are in a Bayer array.

15. The imaging element according to claim 12, wherein the first color is blue, and the second color is one of red or green.

16. The imaging element according to claim 11, further comprising, within the first pixel, a third charge storage unit between the opposite surface of the semiconductor substrate and the opposite surface of the first photoelectric conversion unit.

17. The imaging element according to claim 16, wherein a first signal based on a difference between the first charge of the first charge storage unit and a third charge of the third charge storage unit is a signal of the first pixel, and a second signal based on a difference between the second charge of the second charge storage unit and the third charge of the third charge storage unit is a signal of the second pixel.

18. An imaging element, comprising;
within a pixel:

a semiconductor substrate;

a photoelectric conversion unit in the semiconductor substrate, wherein the photoelectric conversion unit is configured to generate a first charge;

a charge storage unit between an opposite surface of the semiconductor substrate and an opposite surface of the photoelectric conversion unit, wherein the opposite surface of the semiconductor substrate is on an opposite side of a light incident surface of the semiconductor substrate, the opposite surface of the photoelectric conversion unit is on the opposite side of the light incident surface of the semiconductor substrate, and the charge storage unit is configured to store the first charge generated in the photoelectric conversion unit; and a transfer gate unit on the opposite surface of the semiconductor substrate, wherein the transfer gate unit is configured to transfer the first charge from the photoelectric conversion unit to the charge storage unit, a signal of the pixel is based on a difference between a second charge and a third charge, the second charge is a charge from the charge storage unit after elapse of a first period from a point of the transfer of the first charge stored in the photoelectric conversion unit to the charge storage unit, and the third charge is a charge from the charge storage unit after elapse of a second period from a point of reset of the charge storage unit.

19. The imaging element according to claim 18, wherein a length of the first period is equal to a length of the second period.

* * * * *